US012781120B2

(12) United States Patent
Lee et al.

(10) Patent No.: US 12,781,120 B2
(45) Date of Patent: Nov. 3, 2026

(54) SEMICONDUCTOR NANOPARTICLE-LIGAND COMPOSITE, MANUFACTURING METHOD OF THEREOF, PHOTOSENSITIVE RESIN COMPOSITION, OPTICAL FILM, ELECTROLUMINESCENT DIODE AND ELECTRONIC DEVICE

(71) Applicant: DUKSAN NEOLUX CO., LTD, Cheonan-si (KR)

(72) Inventors: Seemaek Lee, Cheonan-si (KR); Shin Jong Moon, Cheonan-si (KR); Changmin Lee, Cheonan-si (KR); Hyun Ji Oh, Cheonan-si (KR)

(73) Assignee: DUK SAN NEOLUX CO., LTD., Cheonan-si (KR)

( * ) Notice: Subject to any disclaimer, the term of this patent is extended or adjusted under 35 U.S.C. 154(b) by 1118 days.

(21) Appl. No.: 17/812,297

(22) Filed: Jul. 13, 2022

(65) Prior Publication Data

US 2023/0100943 A1 Mar. 30, 2023

(30) Foreign Application Priority Data

Jul. 15, 2021 (KR) ........................ 10-2021-0092744

(51) Int. Cl.
*C09K 11/02* (2006.01)
*C08F 22/10* (2006.01)
(Continued)

(52) U.S. Cl.
CPC ........ *C09K 11/025* (2013.01); *C08F 22/1006* (2020.02); *C08F 22/20* (2013.01); *C08K 3/22* (2013.01); *C08K 9/04* (2013.01); *C09K 11/0883* (2013.01); *C09K 11/883* (2013.01); *H10K 59/38* (2023.02); *H10K 85/60* (2023.02); *B82Y 20/00* (2013.01); *B82Y 40/00* (2013.01); *C08F 2810/20* (2013.01); *C08K 2003/2241* (2013.01); *C08K 2201/005* (2013.01); *C08K 2201/011* (2013.01)

(58) Field of Classification Search
None
See application file for complete search history.

(56) References Cited

U.S. PATENT DOCUMENTS

2005/0161666 A1 7/2005 Park et al.
2005/0192430 A1 9/2005 Rosenthal et al.
(Continued)

FOREIGN PATENT DOCUMENTS

CN 112055739 A * 12/2020
JP 2003026753 A * 1/2003
(Continued)

*Primary Examiner* — Tae H Yoon
(74) *Attorney, Agent, or Firm* — Vorys, Sater, Seymour and Pease LLP; Mih Suhn Koh

(57) ABSTRACT

Provided are a photosensitive resin composition having low viscosity and high compatibility prepared by providing a semiconductor nanoparticle-ligand composite comprising a ligand represented by Formula 1, an optical film having uniform and remarkably excellent quantum efficiency using the photosensitive resin composition, and an electroluminescent diode comprising the optical film and an electronic device comprising an electroluminescent diode.

16 Claims, 1 Drawing Sheet

(51) Int. Cl.

| | |
|---|---|
| ***C08F 22/20*** | (2006.01) |
| ***C08K 3/22*** | (2006.01) |
| ***C08K 9/04*** | (2006.01) |
| ***C09K 11/08*** | (2006.01) |
| ***C09K 11/88*** | (2006.01) |
| ***H01L 27/32*** | (2006.01) |
| ***H01L 51/00*** | (2006.01) |
| ***H10K 59/38*** | (2023.01) |
| ***H10K 85/60*** | (2023.01) |
| *B82Y 20/00* | (2011.01) |
| *B82Y 40/00* | (2011.01) |

(56) References Cited

U.S. PATENT DOCUMENTS

2017/0162756 A1* 6/2017 Hartlove .................. B01J 13/08
2019/0010391 A1 1/2019 Chae et al.
2019/0025696 A1 1/2019 Chae et al.
2021/0163817 A1* 6/2021 Lieberman ............. C09K 11/62

FOREIGN PATENT DOCUMENTS

JP 4702508 B2 * 6/2011
JP 2018-153915 A 10/2018
WO WO 2006/123731 A1 * 11/2006

* cited by examiner

SEMICONDUCTOR NANOPARTICLE-LIGAND COMPOSITE, MANUFACTURING METHOD OF THEREOF, PHOTOSENSITIVE RESIN COMPOSITION, OPTICAL FILM, ELECTROLUMINESCENT DIODE AND ELECTRONIC DEVICE

TECHNICAL FIELD

The present disclosure relates to semiconductor nanoparticle-ligand composite, a manufacturing method of thereof, a photosensitive resin composition, an optical film, an electroluminescent diode, and an electronic device.

BACKGROUND

Liquid crystal display devices, which have been widely used, have low power consumption, are lightweight, and can be implemented in a thin film type, and are thus widely used. However, these liquid crystal display devices have problems in that they require a separate backlight due to the absence of self-luminescence, and that it is difficult for them to realize a perfect black color compared to organic light emitting diodes. In addition, the organic light emitting diode display has a difficulty in having wide color reproducibility due to the limitation of the structure of the organic material that emits light.

In order to solve the problems of the liquid crystal display device, recently, a blue organic light emitting diode that emits a blue light is used as a light source of the backlight unit, and a technology using quantum dots (i.e., a semiconductor nanoparticle-ligand composite), which converts a blue light into a different color, is being developed.

In order to use quantum dots, a process of patterning a layer containing quantum dots is required, but it is it is difficult to increase the content of quantum dots due to their low compatibility with organic resins that are used in the patterning process, thus making it difficult to realize excellent color characteristics. Therefore, in order to improve patterning processability of quantum dots, there is a need to improve the compatibility of quantum dots with organic resins used in the patterning process.

SUMMARY

Embodiments of the present disclosure provide can provide a semiconductor nanoparticle-ligand composite having low viscosity and excellent compatibility and a method for manufacturing the same.

Additionally, embodiments of the present disclosure can provide a photosensitive resin composition that can form an optical film with excellent quantum efficiency.

Additionally, embodiments of the present disclosure can provide an optical film having excellent quantum efficiency.

Additionally, embodiments of the present disclosure can provide an electroluminescent diode and an electronic device having excellent quantum efficiency.

In an aspect, embodiments of the present disclosure provide a semiconductor nanoparticle-ligand composite including a ligand represented by the following Formula 1.

[Formula 1]

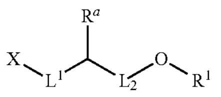

-continued

[Formula 1-1]

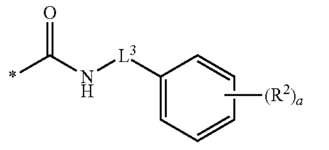

In Formula 1 above,

1) X is a functional group that binds to the surface of semiconductor nanoparticles, —S(H) or —P═O(OH)$_2$ or —COOH;

2) $R^a$ is H; -$L^4$-O—$R^1$; a $C_{1-20}$ alkyl group; a $C_{1-20}$ alkoxyl group; or a $C_{1-20}$ alkylthio group;

3) $L^4$ is selected from the group consisting of a single bond; a $C_{6-20}$ arylene group; a $C_{2-20}$ heterocyclic group including at least one heteroatom selected from the group consisting of O, N, S, Si, and P; a $C_{3-20}$ cycloaliphatic group; a $C_{1-10}$ alkylene group; a $C_{1-10}$ alkoxyl group; a $C_{1-10}$ alkylthio group; and a combination thereof;

4) $L^1$ and $L^2$ are each independently selected from the group consisting of a single bond; a $C_{6-30}$ arylene group; a $C_{2-30}$ heterocyclic group including at least one heteroatom selected from the group consisting of O, N, S, Si, and P; a $C_{1-20}$ alkylene group; a $C_{1-20}$ alkoxyl group; a $C_{1-20}$ alkylthio group; Formula A; and a combination thereof;

[Formula A]

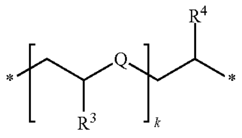

wherein in Formula A above, 4-1) * means a binding site, 4-2) Q is O or S;

4-3) k is an integer of 1 to 12; and 4-4) $R^3$ and $R^4$ are each independently hydrogen or a methyl group;

5) $R^1$ is Formula 1-1 above, wherein in Formula 1-1 above,

6) $L^3$ is selected from the group consisting of a single bond; a $C_{6-20}$ arylene group; a $C_{2-20}$ heterocyclic group including at least one heteroatom selected from the group consisting of O, N, S, Si, and P; a $C_{3-20}$ cycloaliphatic group; a $C_{1-10}$ alkylene group; a $C_{1-10}$ alkoxyl group; a $C_{1-10}$ alkylthio group; and a combination thereof;

7) $R^2$ is selected from the group consisting of hydrogen; deuterium; tritium; a halogen; a cyano group; a nitro group; a $C_{6-60}$ aryl group; a fluorenyl group; a $C_{2-60}$ heterocyclic group including at least one heteroatom selected from the group consisting of O, N, S, Si, and P; a fused ring group of a $C_{3-60}$ aliphatic ring and a $C_{6-60}$ aromatic ring; a $C_{1-50}$ alkyl group; a $C_{2-20}$ alkenyl group; a $C_{2-20}$ alkynyl group; a $C_{1-30}$ alkoxyl group; a $C_{6-30}$ aryloxy group; and -L'-N($R_a$)($R_b$);

8) L' is selected from the group consisting of a single bond; a $C_{6-20}$ arylene group; a $C_{2-20}$ heterocyclic group including at least one heteroatom selected from the group consisting of O, N, S, Si, and P; a $C_{3-20}$ cycloaliphatic group; a $C_{1-10}$ alkylene group; a $C_{1-10}$ alkoxyl group; a $C_{1-10}$ alkylthio group; and a combination thereof;

9) $R_a$ and $R_b$ are each independently selected from the group consisting of a $C_{6-60}$ aryl group; a fluorenyl group; a $C_{3-60}$ cycloaliphatic group; a $C_{2-60}$ heterocyclic group including at least one heteroatom selected from the group consisting of O, N, S, Si, and P; a $C_{1-50}$ alkyl group; and a combination thereof;

10) a is an integer from 0 to 5; in which when a is 2 or more, plural $R^2$ are the same or different from each other, and a plurality of neighboring $R^2$ may bind to each other to form a ring; and 11) in $L^1$ to $L^3$, L', $R_a$ and $R_b$, and $R^2$ above, the arylene group, heterocyclic group, alkylene group, alkoxyl group, and alkylthio group may each be further substituted with one or more substituents selected from the group consisting of deuterium; a $C_{6-10}$ aryl group; a $C_{2-10}$ heterocyclic group; a $C_{3-10}$ cycloaliphatic group; and a $C_{1-10}$ alkyl group.

Another aspect of the present disclosure provides a method for manufacturing a semiconductor nanoparticle-ligand composite, which includes: a step of surface modification, in which the surface of a semiconductor nanoparticle is surface-modified with a compound represented by the following Formula 3-1 or Formula 3-2; and a step of surface modification, in which the surface of a semiconductor nanoparticle is surface-modified by reacting an alcohol group (—OH) of Formula 3-1 or Formula 3-2 of the semiconductor nanoparticle, that is surface-modified with a compound represented by the following Formula 3-1 or Formula 3-2, with an isocyanate-based compound.

[Formula 3-1]

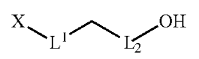

[Formula 3-2]

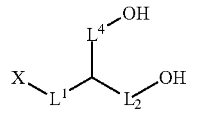

In Formula 3-1 or Formula 3-2 above,

1) X, which is a functional group that binds to a surface of a semiconductor nanoparticle, is —S(H) or P═O $(OH)_2$ or —COOH;

2) $L^1$ and $L^2$ are each independently selected from the group consisting of a single bond; a $C_{6-30}$ arylene group; a $C_{2-30}$ heterocyclic group including at least one heteroatom selected from the group consisting of O, N, S, Si, and P; a $C_{1-20}$ alkylene group; a $C_{1-20}$ alkoxyl group; a $C_{1-20}$ alkylthio group; Formula B; and a combination thereof;

[Formula B]

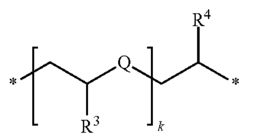

wherein in Formula B above, 2-1) *means a binding site, 2-2) Q is O or S;

2-3) k is an integer of 1 to 12;

2-4) $R^3$ and $R^4$ are each independently hydrogen or a methyl group;

3) $L^4$ is selected from the group consisting of a single bond; a $C_{6-20}$ arylene group; a $C_{2-20}$ heterocyclic group including at least one heteroatom selected from the group consisting of O, N, S, Si, and P; a $C_{1-10}$ alkylene group; a $C_{1-10}$ alkoxyl group; a $C_{1-10}$ alkylthio group; and a combination thereof;

wherein in $L^1$, $L^2$, and $L^4$ above, the arylene group, heterocyclic group, alkylene group, alkoxyl group, and alkylthio group may each be further substituted with one or more substituents selected from the group consisting of deuterium; a $C_{6-10}$ aryl group; a $C_{2-10}$ heterocyclic group; a $C_{3-10}$ cycloaliphatic group; and a $C_{1-10}$ alkyl group.

The isocyanate-based compound may be represented by the following Formula 9.

[Formula 9]

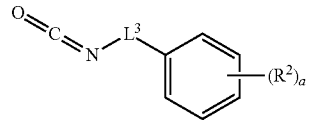

In Formula 9 above,

1) $L^3$ is selected from the group consisting of a single bond; a $C_{6-20}$ arylene group; a $C_{2-20}$ heterocyclic group including at least one heteroatom selected from the group consisting of O, N, S, Si, and P; a $C_{3-20}$ cycloaliphatic group; a $C_{1-10}$ alkylene group; a $C_{1-10}$ alkoxyl group; a $C_{1-10}$ alkylthio group; and a combination thereof;

2) $R^2$ is selected from the group consisting of hydrogen; deuterium; tritium; a halogen; a cyano group; a nitro group; a $C_{6-60}$ aryl group; a fluorenyl group; a $C_{2-60}$ heterocyclic group including at least one heteroatom selected from the group consisting of O, N, S, Si, and P; a fused ring group of a $C_{3-60}$ aliphatic ring and a $C_{6-60}$ aromatic ring; a $C_{1-50}$ alkyl group; a $C_{2-20}$ alkenyl group; a $C_{2-20}$ alkynyl group; a $C_{1-30}$ alkoxyl group; a $C_{6-30}$ aryloxy group; and $-L'-N(R_a)(R_b)$;

3) L' is selected from the group consisting of a single bond; a $C_{6-20}$ arylene group; a $C_{2-20}$ heterocyclic group including at least one heteroatom selected from the group consisting of O, N, S, Si, and P; a $C_{3-20}$ cycloaliphatic group; a $C_{1-10}$ alkylene group; a $C_{1-10}$ alkoxyl group; a $C_{1-10}$ alkylthio group; and a combination thereof;

4) $R_a$ and $R_b$ are each independently selected from the group consisting of a $C_{6-60}$ aryl group; a fluorenyl group; a $C_{3-60}$ cycloaliphatic group; a $C_{2-60}$ heterocyclic group including at least one heteroatom selected from the group consisting of O, N, S, Si, and P; a $C_{1-50}$ alkyl group; and a combination thereof;

5) a is an integer from 0 to 5; and 6) in the $L^3$, L', $R^2$, and $R_a$ and $R_b$, the arylene group, heterocyclic group, alkylene group, alkoxyl group, and alkylthio group may each be further substituted with one or more substituents selected from the group consisting of deuterium; a $C_{6-10}$ aryl group; a $C_{2-10}$ heterocyclic group; a $C_{3-10}$ cycloaliphatic group; and a $C_{1-10}$ alkyl group.

In another aspect, embodiments of the present disclosure provide a photosensitive resin composition, which includes (A) the semiconductor nanoparticle-ligand composite represented by Formula 1 above; (B) a photocrosslinkable monomer; and (C) an initiator.

The photocrosslinkable monomer may be represented by the following Formula 1.

[Formula I]

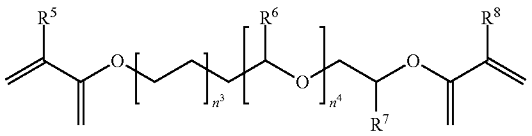

In Formula I above,

1) $R^5$ to $R^8$ are each independently hydrogen or a methyl group; and

2) $n^3$ and $n^4$ are each independently an integer of 1 to 15; wherein $n^3+n^4 \geq 1$.

The photosensitive resin composition may include (A) 10 wt % to 60 wt % of the semiconductor nanoparticle-ligand composite; (B) 30 wt % to 90 wt % of the photocrosslinkable monomer; and (C) 0.1 wt % to 10 wt % of the initiator, based on the total amount of the photosensitive resin composition.

In another aspect, embodiments of the present disclosure provide an optical film which includes the semiconductor nanoparticle-ligand composite and has a thickness of 0.005 μm to 500 μm.

In another aspect, embodiments of the present disclosure provide an electroluminescent diode which includes the optical film.

In another aspect, embodiments of the present disclosure provide an electronic device which includes a display device including the optical film; and a control unit for operating the display device.

In another aspect, embodiments of the present disclosure provide an electronic device which includes a display device including the electroluminescent diode; and a control unit for operating the display device.

Advantageous Effects

According to embodiments of the present disclosure, a photosensitive resin composition having low viscosity and high compatibility can be prepared by providing a semiconductor nanoparticle-ligand composite including a ligand represented by Formula 1, an optical film having uniform and remarkably excellent quantum efficiency can be provided using the photosensitive resin composition, and an electroluminescent diode including the optical film and an electronic device including electroluminescent diode can be provided.

DETAILED DESCRIPTION

Figure 1:
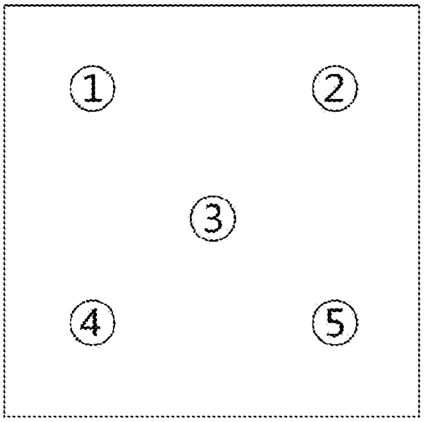
FIG. 1 is a drawing showing the locations at which the evaluation of the film coating of Example 1 and Comparative Example were performed in terms of thickness and optical properties.
Figure 2:
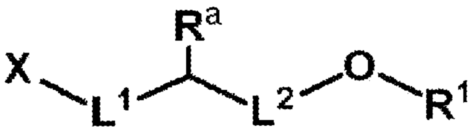
FIG. 2 is a representative drawing of Formula 1 according to the present disclosure.

Hereinafter, some embodiments of the present disclosure will be described in detail with reference to exemplary drawings. In adding reference numerals to components of each drawing, the same component may have the same reference numeral even though it is indicated in different drawings. In addition, in describing the present disclosure, if it is determined that a detailed description of a related known configuration or function may obscure the gist of the present invention, the detailed description may be omitted.

In describing the components of the present disclosure, when the expressions "includes", "has", "consists of", etc. are used, other parts may be added unless "only" is used. When a component is expressed in the singular form, it may include a case in which the plural form is included unless explicitly stated otherwise.

Additionally, in describing the components of the present disclosure, terms such as first, second, A, B, (a), (b), etc. may be used. These terms are only for distinguishing the components from other components, and the essence, order, sequence, number, etc. of the components are not limited by the terms.

In the description of the positional relationship of the components, when two or more components are described as being "connected", "linked", or "fused", etc., the two or more components may be directly "connected", "linked", or "fused", but it should be understood that the two or more components may also be "connected", "linked", or "fused" by way of a further "interposition" of a different component. In particular, the different component may be included in any one or more of the two or more components that are to be "connected", "linked", or "fused" to each other.

In addition, when a component is described to be "on top" or "on" of another component, it should be understood that this may also include a case where still another component is disposed therebetween as well as a case where the another component is "immediately on top of". In contrast, it should be understood that when a component is described to be "immediately on top of" another component, it means that there is no other component disposed therebetween. In addition, to be "on top" or "on" of the reference part means to be located above or below the reference part, and it does not necessarily mean to be located "on top" or "on" towards the opposite direction of gravity.

In the description of the temporal flow relationship related to components, operation methods, manufacturing methods, etc., for example, when the temporal precedence or flow precedence is described by way of "after", "subsequently", "thereafter", "before", etc., it may also include cases where the flow is not continuous unless terms such as "immediately" or "directly" is used.

Meanwhile, when the reference is made to numerical values or corresponding information for components, the numerical values or corresponding information may be interpreted as including an error range that may occur due to various factors (e.g., procedural factors, internal or external shocks, noise, etc.) even if it it not explicitly stated.

As used herein, the term "halo" or "halogen" includes fluorine (F), chlorine (Cl), bromine (Br), and iodine (I), unless otherwise specified.

As used herein, the term "alkyl", "alkyl group", or "alkylene group" has 1 to 60 carbons linked by a single bond unless otherwise specified, and refers to a radical of a saturated aliphatic functional group, including a linear chain alkyl group, a branched chain alkyl group, a cycloalkyl (alicyclic) group, an alkyl-substituted cycloalkyl group, and a cycloalkyl-substituted alkyl group.

As used herein, the term "alkenyl" or "alkenyl group" each has a double bond unless otherwise specified, and includes a linear or branched chain group, and may have 2 to 60 carbon atoms.

As used herein, the term "alkynyl" or "alkynyl group" each has a triple bond unless otherwise specified, and includes a linear or branched chain group, and may have 2 to 60 carbon atoms.

As used herein, the term "cycloalkyl" refers to an alkyl which forms a ring having 3 to 60 carbon atoms unless otherwise specified, but is not limited thereto.

As used herein, the term "alkoxyl group", "alkoxy group", or "alkyloxy group" refers to an alkyl group to which an oxygen radical is linked, and may have 1 to 60 carbon atoms unless otherwise specified, but is not limited thereto. As used herein, the term "alkenoxyl group", "alkenoxy group", "alkenyloxyl group", or "alkenyloxy group" refers to an alkenyl group to which an oxygen radical is linked, and has 2 to 60 carbon atoms unless otherwise specified, but is not limited thereto.

As used herein, the term "alkylthio group" refers to an alkyl group to which a sulfur radical is attached, and may have 1 to 60 carbon atoms unless otherwise specified, but is not limited thereto.

As used herein, the terms "aryl group" and "arylene group" each have 6 to 60 carbon atoms unless otherwise specified, but are not limited thereto. In embodiments of the present disclosure, the aryl group or arylene group refers to a monocyclic or multicyclic aromatic compound. For example, the aryl group may be a phenyl group, a monovalent functional group of biphenyl, a monovalent functional group of naphthalene, a fluorenyl group, or a spirofluorenyl group.

As used herein, the prefix "aryl" or "ar" refers to a radical substituted with an aryl group. For example, an arylalkyl group is an alkyl group substituted with an aryl group, an arylalkenyl group is an alkenyl group substituted with an aryl group, and a radical substituted with an aryl group has the number of carbon atoms described herein. Additionally, when prefixes are named consecutively, it means that the substituents are listed in the order listed first. For example, an arylalkoxy group means an alkoxy group substituted with an aryl group, an alkoxylcarbonyl group means a carbonyl group substituted with an alkoxyl group, and additionally, an arylcarbonylalkenyl group means an alkenyl group substituted with an arylcarbonyl group in which the arylcarbonyl group is a carbonyl group substituted with an aryl group.

As used herein, the term "fluorenyl group" or "fluorenylene group" may each refer to a monovalent or divalent functional group of fluorene unless otherwise specified. The term "substituted fluorenyl group" or "substituted fluorenylene group" may mean that at least one of the substituents R, R', R", and R"' is a substituent other than hydrogen, and include cases where R and R' are bound to each other to form a spiro compound together with the carbon to which they are linked.

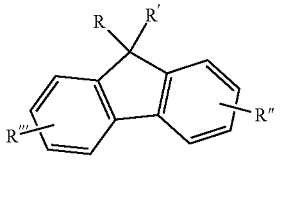

As used herein, the term "a spiro compound" has a spiro union, and the spiro union refers to a linkage which is formed by two rings sharing only one atom. In particular, the atom shared by the two rings is called a "spiro atom", and they may each be called "monospiro-", "dispiro-", and "trispiro-" compounds depending on the number of spiro atoms included in a compound.

As used herein, the term "heterocyclic group" includes not only aromatic rings (e.g., "heteroaryl group" and "heteroarylene group"), but also non-aromatic rings, and refers to a single ring and a polycyclic ring having 2 to 60 carbon atoms each including one or more heteroatoms unless otherwise specified, but is not limited thereto.

As used herein, the term "aliphatic" refers to an aliphatic hydrocarbon having 1 to 60 carbon atoms unless otherwise specified, but is not limited thereto.

As used herein, the term "aliphatic ring" refers to an aliphatic hydrocarbon ring having 3 to 60 carbon atoms unless otherwise specified, but is not limited thereto.

As used herein, the term "heteroatom" refers to N, O, S, P, or Si, unless otherwise specified.

In addition, the term "heterocyclic group" may include a ring containing $SO_2$ instead of carbon which forms a ring. For example, the "heterocyclic group" may include the following compound.

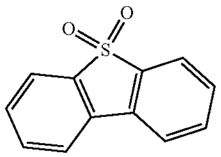 [SMILES: O=S1(=O)c2ccccc2-c2ccccc21]

As used herein, the term "ring" includes monocyclic and polycyclic rings, and includes heterocycles containing at least one heteroatom as well as hydrocarbon rings, and may include aromatic and aliphatic rings.

As used herein, the term "polycyclic" includes ring assemblies (e.g., biphenyl, terphenyl, etc.), fused multiple ring systems, and spiro compounds, includes aliphatic as well as aromatic compounds, and may include heterocycles containing at least one heteroatom as well as hydrocarbon rings.

Additionally, unless otherwise specified, the term "substituted" in the expression "substituted or unsubstituted" as used herein refers to a substitution with one or more substituents selected from the group consisting of deuterium, a halogen, an amino group, a nitrile group, a nitro group, a $C_{1-20}$ alkyl group, a $C_{1-20}$ alkoxy group, a $C_{1-20}$ alkylamine group, a $C_{1-20}$ alkylthiophene group, a $C_{6-20}$ arylthiophene group, a $C_{2-20}$ alkenyl group, a $C_{2-20}$ alkynyl group, a $C_{3-20}$ cycloalkyl group, a $C_{6-20}$ aryl group, a $C_{6-20}$ aryl group substituted with deuterium, a $C_{8-20}$ arylalkenyl group, a silane group, a boron group, a germanium group, and a $C_{2-20}$ heterocyclic group containing at least one heteroatom selected from the group consisting of O, N, S, Si, and P, but the substitution is not limited to these substituents.

As used herein, the "names of functional groups" corresponding to an aryl group, an arylene group, a heterocyclic group, etc. exemplified as examples of each symbol and a substituent thereof may be described as "a name of the functional group reflecting its valence", and may also be described as the "name of its parent compound". For example, in the case of "phenanthrene", which is a type of aryl group, the names of the groups may be described such that the monovalent group as "phenanthryl (group)", and the divalent group as "phenanthrylene (group)", etc., but may also be described as "phenanthrene", which is the name of its parent compound, regardless of its valence. Similarly, in the case of pyrimidine, it may be described regardless of its valence, or in the case of being monovalent, it may be described as pyrimidinyl (group); and in the case of being divalent, it may be described by the "name of the group" of the valence (e.g., pyrimidinylene (group)). Therefore, as used herein, when the type of substituent is described by the name of its parent compound, it may refer to an n-valent "group" formed by detachment of a hydrogen atom that is linked to a carbon atom and/or hetero atom of its parent compound.

In describing the names of the compounds or the substituents in the present specification, the numbers or letters indicating positions may be omitted. For example, pyrido [4,3-d]pyrimidine may be described as pyridopyrimidine; benzofuro[2,3-d]pyrimidine as benzofuropyrimidine; 9,9-dimethyl-9H-fluorene as dimethylfluorene, etc. Therefore, both benzo[g]quinoxaline and benzo[f]quinoxaline may be described as benzoquinoxaline.

In addition, unless explicitly described, the formulas used in the present disclosure are applied in the same manner as in the definition of substituents by the exponent definition of the formula below.

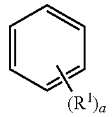

In particular, when a is 0, the substituent $R^1$ is absent; when a is 1, one substituent $R^1$ may be linked to any one carbon of the carbons forming the benzene ring; when a is 2 or 3, it may be linked as shown below, and in this case, $R^1$ may be the same or different from each other; and when a is an integer of 4 to 6, it may be linked to the carbon of the benzene ring in a similar manner, whereas the indication of the hydrogen bound to the carbon forming the benzene ring may be omitted.

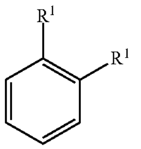

(a = 2)

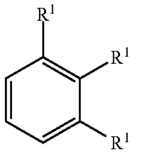

(a = 3)

As used herein, substituents are bound to each other to form a ring means that a plurality of substituents bound to one other share an arbitrary atom (e.g., at least one atom among carbon atoms and heteroatoms (e.g., O, N, S, Si, and P)) so as to form a saturated or unsaturated ring. For example, in the case of naphthalene, it may be considered that an adjacent methyl group substituted in any one benzene ring and a butadienyl group share one carbon to form an unsaturated ring, or a vinyl group and a propyleneyl group share one carbon to form an unsaturated ring. In addition, in the case of fluorene, it may be considered as-is an aryl group having 13 carbon atoms, but it may be considered that two methyl groups substituted to a biphenyl group are bound to each other to share one carbon so as to form a ring.

As used herein, an organic electric device may refer to a component(s) between an anode and a cathode, or may refer to an organic light emitting diode including an anode and a cathode, and the component(s) positioned therebetween.

In addition, in some cases, the organic electric device in the present application may refer to an organic light emitting diode and a panel including the same, or may refer to an electronic device including a panel and a circuit. In particular, for example, the electronic device may include all of a display device, a lighting device, a solar cell, a portable or mobile terminal (e.g., a smart phone, a tablet, a PDA, an electronic dictionary, a PMP, etc.), a navigation terminal, a game machine, various TVs, various computer monitors, etc., but is not limited thereto, and it may be any type of device as long as it includes the component(s).

As used herein, the term "precursor", which is a chemical substance prepared in advance to react semiconductor nanoparticles, is a concept referring to all compounds including metals, ions, elements, compounds, complex compounds, composite, clusters, etc. It is not necessarily limited to the final substance of a certain reaction, but refers to a substance that can be obtained in any arbitrarily determined step.

As used herein, the term "cluster" refers to particles in which single atoms, molecules, or other types of atoms are aggregated or combined within tens to thousands of atoms.

The semiconductor nanoparticle-ligand composite according to embodiments of the present disclosure includes a ligand represented by the following Formula (1).

[Formula 1]

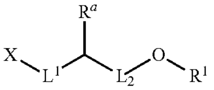

[Formula 1-1]

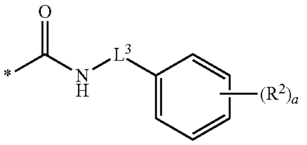

Hereinafter, the Formula (1) will be described.

1) X is a functional group bound to the surface of semiconductor nanoparticles, and is —S(H) or —P═O$(OH)_2$ or —COOH. Since the ligand represented by Formula 1 above forms a coordination bond with the inorganic atoms of the semiconductor nanoparticles, in an embodiment, X, being —SH or —S (where H is detached from the —SH), may form a coordination bond with the semiconductor nanoparticles. In another embodiment, X, being —P═O$(OH)_2$ or —P═O$(O)_2$ (where H is detached from the —P═O$(OH)_2$), may form a coordination bond with the semiconductor nanoparticles. In still another embodiment, X, being —COOH or COO— (where H is detached from the —COOH), may form a coordination bond with the semiconductor nanoparticles.

2) $R^a$ is H; $-L^4-O-R^1$; $C_{1-20}$ alkyl group; $C_{1-20}$ alkoxyl group; or $C_{1-20}$ alkylthio group, wherein the alkyl group in $R^a$ may be, for example, a $C_{1-10}$ alkyl group. For example, the alkyl group may be a methyl group, an ethyl group, a t-butyl group, etc.

The alkoxyl group in $R^a$ may be, for example, a $C_{1-10}$ alkoxyl group. For example, the alkoxyl group may be methoxy, t-butoxy, etc.

The alkylthio group in $R^a$ may be, for example, a $C_{1-10}$ alkylthio group. For example, the alkylthio group may be a methylthio group, a t-butylthio group, etc.

3) $L^4$ may be selected from the group consisting of a single bond; a $C_{6-20}$ arylene group; a $C_{2-20}$ heterocyclic group including at least one heteroatom selected from the group consisting of O, N, S, Si, and P; a $C_{3-20}$ cycloaliphatic group; a $C_{1-10}$ alkylene group; a $C_{1-10}$ alkoxyl group; a $C_{1-10}$ alkylthio group; and a combination thereof.

The arylene group in $L^4$ above may be, for example, a $C_{6-20}$ arylene group or a $C_{6-18}$ arylene group. For example, the arylene group may be phenyl, biphenyl, naphthyl, terphenyl, etc.

The heterocyclic group in $L^4$ above may be, for example, a $C_{2-20}$ heterocyclic group or a $C_{2-18}$ heterocyclic group. For example, the heterocyclic group may be pyridine, pyrimidine, benzofuran, benzothiophene, dioxin, dibenzofuran, dibenzothiophene, naphthobenzothiophene, and naphthobenzofuran, etc.

The alkylene group in $L^4$ above may be, for example, a $C_{1-10}$ alkylene group. For example, the alkylene group may be a methylene group, an ethylene group, a t-butylene group, etc.

The alkoxyl group in $L^4$ above may be, for example, a $C_{1-10}$ alkoxyl group. For example, the alkoxyl group may be methoxy, t-butoxy, etc.

The alkylthio group in $L^4$ above may be, for example, a $C_{1-10}$ alkylthio group. For example, the alkylthio group may be a methylthio group, a t-butylthio group, etc.

4) $L^1$ and $L^2$ are each independently selected from the group consisting of a single bond; a $C_{6-30}$ arylene group; a $C_{2-30}$ heterocyclic group including at least one heteroatom selected from the group consisting of O, N, S, Si, and P; a $C_{1-20}$ alkylene group; a $C_{1-20}$ alkoxyl group; a $C_{1-20}$ alkylthio group; Formula A; and a combination thereof.

[Formula A]

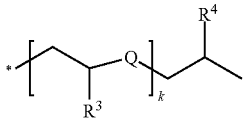

In Formula A above, 4-1) * means a binding site, 4-2) Q is O or S;

4-3) k is an integer of 1 to 12; and 4-4) $R^3$ and $R^4$ are each independently hydrogen or a methyl group.

That $L^1$ and $L^2$ are independent of each other and selected from a combination thereof means that $L^1$ and $L^2$ are selected from a plurality of combinations of the divalent radicals listed previously, and for example, may refer to a form in which two or more radicals selected independently of each other (e.g., the first radical-second radical, etc.) are connected to each other.

The arylene group in $L^1$ and $L^2$ above may be, for example, a $C_{6-20}$ arylene group or a $C_{6-18}$ arylene group. For example, the arylene group may be phenyl, biphenyl, naphthyl, terphenyl, etc.

The heterocyclic group in $L^1$ and $L^2$ above may be, for example, a $C_{2-20}$ heterocyclic group or a $C_{2-18}$ heterocyclic group. For example, the heterocyclic group may be pyridine, pyrimidine, benzofuran, benzothiophene, dioxin, dibenzofuran, dibenzothiophene, naphthobenzothiophene, naphthobenzofuran, etc.

The alkylene group in $L^1$ and $L^2$ above may be, for example, a $C_{1-10}$ alkylene group. For example, the alkylene group may be a methylene group, an ethylene group, a t-butylene group, etc.

The alkoxyl group in $L^1$ and $L^2$ above may be, for example, a $C_{1-10}$ alkoxyl group. For example, the alkoxyl group may be methoxy, t-butoxy, etc.

The alkylthio group in $L^1$ and $L^2$ above may be, for example, a $C_{1-10}$ alkylthio group. For example, the alkylthio group may be a methylthio group, a t-butylthio group, etc.

5) $R^1$ is Formula 1-1 above, and

In Formula 1-1 above,

6) $L^3$ is selected from the group consisting of a single bond; a $C_{6-20}$ arylene group; a $C_{2-20}$ heterocyclic group including at least one heteroatom selected from the group consisting of O, N, S, Si, and P; a $C_{3-20}$ cycloaliphatic group; a $C_{1-10}$ alkylene group; a $C_{1-10}$ alkoxyl group; a $C_{1-10}$ alkylthio group; and a combination thereof.

That $L^3$ is selected from a combination thereof means that $L^3$ is selected from a plurality of combinations of the divalent radicals listed previously, and for example, may refer to a form in which two or more radicals selected independently of each other (e.g., the first radical-second radical, etc.) are connected to each other.

The arylene group in $L^3$ above may be, for example, a $C_{6-18}$ arylene group. For example, the arylene group may be phenyl, biphenyl, naphthyl, terphenyl, etc.

The heterocyclic group in $L^3$ above may be, for example, a $C_{2-18}$ heterocyclic group. For example, the heterocyclic group may be pyridine, pyrimidine, benzofuran, benzothiophene, dioxin, dibenzofuran, dibenzothiophene, naphthobenzothiophene, naphthobenzofuran, etc.

The alkylene group in $L^3$ above may be, for example, a $C_{1-5}$ alkylene group. For example, the alkylene group may be a methylene group, an ethylene group, a t-butylene group, etc.

The alkoxyl group in $L^3$ above may be, for example, a $C_{1-5}$ alkoxyl group. For example, the alkoxyl group may be methoxy, t-butoxy, etc.

The alkylthio group in $L^3$ above may be, for example, a $C_{1-5}$ alkylthio group. For example, the alkylthio group may be a methylthio group, a t-butylthio group, etc.

7) $R^2$ is selected from the group consisting of hydrogen; deuterium; tritium; a halogen; a cyano group; a nitro group; a $C_{6-60}$ aryl group; a fluorenyl group; a $C_{2-60}$ heterocyclic group including at least one heteroatom selected from the group consisting of O, N, S, Si, and P; a fused ring group of a $C_{3-60}$ aliphatic ring and a $C_{6-60}$ aromatic ring; a $C_{1-50}$ alkyl group; a $C_{2-20}$ alkenyl group; a $C_{2-20}$ alkynyl group; a $C_{1-30}$ alkoxyl group; a $C_{6-30}$ aryloxy group; and $-L'-N(R_a)(R_b)$.

When $R^2$ is an aryl group, it may preferably be a $C_{6-30}$ aryl group, and more preferably a $C_{6-18}$ aryl group (e.g., phenyl, biphenyl, naphthyl, terphenyl, etc.).

When $R^2$ is a fluorenyl group, it may preferably be 9,9-dimethyl-9H-fluorene, 9,9-diphenyl-9H-fluorenyl group, 9,9'-spirobifluorene, etc.

When $R^2$ is a heterocyclic group, it may preferably be a $C_{2-30}$ heterocyclic group, more preferably a $C_{2-18}$ heterocyclic group (e.g., dibenzofuran, dibenzothiophene, naphthobenzothiophene, naphthobenzofuran, etc.).

When $R^2$ is an alkyl group, it may preferably be a $C_{1-10}$ alkyl group (e.g., methyl, t-butyl, etc.).

When $R^2$ is an alkoxyl group, it may preferably be a $C_{1-20}$ alkoxyl group, and more preferably a $C_{1-10}$ alkoxyl group (e.g., methoxy, t-butoxy, etc.).

8) L' is selected from the group consisting of a single bond; a $C_{6-20}$ arylene group; a $C_{2-20}$ heterocyclic group comprising at least one heteroatom selected from the group consisting of O, N, S, Si, and P; a $C_{3-20}$ cycloaliphatic group; a $C_{1-10}$ alkylene group; a $C_{1-10}$ alkoxyl group; a $C_{1-10}$ alkylthio group; and a combination thereof.

That L' is selected from a combination of these means that L' is selected from a plurality of combinations of the divalent radicals listed previously, and for example, may refer to a form in which two or more radicals selected independently of each other (e.g., the first radical-second radical, etc.) are connected to each other.

The arylene group in L' above may be, for example, a $C_{6-18}$ arylene group. For example, the arylene group may be phenyl, biphenyl, naphthyl, terphenyl, etc.

The heterocyclic group in L' above may be, for example, a $C_{2-18}$ heterocyclic group. For example, the heterocyclic group may be pyridine, pyrimidine, benzofuran, benzothiophene, dioxin, dibenzofuran, dibenzothiophene, naphthobenzothiophene, naphthobenzofuran, etc.

The alkylene group in L' above may be, for example, a $C_{1-5}$ alkylene group. For example, the alkylene group may be a methylene group, an ethylene group, a t-butylene group, etc.

The alkoxyl group in L' above may be, for example, a $C_{1-5}$ alkoxyl group. For example, the alkoxyl group may be methoxy, t-butoxy, etc.

The alkylthio group in L' above may be, for example, a $C_{1-5}$ alkylthio group. For example, the alkylthio group may be a methylthio group, a t-butylthio group, etc.

In L' above, the arylene group, heterocyclic group, alkylene group, alkoxyl group, and alkylthio group may each further be substituted with one or more substituents selected from the group consisting of deuterium; a $C_{6-10}$ aryl group; a $C_{2-10}$ heterocyclic group; a $C_{3-10}$ aliphatic ring; and a $C_{1-10}$ alkyl group.

9) $R_a$ and $R_b$ are each independently selected from the group consisting of a $C_{6-60}$ aryl group; a fluorenyl group; a $C_{3-60}$ cycloaliphatic group; a $C_{2-60}$ heterocyclic group including at least one heteroatom selected from the group consisting of O, N, S, Si, and P; a $C_{1-50}$ alkyl group; and a combination thereof.

When $R_a$ and $R_b$ are aryl groups, they may each preferably be a $C_{6-30}$ aryl group, and more preferably a $C_{6-18}$ aryl group (e.g., phenyl, biphenyl, naphthyl, terphenyl, etc.).

When $R_a$ and $R_b$ are fluorenyl groups, they may each preferably be 9,9-dimethyl-9H-fluorene, 9,9-diphenyl-9H-fluorenyl group, 9,9'-spirobifluoren, etc.

When $R_a$ and $R_b$ are heterocyclic groups, they may each preferably be a $C_{2-30}$ heterocyclic group, and more preferably a $C_{2-18}$ heterocyclic group (e.g., dibenzofuran, dibenzothiophene, naphthobenzothiophene, naphthobenzofuran, etc.).

When $R_a$ and $R_b$ are heterocyclic groups, they may each preferably be a $C_{1-10}$ alkyl group (e.g., methyl, t-butyl, etc.).

10) a is an integer from 0 to 5; in which when a is 2 or more, plural $R^2$ are the same or different from each other, and a plurality of neighboring $R^2$ may bind to each other to form a ring.

11) In $L^1$ to $L^3$, L', $R_a$ and $R_b$, and $R^2$ above, the arylene group, heterocyclic group, alkylene group, alkoxyl group, and alkylthio group may each be further substituted with one or more substituents selected from the group consisting of deuterium; a $C_{6-10}$ aryl group; a $C_{2-10}$ heterocyclic group; a $C_{3-10}$ cycloaliphatic group; and a $C_{1-10}$ alkyl group.

The ligand represented by Formula 1 above may be represented by any one of the following Formulas.

[Formula 2-1]

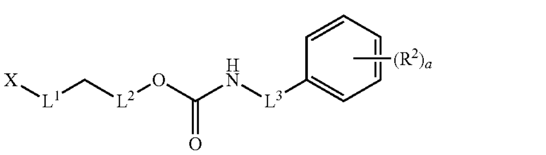

[Formula 2-2]

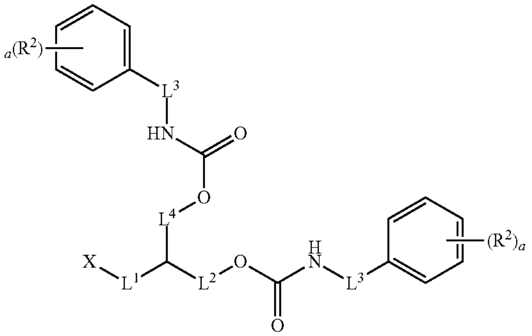

In Formula 2-1 and Formula 2-2 above,

1) X, $L^1$ to $L^4$, $R^2$, and a are the same as defined in Formula 1 above;

2) in Formula 2-2 above, each of $L^3$, $R^2$, or a is the same or different; and 3) in $L^1$ to $L^4$, and $R^2$ above, the arylene group, heterocyclic group, alkylene group, alkoxy group, and alkylthio group may each be further substituted with one or more substituents selected from the group consisting of deuterium; a $C_{6-10}$ aryl group; a $C_{2-10}$ heterocyclic group; a $C_{3-10}$ cycloaliphatic group; and a $C_{1-10}$ alkyl group.

The ligand represented by Formula 1 above may be any one of the following compounds, but is not limited thereto.

L-1
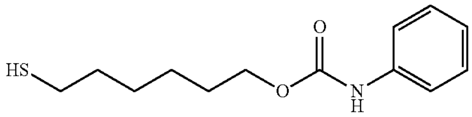
L-2
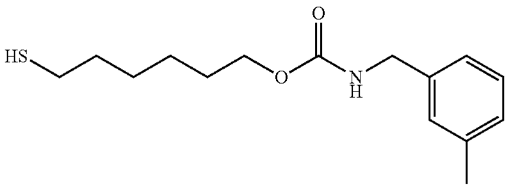
L-3
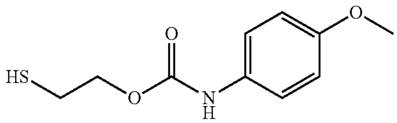
L-4
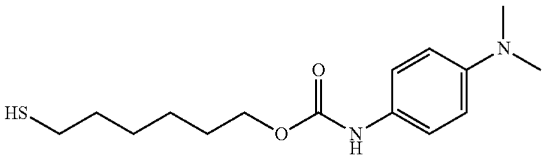
L-5
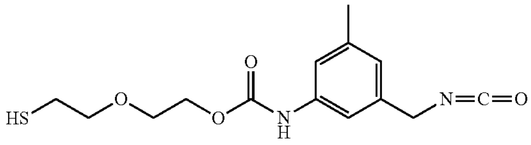
L-6
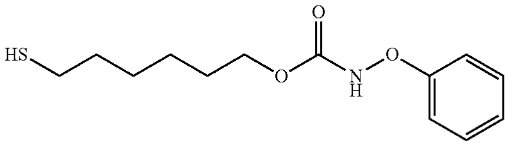
L-7
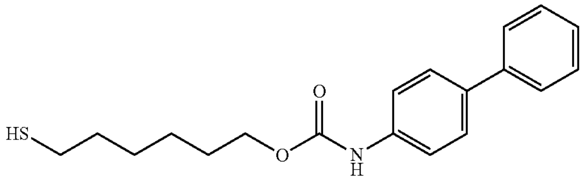
L-8
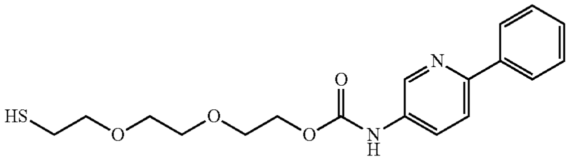
L-9
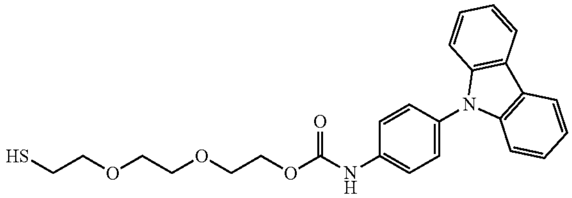
L-10
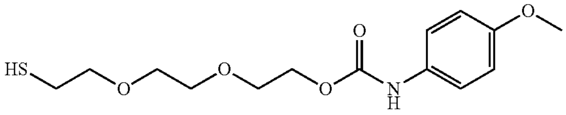
L-11
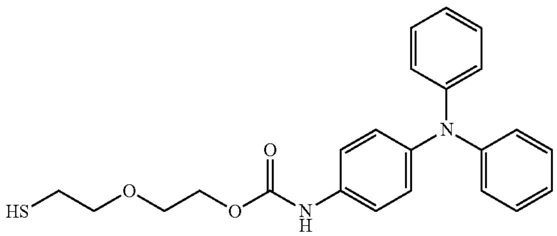
L-12
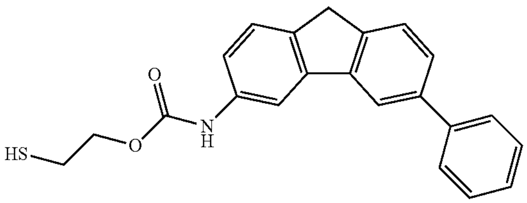
L-13
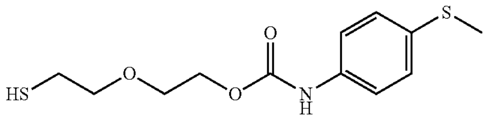
L-14
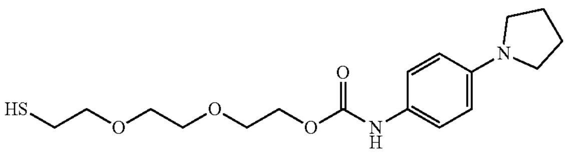

-continued
L-15
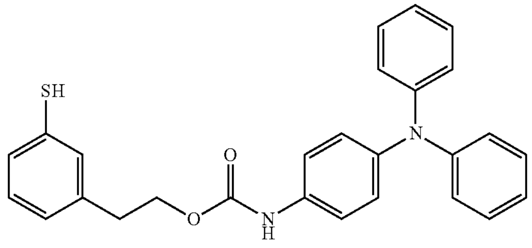
L-16
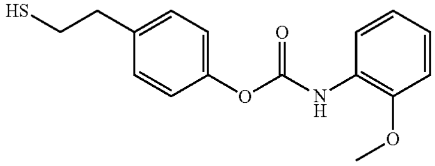
L-17
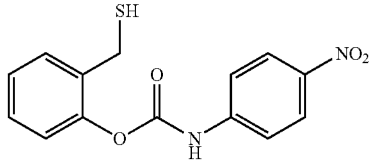
L-18
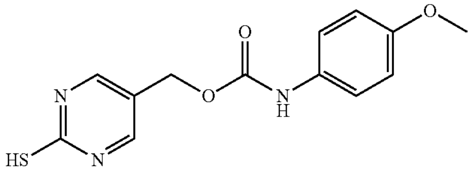
L-19
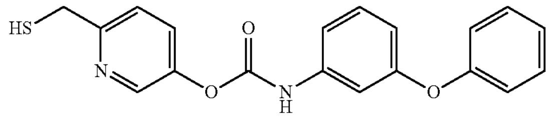
L-20
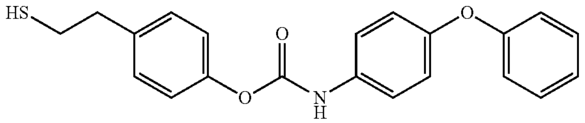
L-21
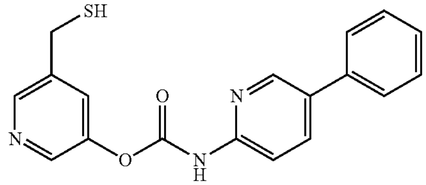
L-22
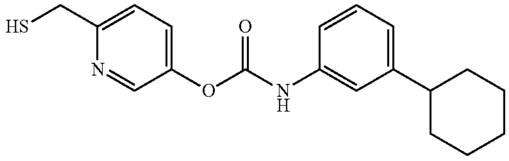
L-23
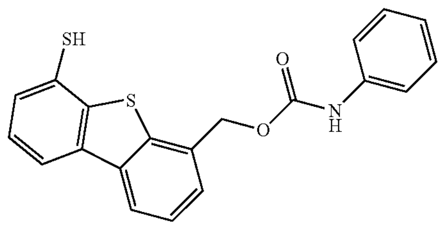
L-24
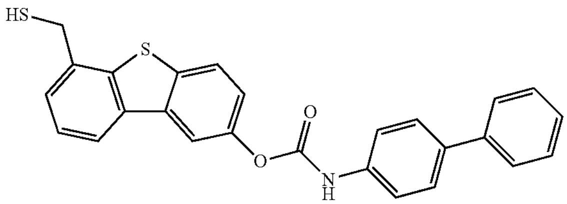
L-25
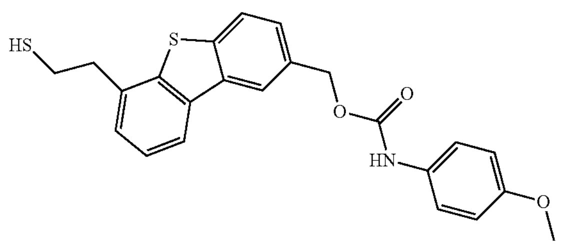
L-26
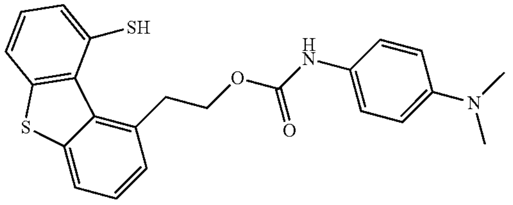
L-27
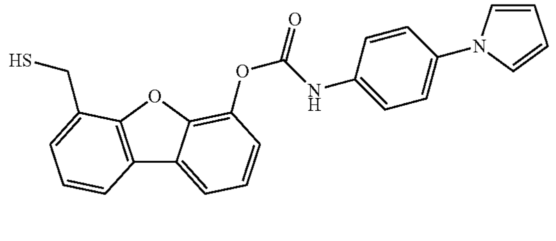
L-28
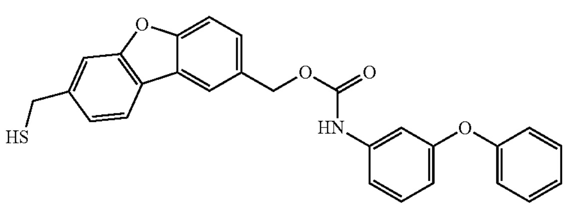

-continued
L-29
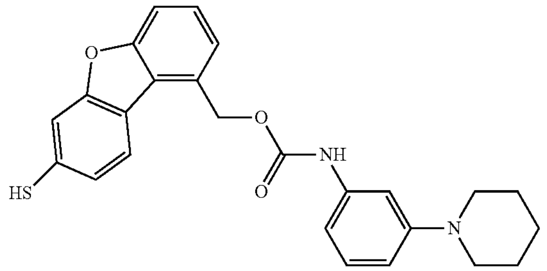
L-30
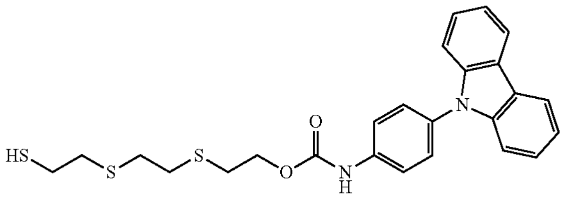
L-31
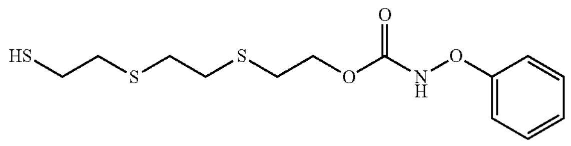
L-32
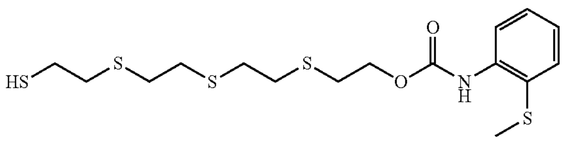
L-33
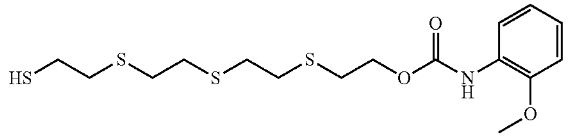
L-34
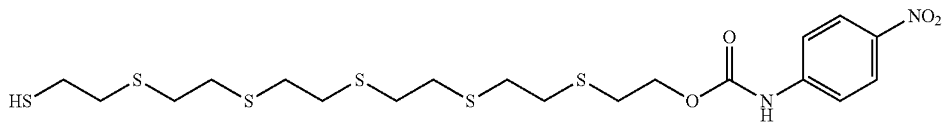
L-35
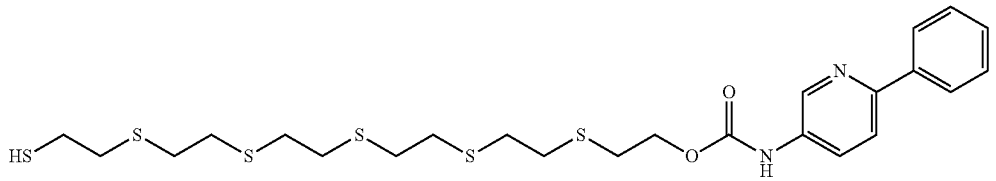
L-36
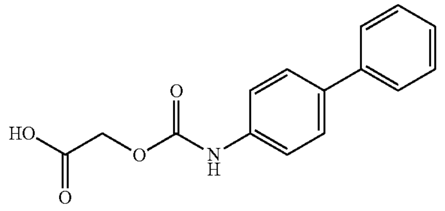
L-37
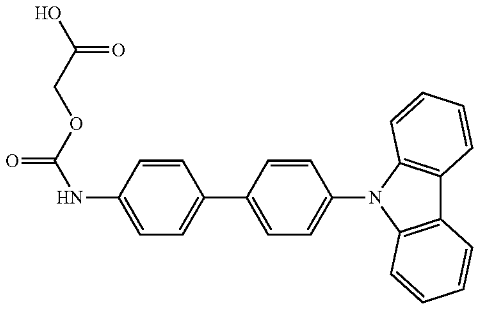
L-38
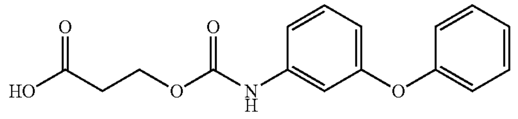
L-39
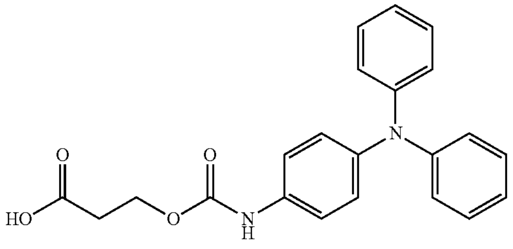

-continued
L-40
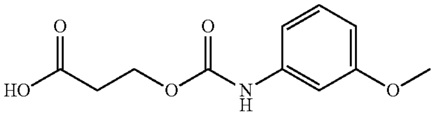
L-41
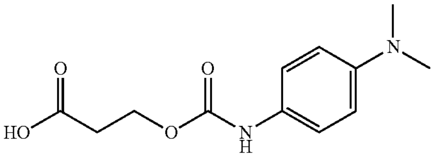
L-42
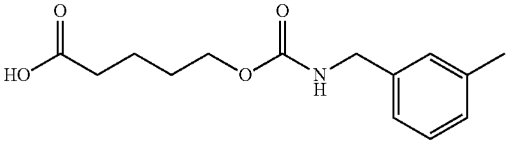
L-43
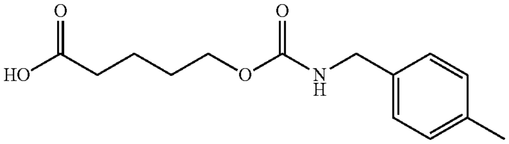
L-44
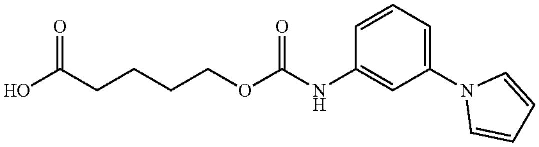
L-45
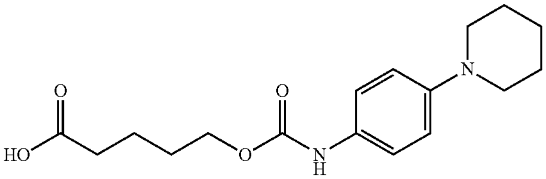
L-46
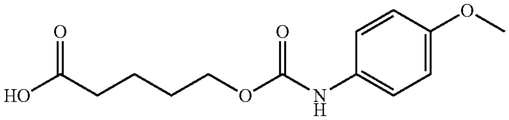
L-47
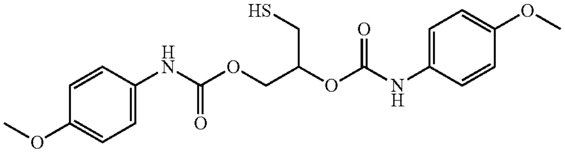
L-48
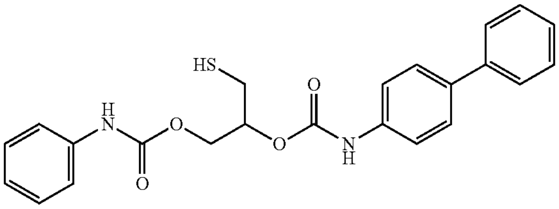
L-49
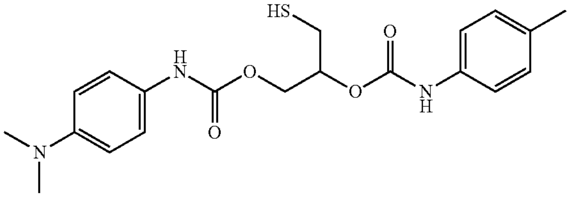
L-50
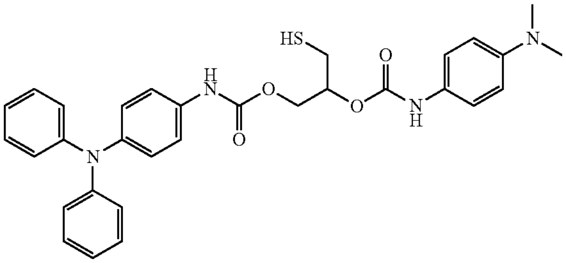
L-51
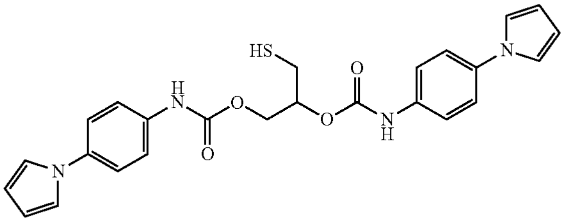
L-52
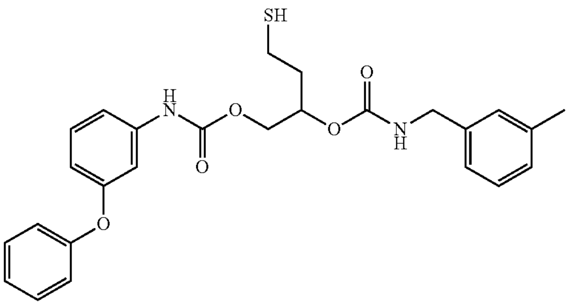
L-53
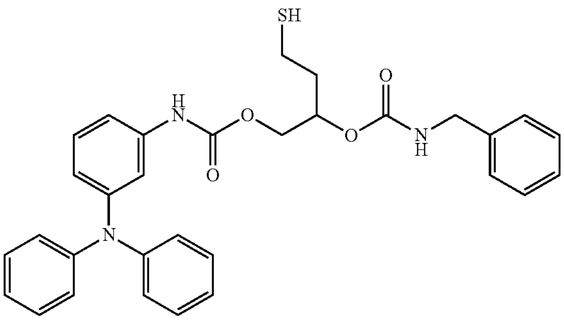

-continued
L-54
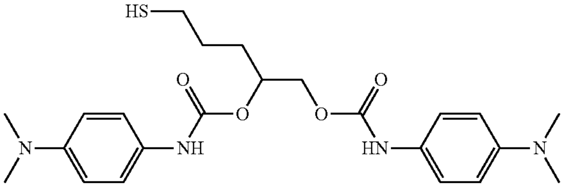
L-55
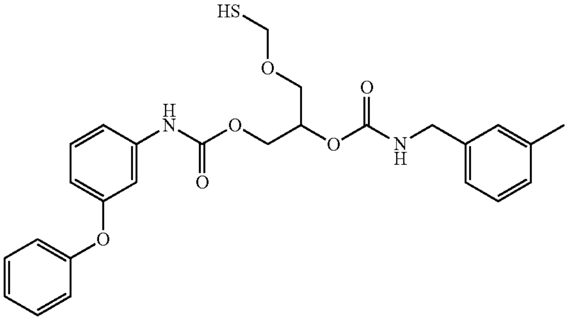
L-56
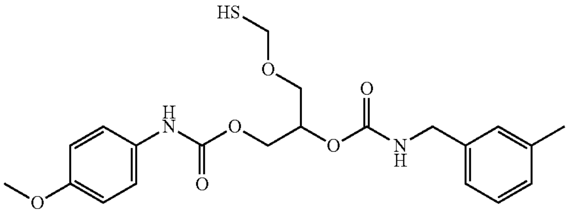
L-57
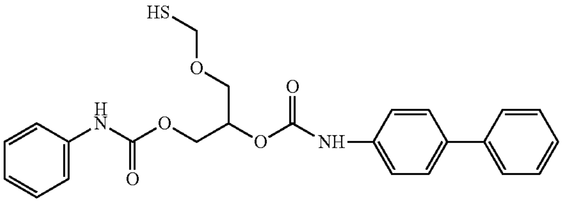
L-58
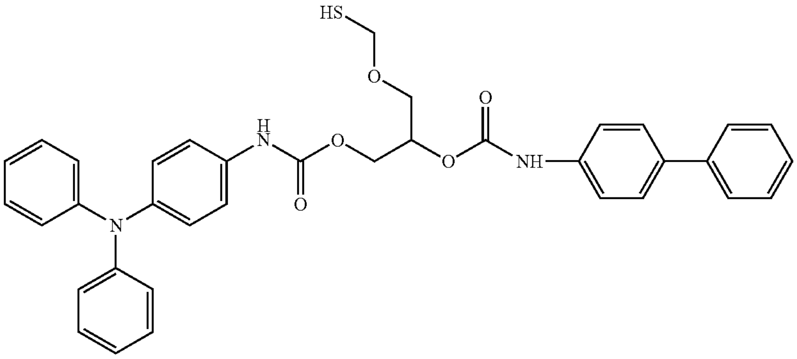
L-59
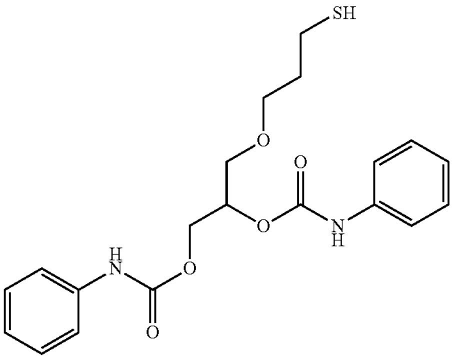
L-60
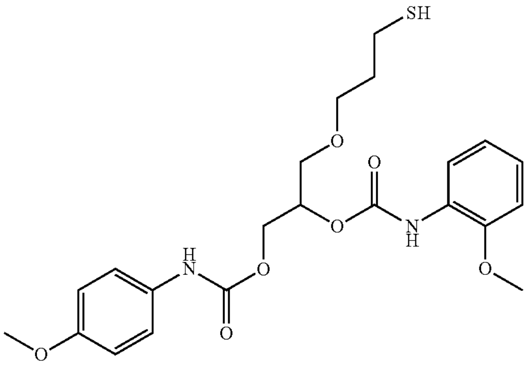

-continued
L-61
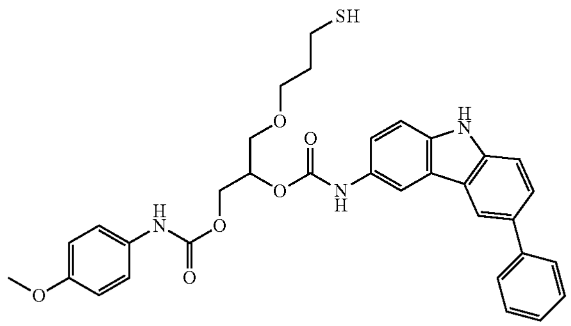
L-62
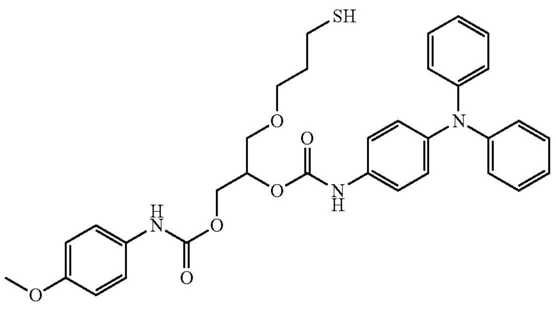
L-63
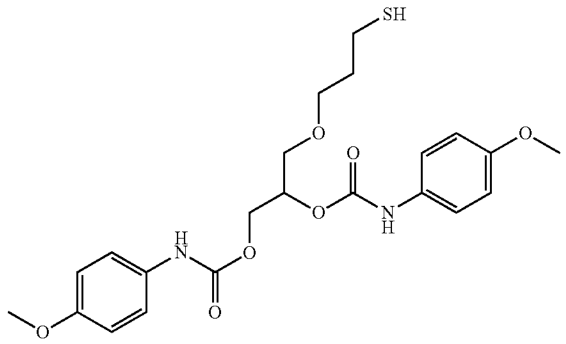
L-64
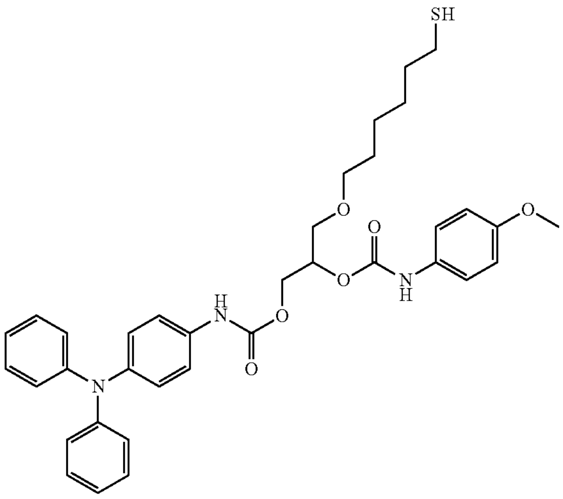
L-65
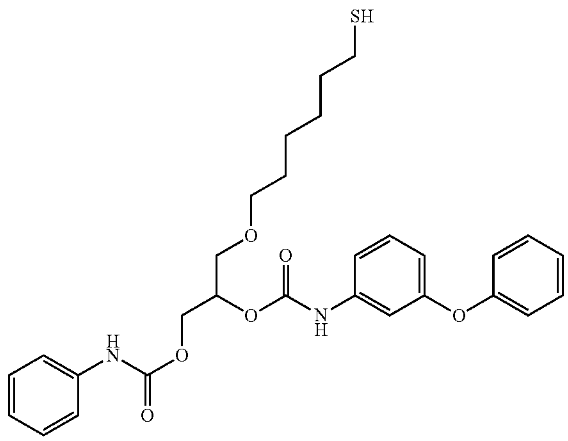
L-66
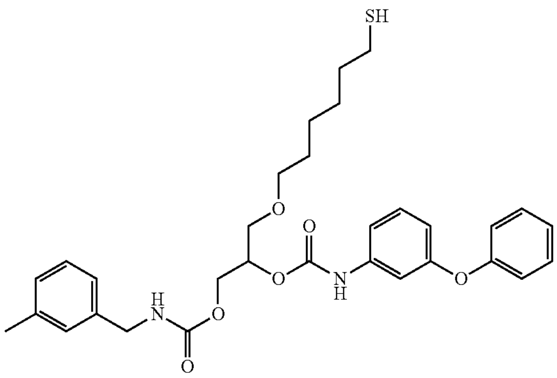

-continued
L-67
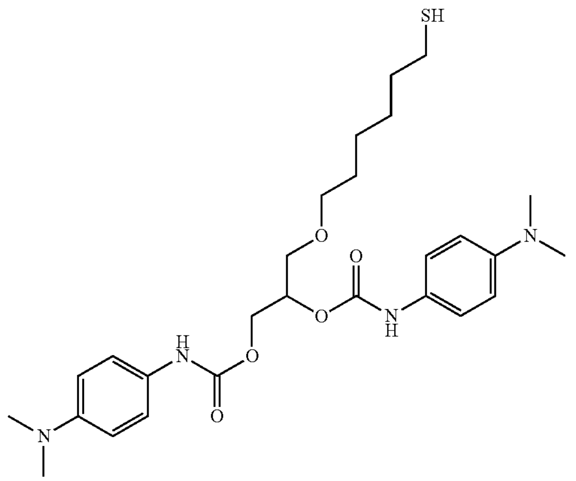
L-68
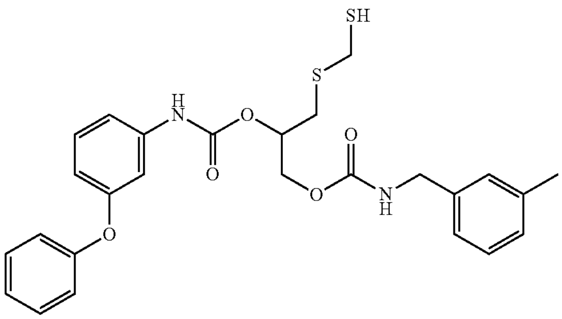
L-69
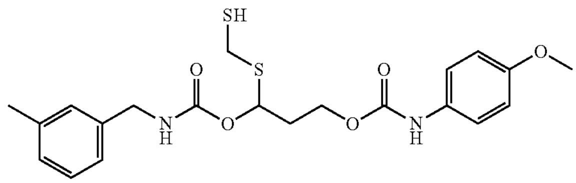
L-70
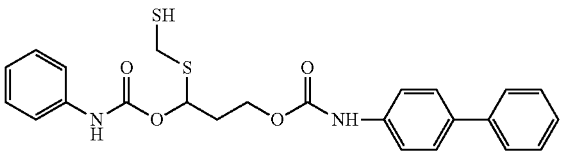
L-71
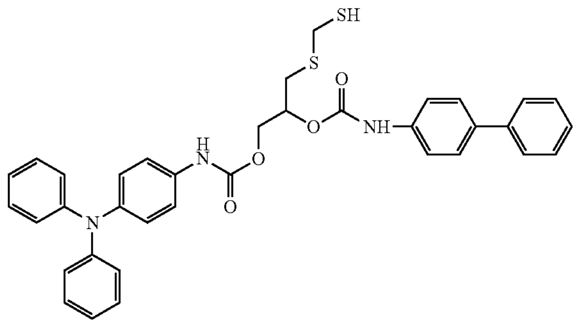
L-72
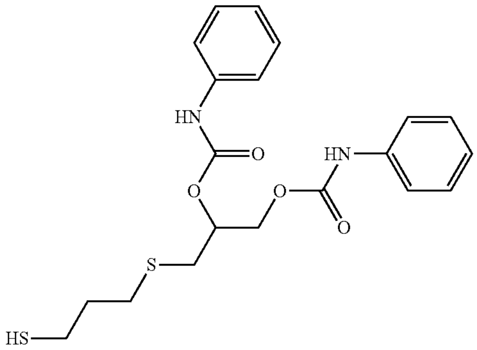
L-73
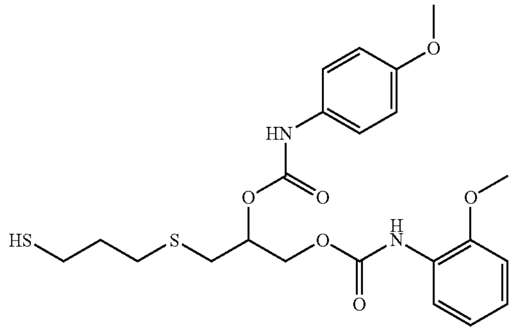
L-74
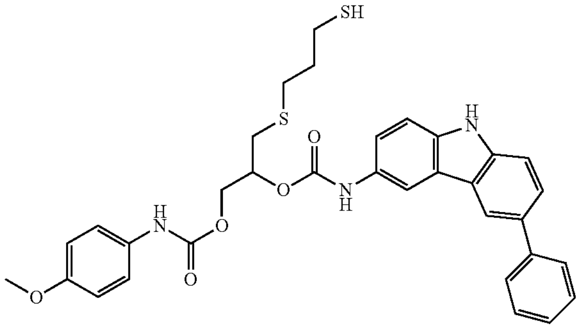

-continued
L-75
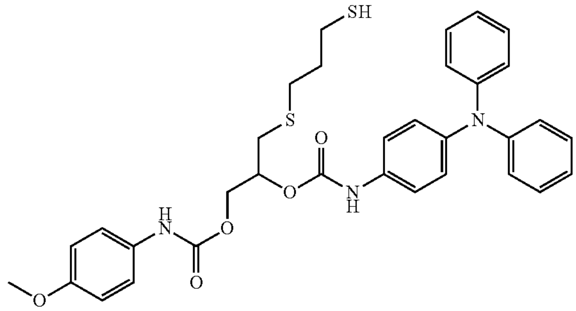
L-76
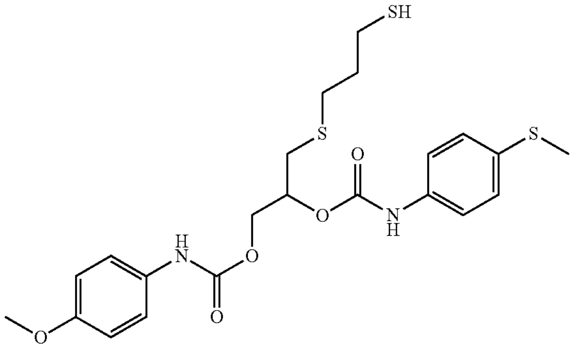
L-77
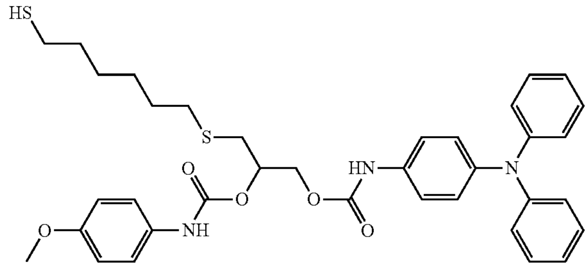
L-78
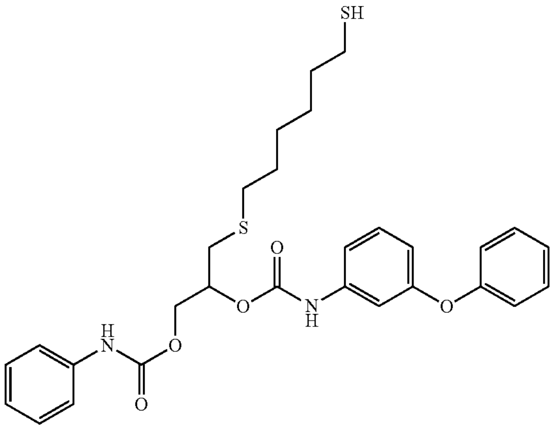
L-79
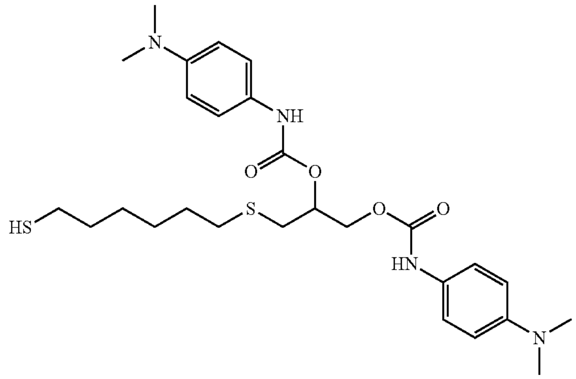
L-80
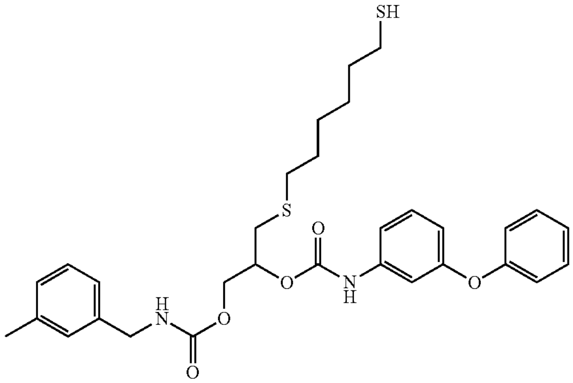
L-81
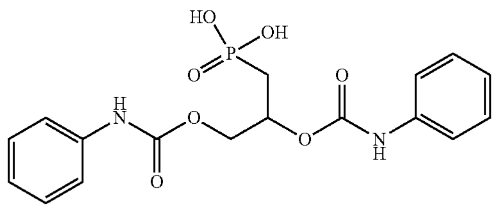
L-82
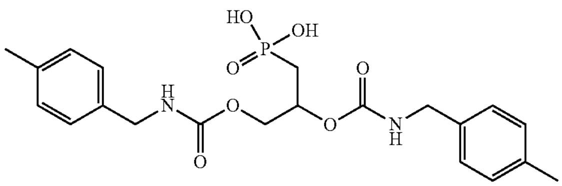

-continued
L-83
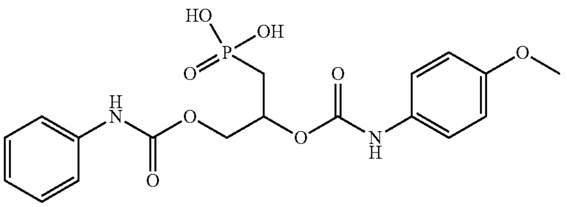
L-84
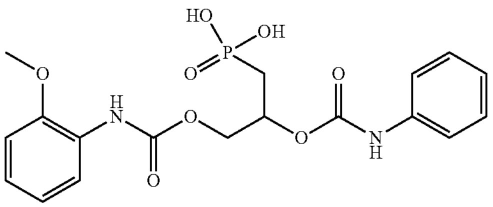
L-85
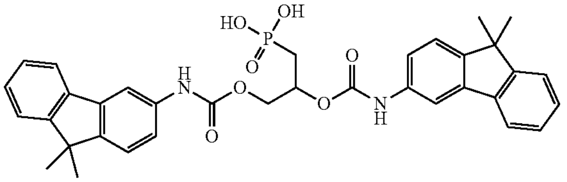
L-86
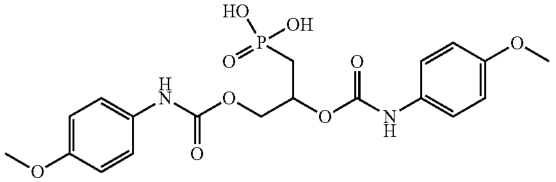
L-87
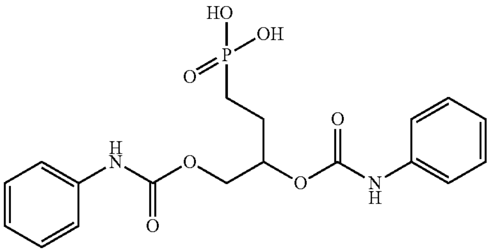
L-88
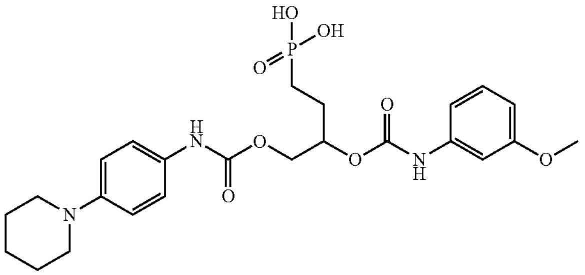
L-89
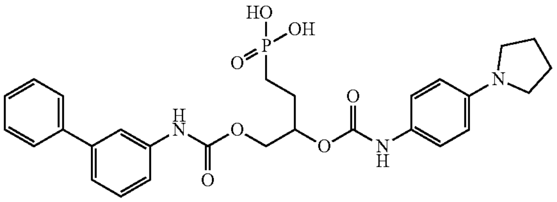
L-90
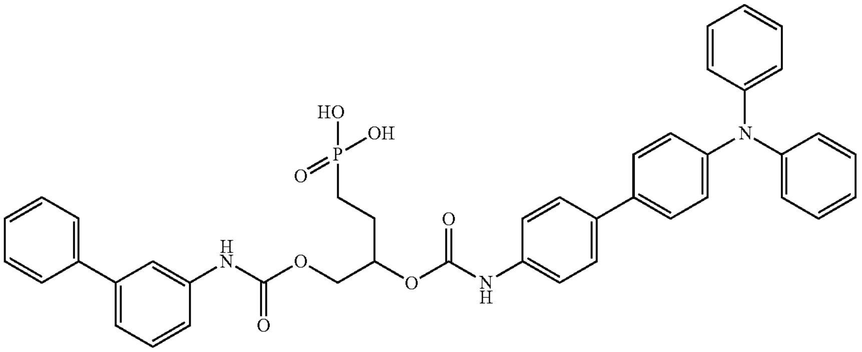
L-91
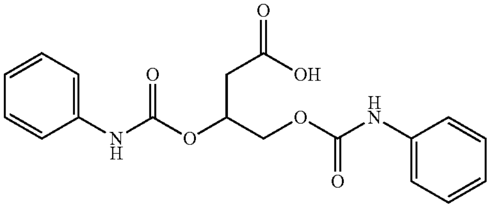
L-92
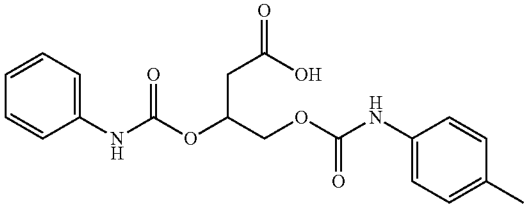

-continued
L-93
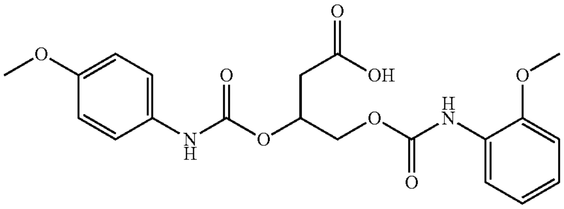
L-94
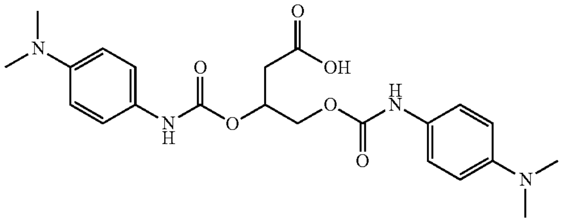
L-95
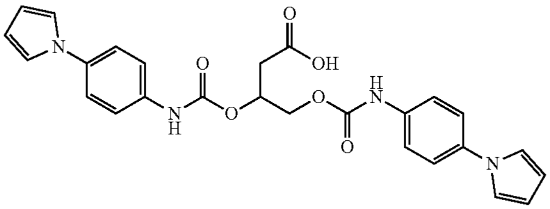
L-96
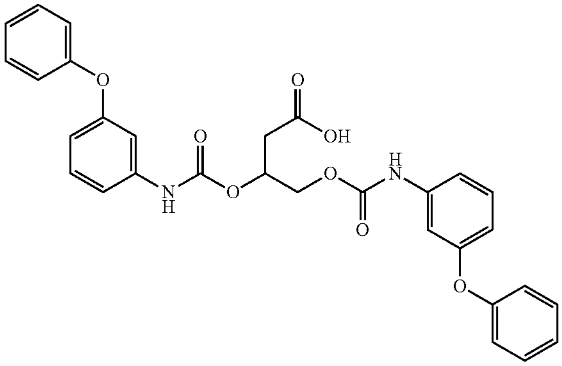
L-97
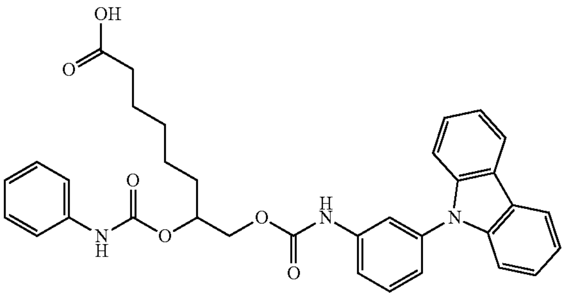
L-98
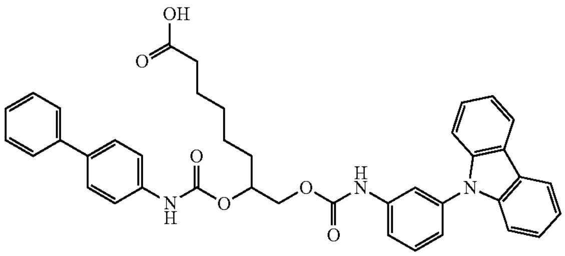
L-99
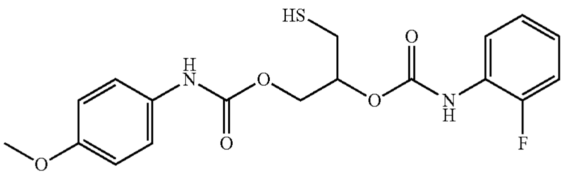
L-100
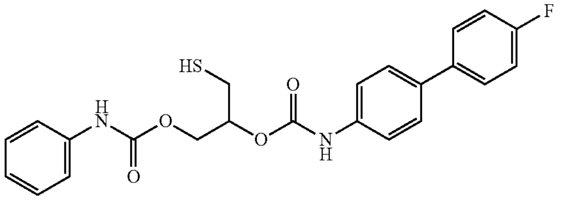
L-101
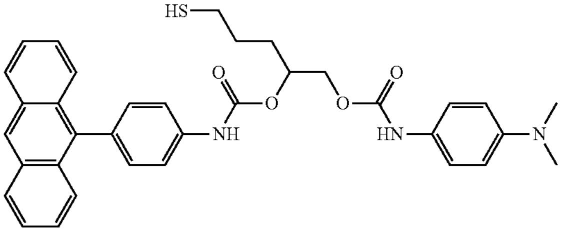
L-102
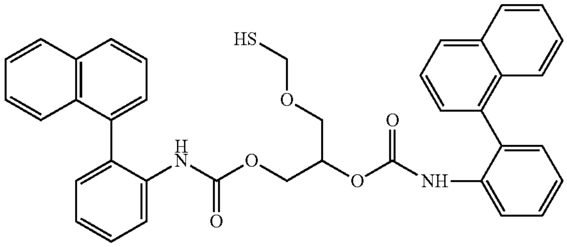

-continued

L-103

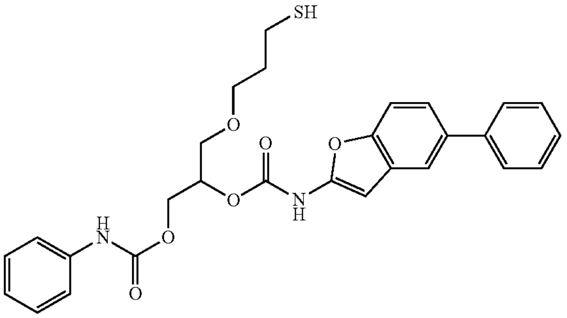

L-104

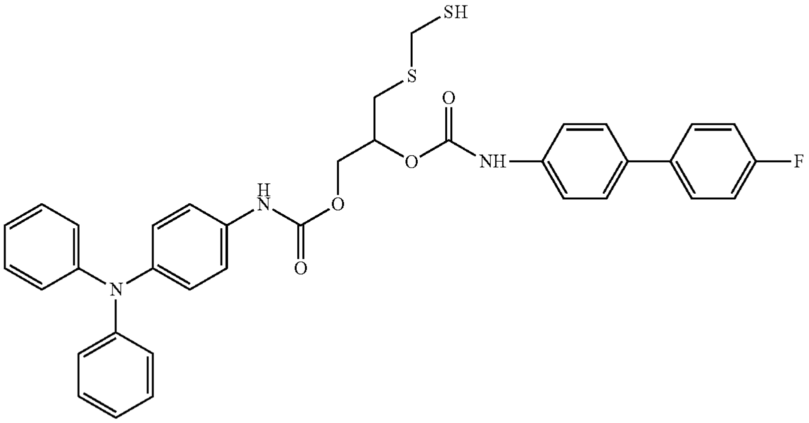

L-105

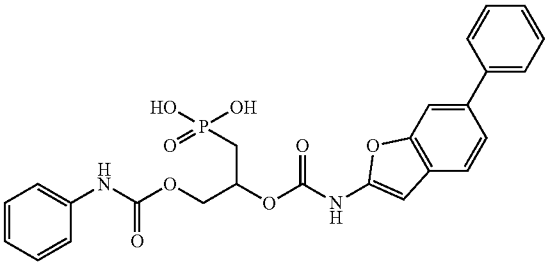

L-106

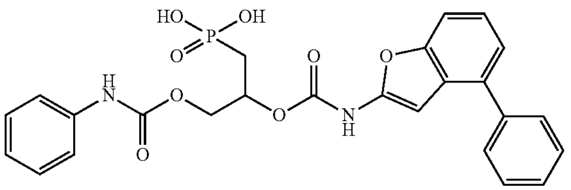

L-107

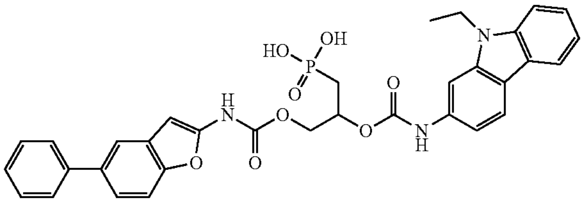

L-108

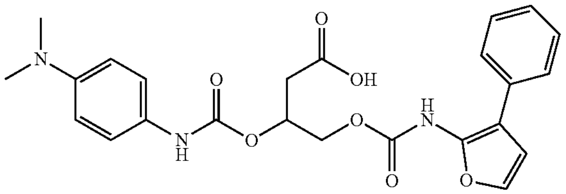

Semiconductor nanoparticles may include a central particle. The central particle may consist of a single-layer or multi-layer structure. The central particle may consist of a group II-VI compound, a group II-V compound, a group III-V compound, a group III-IV compound, a group III-VI compound, a group IV-VI compound, or a mixture thereof. In addition, a dopant may be doped or alloyed with the central particle. The "mixture" includes not only a simple mixture of the compounds above, but also a ternary compound, a quaternary compound, and a case in which a dopant is doped into the mixture.

As the Group II element, one or more may be selected from the group consisting of Zn, Cd, Hg, and Mg; and as the Group III element, one or more may be selected from the group consisting of Al, Ga, In, and Ti.

As the Group IV element, one or more may be selected from the group consisting of Si, Ge, Sn, and Pb; and as the Group VI element, one or more may be selected from the group consisting of O, S, Se, and Te; and as the Group V element, one or more may be selected from the group consisting of P, As, Sb, and Bi.

Group II-VI compounds may be, for example, magnesium sulfide (MgS), magnesium selenide (MgSe), magnesium telluride (MgTe), calcium sulfide (CaS), calcium selenide (CaSe), calcium telluride (CaTe), strontium sulfide (SrS), strontium selenide (SrSe), strontium telluride (SrTe), cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), or mercury telluride (HgTe).

Group II-V compounds may be, for example, zinc phosphide ($Zn_3P_2$), zinc arsenide ($Zn_3As_2$), cadmium phosphide ($Cd_3P_2$), cadmium arsenide ($Cd_3As_2$), nitride It may be cadmium ($Cd_3N_2$), or zinc nitride ($Zn_3N_2$).

Group III-V compounds may be, for example, boron phosphide (BP), aluminum phosphide (AlP), aluminum arsenide (AlAs), aluminum antimonide (AlSb), gallium nitride (GaN), gallium phosphide (GaP), gallium arsenide (GaAs), gallium antimonide (GaSb), indium nitride (InN), indium phosphide (InP), indium arsenide (InAs), indium antimonide (InSb), aluminum nitride (AlN), or boron nitride (BN).

Group III-IV compounds may be, for example, boron carbide ($B_4C$), aluminum carbide ($A_4C_3$), or gallium carbide ($Ga_4C$).

Group III-VI compounds may be, for example, aluminum sulfide ($Al_2S_3$), aluminum selenide ($Al_2Se_3$), aluminum telluride ($Al_2Te_3$), gallium sulfide ($Ga_2S_3$), gallium selenide ($Ga_2Se_3$), indium sulfide ($In_2S_3$), indium selenide ($In_2Se_3$), gallium telluride ($Ga_2Te_3$), or indium telluride ($In_2Te_3$).

Group IV-VI compounds may be, for example, lead sulfide (PbS), lead selenide (PbSe), lead telluride (PbTe), tin sulfide (SnS), tin selenide (SnSe), or tin telluride (SnTe).

When the central particle has a multi-layered structure, for example, the central particle may include a core/shell structure. In this case, the core and the shell of the central particle may consist of a Group II-VI compound, a Group II-V compound, a Group III-V compound, a group III-IV compound, a Group III-VI compound, a Group IV-VI compound, or a mixture thereof; a dopant may be doped or alloyed on the core or shell of the central atom; and the compound constituting the core and the compound constituting the shell may be different from each other. For example, the central particle may have a CdZnS/ZnS (core/shell) structure, which has a core including CdZnS and a shell including ZnS. In another embodiment, the central particle may have an InZnP/ZnSeS (core/shell) structure having a core including InZnP and a shell including ZnSeS.

In another aspect, when the central particle has a multi-layered structure, for example, the central particle may have a core/multi-shell structure having a shell of at least two or more layers. In this case, the core and the shell of the central particle may consist of a Group II-VI compound, a Group II-V compound, a Group III-V compound, a Group III-IV compound, a Group III-VI compound, a Group IV-VI compound, or a mixture thereof; a dopant may be doped or alloyed on the core or shell of the central atom; and the compound constituting the core and the compound constituting the shell may be different from each other. For example, the central particle may have a CdZnS/ZnS/ZnS (core/first shell/second shell) structure, which has a core including CdZnS, a first shell surrounding the surface of the core and including ZnS, and a second shell surrounding the surface of the first shell and including ZnS.

The central particle may be a single layer rather than a multi-layered structure (core/shell structure), and may consist of, for example, only a Group II-VI compound.

The central particle may further include a cluster molecule as a seed. The cluster molecule is a compound serving as a seed in the process of manufacturing the central particle, and the central particle may be formed by growing precursors of the compound constituting the central particle on the cluster molecule.

The semiconductor nanoparticle may have a particle diameter of 1 nm to 30 nm, or 5 nm to 15 nm.

The semiconductor nanoparticle-ligand composite according to embodiments of the present disclosure may further include a ligand other than the ligand represented by Formula 1 above. For example, the semiconductor nanoparticle-ligand composite may include an amine-based compound having an alkyl group having 6 to 30 carbon atoms, (poly)ethyleneoxy, an amine-based compound having an aryl group, a thiol compound, a carboxylic acid compound, etc. as a ligand. Examples of the amine-based compound having an alkyl group may include hexadecylamine, octylamine, etc. Another example of the ligand may include an amine-based compound or a carboxylic acid compound having an alkenyl group having 6 to 30 carbon atoms, etc. Alternatively, still another example of the ligand may include a phosphine compound including trioctylphosphine, triphenolphosphine, t-butylphosphine, etc.; a phosphine oxide (e.g., trioctylphosphine oxide, etc.); pyridine or thiophene, etc.

The types of ligands that can be used together with the ligands proposed in the present disclosure are not limited to those exemplified above.

The ligand of the semiconductor nanoparticle-ligand composite can prevent the central particles adjacent to each other from being agglomerated and quenched. The ligand binds to the central particle and may have a hydrophobic property.

In another aspect, according to embodiments of the present disclosure, it is possible to provide a method for manufacturing a semiconductor nanoparticle-ligand composite.

A method for manufacturing a semiconductor nanoparticle-ligand composite includes a step of first surface modification, in which semiconductor nanoparticles are surface-modified, and a step of second surface modification, in which the semiconductor nanoparticles surface-modified by the step of first surface modification are surface-modified.

In describing the method for manufacturing the semiconductor nanoparticle-ligand composite according to the embodiments of the present disclosure, the matters relating to the semiconductor nanoparticles are the same as those for the semiconductor nanoparticles described while describing the semiconductor nanoparticle-ligand composite according to the above-described embodiments of the present disclosure, unless otherwise specified, and are thus omitted herein.

The first surface modification is a step, in which the surface of semiconductor nanoparticles is surface-modified with a compound represented by the following Formula 3-1 or Formula 3-2.

[Formula 3-1]

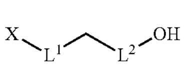

[Formula 3-2]

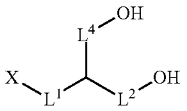

Hereinafter, Formula 3-1 or Formula 3-2 will be described.

1) X, which is a functional group that binds to a surface of a semiconductor nanoparticle, is —S(H) or P═O $(OH)_2$ or —COOH.

2) $L^1$ and $L^2$ are each independently selected from the group consisting of a single bond; a $C_{6-30}$ arylene group; a $C_{2-30}$ heterocyclic group comprising at least one heteroatom selected from the group consisting of O, N, S, Si, and P; a $C_{1-20}$ alkylene group; a $C_{1-20}$ alkoxyl group; a $C_{1-20}$ alkylthio group; Formula B; and a combination thereof.

[Formula B]

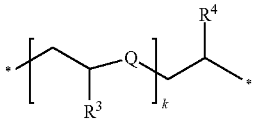

In Formula B above, 2-1) *means a binding site, 2-2) Q is O or S;

2-3) k is an integer of 1 to 12;

2-4) $R^3$ and $R^4$ are each independently hydrogen or a methyl group.

That $L^1$ and $L^2$ are selected from a combination thereof means that $L^1$ and $L^2$ are selected from a plurality of combinations of the divalent radicals listed previously, and for example, may refer to a form in which two or more radicals selected independently of each other (e.g., the first radical-second radical, etc.) are connected to each other.

The arylene group in $L^1$ and $L^2$ above may be, for example, a $C_{6-20}$ arylene group or a $C_{6-18}$ arylene group. For example, the arylene group may be phenyl, biphenyl, naphthyl, terphenyl, etc.

The heterocyclic group in $L^1$ and $L^2$ above may be, for example, a $C_{2-20}$ heterocyclic group or a $C_{2-18}$ heterocyclic group. For example, the heterocyclic group may be pyridine, pyrimidine, benzofuran, benzothiophene, dioxin, dibenzofuran, dibenzothiophene, naphthobenzothiophene, naphthobenzofuran, etc.

The alkylene group in $L^1$ and $L^2$ above may be, for example, a $C_{1-10}$ alkylene group. For example, the alkylene group may be a methylene group, an ethylene group, a t-butylene group, etc.

The alkoxyl group in $L^1$ and $L^2$ above may be, for example, a $C_{1-10}$ alkoxyl group. For example, the alkoxyl group may be methoxy, t-butoxy, etc.

The alkylthio group in $L^1$ and $L^2$ above may be, for example, a $C_{1-10}$ alkylthio group. For example, the alkylthio group may be a methylthio group, a t-butylthio group, etc.

3) $L^4$ is selected from the group consisting of a single bond; a $C_{6-20}$ arylene group; a $C_{2-20}$ heterocyclic group including at least one heteroatom selected from the group consisting of O, N, S, Si, and P; a $C_{1-10}$ alkylene group; a $C_{1-10}$ alkoxyl group; a $C_{1-10}$ alkylthio group; and a combination thereof.

That $L^4$ is selected from a combination thereof means that $L^4$ is selected from a plurality of combinations of the divalent radicals listed previously, and for example, may refer to a form in which two or more radicals selected independently of each other (e.g., the first radical-second radical, etc.) are connected to each other.

The arylene group in $L^4$ above may be, for example, a $C_{6-18}$ arylene group. For example, the arylene group may be phenyl, biphenyl, naphthyl, terphenyl, etc.

The heterocyclic group in $L^4$ above may be, for example, a $C_{2-18}$ heterocyclic group. For example, the heterocyclic group may be pyridine, pyrimidine, benzofuran, benzothiophene, dioxin, dibenzofuran, dibenzothiophene, naphthobenzothiophene, naphthobenzofuran, etc.

The alkylene group in $L^4$ above may be, for example, a $C_{1-5}$ alkylene group. For example, the alkylene group may be a methylene group, an ethylene group, a t-butylene group, etc.

The alkoxyl group in $L^4$ above may be, for example, a $C_{1-5}$ alkoxyl group. For example, the alkoxyl group may be methoxy, t-butoxy, etc.

The alkylthio group in $L^4$ above may be, for example, a $C_{1-5}$ alkylthio group. For example, the alkylthio group may be a methylthio group, a t-butylthio group, etc.

In $L^1$, $L^2$, and $L^4$ above, the arylene group, heterocyclic group, alkylene group, alkoxyl group, and alkylthio group may each be further substituted with one or more substituents selected from the group consisting of deuterium; a $C_{6-10}$ aryl group; a $C_{2-10}$ heterocyclic group; a $C_{3-10}$ cycloaliphatic group; and a $C_{1-10}$ alkyl group.

The second surface modification is a step, in which the semiconductor nanoparticles surface-modified with compounds Formula represented by Formula 3-1 and Formula 3-2 above are surface-modified by reacting with an isocyanate-based compound.

The isocyanate-based compound may be represented by the following Formula 9.

[Formula 9]

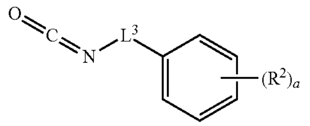

Hereinafter, Formula 9 will be described.

1) $L^3$ is selected from the group consisting of a single bond; a $C_{6-20}$ arylene group; a $C_{2-20}$ heterocyclic group including at least one heteroatom selected from the group consisting of O, N, S, Si, and P; a $C_{3-20}$ cycloaliphatic group; a $C_{1-10}$ alkylene group; a $C_{1-10}$ alkoxyl group; a $C_{1-10}$ alkylthio group; and a combination thereof.

That $L^3$ is selected from a combination thereof means that $L^3$ is selected from a plurality of combinations of the divalent radicals listed previously, and for example, may refer to a form in which two or more radicals selected independently of each other (e.g., the first radical-second radical, etc.) are connected to each other.

The arylene group in $L^3$ above may be, for example, a $C_{6-18}$ arylene group. For example, the arylene group may be phenyl, biphenyl, naphthyl, terphenyl, etc.

The heterocyclic group in $L^3$ above may be, for example, a $C_{2-18}$ heterocyclic group. For example, the heterocyclic group may be pyridine, pyrimidine, benzofuran, benzothiophene, dioxin, dibenzofuran, dibenzothiophene, naphthobenzothiophene, naphthobenzofuran, etc.

The alkylene group in $L^3$ above may be, for example, a $C_{1-5}$ alkylene group. For example, the alkylene group may be a methylene group, an ethylene group, a t-butylene group, etc.

The alkoxyl group in $L^3$ above may be, for example, a $C_{1-5}$ alkoxyl group. For example, the alkoxyl group may be methoxy, t-butoxy, etc.

The alkylthio group in $L^3$ above may be, for example, a $C_{1-5}$ alkylthio group. For example, the alkylthio group may be a methylthio group, a t-butylthio group, etc.

In $L^3$ above, the arylene group, heterocyclic group, alkylene group, alkoxyl group, and alkylthio group may each be further substituted with one or more substituents selected from the group consisting of deuterium; a $C_{6-10}$ aryl group; a $C_{2-10}$ heterocyclic group; a $C_{3-10}$ cycloaliphatic group; and a $C_{1-10}$ alkyl group.

2) $R^2$ is selected from the group consisting of hydrogen; deuterium; tritium; a halogen; a cyano group; a nitro group; a $C_{6-60}$ aryl group; a fluorenyl group; a $C_{2-60}$ heterocyclic group comprising at least one heteroatom selected from the group consisting of O, N, S, Si, and P; a fused ring group of a $C_{3-60}$ aliphatic ring and a $C_{6-60}$ aromatic ring; a $C_{1-50}$ alkyl group; a $C_{2-20}$ alkenyl group; a $C_{2-20}$ alkynyl group; a $C_{1-30}$ alkoxyl group; a $C_{6-30}$ aryloxy group; and -L'-N($R_a$)($R_b$).

When $R^2$ is an aryl group, it may preferably be a $C_{6-30}$ aryl group, more preferably a $C_{6-18}$ aryl group (e.g., phenyl, biphenyl, naphthyl, terphenyl, etc.).

When $R^2$ is a fluorenyl group, it may preferably be 9,9-dimethyl-9H-fluorene, 9,9-diphenyl-9H-fluorenyl group, 9,9'-spirobifluorene, etc.

When $R^2$ is a heterocyclic group, it may preferably be a $C_{2-30}$ heterocyclic group, more preferably a $C_{2-18}$ heterocyclic group (e.g., dibenzofuran, dibenzothiophene, naphthobenzothiophene, naphthobenzofuran, etc.).

When $R^2$ is an alkyl group, it may preferably be a $C_{1-10}$ alkyl group (e.g., methyl, t-butyl, etc.).

When $R^2$ is an alkoxyl group, it may preferably be a $C_{1-20}$ alkoxyl group, and more preferably a $C_{1-10}$ alkoxyl group (e.g., methoxy, t-butoxy, etc.).

In $R^2$ above, the arylene group, heterocyclic group, alkylene group, alkoxyl group, and alkylthio group may each be further substituted with one or more substituents selected from the group consisting of deuterium; a $C_{6-10}$ aryl group; a $C_{2-10}$ heterocyclic group; a $C_{3-10}$ cycloaliphatic group; and a $C_{1-10}$ alkyl group.

3) L' is selected from the group consisting of a single bond; a $C_{6-20}$ arylene group; a $C_{2-20}$ heterocyclic group comprising at least one heteroatom selected from the group consisting of O, N, S, Si, and P; a $C_{3-20}$ cycloaliphatic group; a $C_{1-10}$ alkylene group; a $C_{1-10}$ alkoxyl group; a $C_{1-10}$ alkylthio group; and a combination thereof.

That L' is selected from a combination thereof means that L' is selected from a plurality of combinations of the divalent radicals listed previously, and for example, may refer to a form in which two or more radicals selected independently of each other (e.g., the first radical-second radical, etc.) are connected to each other.

The arylene group in L' above may be, for example, a $C_{6-18}$ arylene group. For example, the arylene group may be phenyl, biphenyl, naphthyl, terphenyl, etc.

The heterocyclic group in L' above may be, for example, a $C_{2-18}$ heterocyclic group. For example, the heterocyclic group may be pyridine, pyrimidine, benzofuran, benzothiophene, dioxin, dibenzofuran, dibenzothiophene, naphthobenzothiophene, naphthobenzofuran, etc.

The alkylene group in L' above may be, for example, a $C_{1-5}$ alkylene group. For example, the alkylene group may be a methylene group, an ethylene group, a t-butylene group, etc.

The alkoxyl group in L' above may be, for example, a $C_{1-5}$ alkoxyl group. For example, the alkoxyl group may be methoxy, t-butoxy, etc.

The alkylthio group in L' above may be, for example, a $C_{1-5}$ alkylthio group. For example, the alkylthio group may be a methylthio group, a t-butylthio group, etc.

In L' above, the arylene group, heterocyclic group, alkylene group, alkoxyl group, and alkylthio group may each be further substituted with one or more substituents selected from the group consisting of deuterium; a $C_{6-10}$ aryl group; a $C_{2-10}$ heterocyclic group; a $C_{3-10}$ cycloaliphatic group; and a $C_{1-10}$ alkyl group.

4) $R_a$ and $R_b$ are each independently selected from the group consisting of a $C_{6-60}$ aryl group; a fluorenyl group; a $C_{3-60}$ cycloaliphatic group; a $C_{2-60}$ heterocyclic group including at least one heteroatom selected from the group consisting of O, N, S, Si, and P; a $C_{1-50}$ alkyl group; and a combination thereof.

When $R_a$ and $R_b$ are each an aryl group, they may preferably be a $C_{6-30}$ aryl group, and more preferably a $C_{6-18}$ aryl group (e.g., phenyl, biphenyl, naphthyl, terphenyl, etc.).

When $R_a$ and $R_b$ are each a fluorenyl group, they may preferably be 9,9-dimethyl-9H-fluorene, 9,9-diphenyl-9H-fluorenyl group, 9,9'-spirobifluorene, etc.

When $R_a$ and $R_b$ are each a heterocyclic group, they may preferably be a $C_{2-30}$ heterocyclic group, more preferably a $C_{2-18}$ heterocyclic group (e.g., dibenzofuran, dibenzothiophene, naphthobenzothiophene, naphthobenzofuran, etc.).

When $R_a$ and $R_b$ are each an alkyl group, they may preferably be a $C_{1-10}$ alkyl group (e.g., methyl, t-butyl, etc.).

5) a is an integer from 0 to 5; in which when a is 2 or more, plural $R^2$ are the same or different from each other, and a plurality of neighboring $R^2$ may bind to each other to form a ring.

6) In $L^3$, L', $R^2$, $R_a$ 및 $R_b$ above, the arylene group, heterocyclic group, alkylene group, alkoxyl group, and alkylthio group may each be further substituted with one or more substituents selected from the group consisting of deuterium; a $C_{6-10}$ aryl group; a $C_{2-10}$ heterocyclic group; a $C_{3-10}$ cycloaliphatic group; and a $C_{1-10}$ alkyl group.

In another aspect, embodiments of the present disclosure may provide a photosensitive resin composition.

The photosensitive resin composition includes (A) a semiconductor nanoparticle-ligand composite, (B) a photocrosslinkable monomer, and (C) an initiator.

In describing the photosensitive resin composition according to the embodiments of the present disclosure, the matters relating to the nanoparticle-ligand composite are the same as those described regarding the semiconductor nanoparticle-ligand composite according to the above-described embodiments of the present disclosure, unless otherwise specified, and are thus omitted herein.

The photosensitive resin composition may include the semiconductor nanoparticle-ligand composite in an amount of 10 wt % to 60 wt % based on the total amount of the photosensitive resin composition. The lower limit of the content of the semiconductor nanoparticle-ligand composite may be 20 wt % or higher or 30 wt % or higher. The upper limit of the content of the semiconductor nanoparticle-ligand composite may be 60 wt % or less. When the photosensitive resin composition contains the semiconductor nanoparticle-ligand composite in the above content, it can have a viscosity suitable for coating and inkjetting while having a sufficient luminescent effect.

The photocrosslinkable monomer may be a monofunctional ester of (meth)acrylic acid having one ethylenically unsaturated double bond or a polyfunctional ester of (meth) acrylic acid having at least two ethylenically unsaturated double bonds. The polyfunctional ester may be, for example, a difunctional ester, a trifunctional ester, or a tetrafunctional ester.

In the present disclosure, as the photocrosslinkable monomer, one type of photocrosslinkable monomer or a combination of two or more types may be used.

The photocrosslinkable monomer, by having the ethylenically unsaturated double bond, can generate sufficient polymerization when exposed to light in the pattern forming process and thereby form a pattern having excellent heat resistance, light resistance, and chemical resistance.

Specific examples of the photocrosslinkable monomer include: as the monofunctional esters, ethylene glycol methacrylate, methyl methacrylate, ethyl methacrylate, isopropyl methacrylate, N-butyl methacrylate, t-butyl methacrylate, hexyl methacrylate, ethylhexyl methacrylate, lauryl methacrylate, octyl methacrylate, cyclohexyl methacrylate, benzyl methacrylate, tetracyclodecyl methacrylate, N-phenylmaleimide, N-cyclohexylmaleimide, methacrylic acid, isobornyl methacrylate, styrene, vinyl acetic acid, vinyl pyrrolidone, etc.; and as polyfunctional esters, ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, propylene glycol diacrylate, propylene glycol dimethacrylate, dipropylene glycol diacrylate, dipropylene glycol dimethacrylate, tripropylene glycol diacrylate, tripropylene glycol, dimethacrylate pentaerythritol triacrylate, dipentaerythritol pentaacrylate, dipentaerythritol hexaacrylate, bisphenol A epoxy acrylate, ethylene glycol monomethyl ether acrylate, trimethylolpropane triacrylate, etc., and multi-acrylates to which an ethyleneoxy group or γ- or ε-lactone chain is linked, but the monofunctional esters and polyfunctional esters of the photocrosslinkable monomer are not limited thereto.

Commercially available products of the photocrosslinkable monomer may be exemplified as follows.

Examples of the bifunctional ester of (meth)acrylic acid may include Aronix M-210, M-240, M-6200, etc. of Toagosei Kagaku Kogyo Co., Ltd.; KAYARAD HDDA, HX-220, R-604, etc. of Nihon Kayaku Co., Ltd., etc.; and V-260, V-312, V-335 HP, V-1000, V-802, etc. of Osaka Yuki Kagaku Kogyo Co., Ltd.

Examples of the trifunctional ester of (meth)acrylic acid may include Aronix M-309, M-400, M-405, M-450, M-7100, M-8030, M-8060, etc. of Toagosei Kagaku Kogyo Co., Ltd.; KAYARAD TMPTA, DPCA-20, DPCA-60, DPCA-120, etc. of Nihon Kayaku Co., Ltd., etc.; and V-295, V-300, V-360, etc. of Osaka Yuki Kagaku Kogyo Co., Ltd.

The photocrosslinkable monomer may be represented by the following Formula I.

[Formula I]

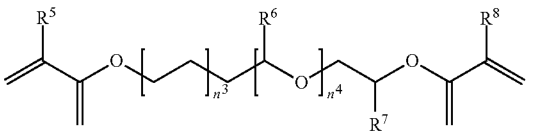

In Formula I above,

1) $R^5$ to $R^8$ are each independently hydrogen or a methyl group; and

2) $n^3$ and $n^4$ are each independently an integer of 1 to 15; wherein $n^3+n^4 \geq 1$.

Specifically, the compound represented by Formula I may be one of the following compounds M-1 to M-18, but is not limited thereto.

M-1

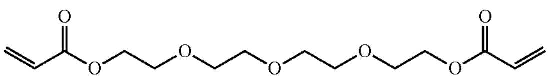

-continued

M-2

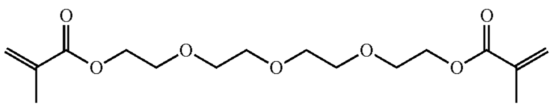

M-3

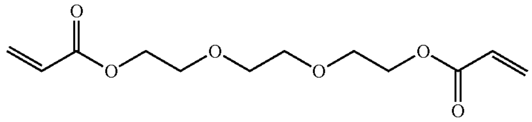

M-4

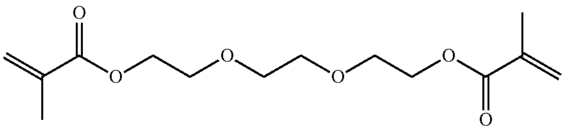

M-5

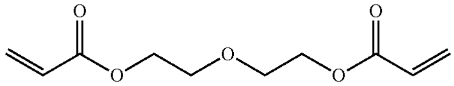

M-6

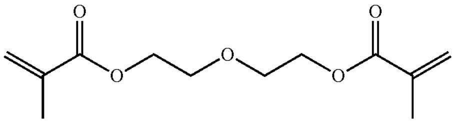

M-7

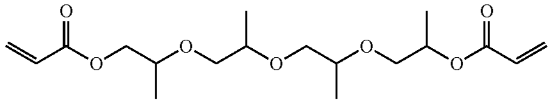

M-8

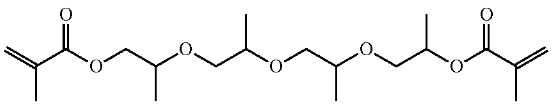

M-9

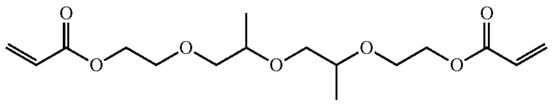

M-10

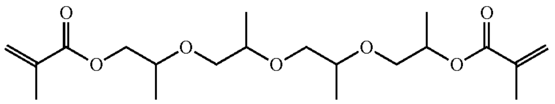

M-11

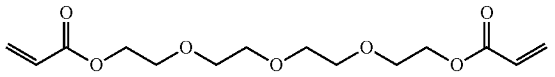

M-12

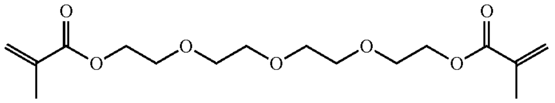

M-13

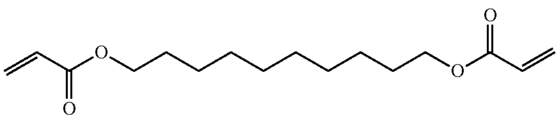

-continued

M-14

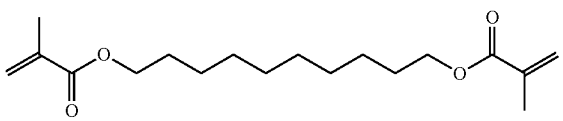

M-15

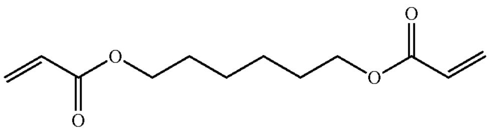

M-16

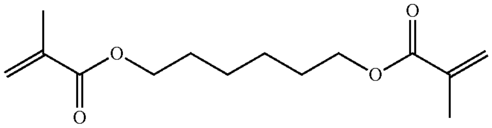

M-17

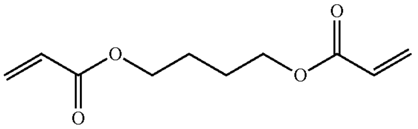

M-18

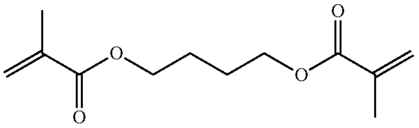

The photo-crosslinkable monomer may be used after treating with an acid anhydride so as to provide better developability. The photo-crosslinkable monomer may be included in an amount of 30 wt % to 90 wt % or 35 wt % to 85 wt % based on the total amount of the photosensitive resin composition. When the photo-crosslinkable monomer is included within the above range, the semiconductor nanoparticles and the initiator can be sufficiently added thereinto, thereby having a sufficient amount of light emission and exhibiting high reliability.

The photosensitive resin composition may further include a binder resin.

The binder resin may be one or more selected from the group consisting of an acrylic resin and an epoxy resin.

As the initiator, one or more selected from a photopolymerization initiator and a thermal polymerization initiator may be used.

As the initiator, one or more selected from a photopolymerization initiator and a thermal polymerization initiator may be used.

As the photopolymerization initiator, for example, one or more selected from an acetophenone-based compound, a benzophenone-based compound, a thioxanthone-based compound, a benzoin-based compound, an oxime ester-based compound, a phosphorus-based compound, and a triazine-based compound may be used.

Examples of the acetophenone-based compound may include 2,2'-diethoxy acetophenone, 2,2'-dibutoxy acetophenone, 2-hydroxy-2-methylpropiophenone, p-t-butyltrichloroacetophenone, p-t-butyldichloro acetophenone, 4-chloro acetophenone, 2,2'-dichloro-4-phenoxy acetophenone, 2-methyl-1-(4-(methylthio)phenyl)-2-morpholinopropane-1-one, 2-benzyl-2-dimethylamino-1-(4-morpholinophenyl)-butan-1-one, etc.

Examples of the benzophenone-based compound may include benzophenone, benzoyl benzoic acid, methyl benzoyl benzoate, 4-phenyl benzophenone, hydroxy benzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, etc.

Examples of the thioxanthone-based compound may include thioxanthone, 2-crolthioxanthone, 2-methylthioxanthone, isopropyl thioxanthone, 2,4-diethyl thioxanthone, 2,4-diiso propyl thioxanthone, 2-chlorthioxanthone, etc.

Examples of the benzoin-based compound may include benzoin, benzoin methyl ether, benzoin ethyl ether, benzoin isopropyl ether, benzoin isobutyl ether, benzyldimethyl ketal, etc.

Examples of the oxime ester compound may include 2-(o-benzoyloxime)-1-[4-(phenylthio)phenyl]-1,2-octane-dione, 1-(o-acetyloxime)-1-[9-ethyl-6-(2-methylbenzoyl)-9H-carbazol-3-yl]ethanone, O-ethoxycarbonyl-α-oxyamino-1-phenylpropan-1-one, 2-dimethylamino-2-(4-methylbenzyl)-1-(4-morpholin-4-yl-phenyl)-butan-1-one, 1-(4-phenylsulfanylphenyl)-butan-1,2-dione2-Oxime-O-benzoate, 1-(4-phenylsulfanylphenyl)-octane-1,2-dione2-oxime-O-benzoate, 1-(4-phenylsulfanylphenyl)-octan-1-oneoxime-O-acetate 1-(4-phenylsulfanylphenyl)-butan-1-oneoxime-O-acetate, 1-(4-methylsulfanyl-phenyl)-butan-1-oneoxime-O-acetate, hydroxyimino-(4-methylsulfanyl-phenyl)-acetic acid ethyl ester-O-acetate, hydroxyimino-(4-methylsulfanyl-phenyl)-acetic acid ethyl ester-O-benzoate, etc.

Examples of the phosphorus-based compound may include diphenyl (2,4,6-trimethylbenzoyl)phosphine oxide, benzyl(diphenyl)phosphine oxide, diphenyl(2,4,6-trimethylbenzoyl)phosphine oxide, etc.

Examples of the triazine-based compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine; 2-(p-methoxyphenyl)-4,6-bis(trichloromethyl)-s-triazine, 2-(p-tolyl)-4,6-bis(trichloromethyl)-s-triazine, 2-biphenyl 4,6-bis(trichloromethyl)-s-triazine, bis(trichloromethyl)-6-styryl-s-triazine, 2-(naphthol-yl)-4,6-bis(trichloromethyl)-s-triazine, 2-(4-methoxynaphtho-1-yl)-4,6-bis(trichloromethyl)-s-triazine, 2-4-trichloromethyl(piperonyl)-6-triazine, 2-4-trichloromethyl(4'-methoxystyryl)-6-triazine, etc.

As the photopolymerization initiator, a carbazole-based compound, a diketone-based compound, a sulfonium borate-based compound, a diazo-based compound, an imidazole-based compound, a biimidazole-based compound, etc. may be used in addition to the compounds described above.

As the thermal polymerization initiator, a peroxide-based compound, an azobis-based compound, etc. may be used.

Examples of the peroxide-based compound may include ketone peroxides (e.g., methyl ethyl ketone peroxide, methyl isobutyl ketone peroxide, cyclohexanone peroxide, methylcyclohexanone peroxide, acetylacetone peroxide, etc.); diacyl peroxides (e.g., isobutyryl peroxide, 2,4-dichlorobenzoyl peroxide, o-methylbenzoyl peroxide, bis-3,5,5-trimethylhexanoyl peroxide, etc.); hydroperoxides (e.g., 2,4, 4, -trimethylpentyl-2-hydroperoxide, diisopropylbenzenehydroperoxide, cumene hydroperoxide, t-butylhydroperoxide, etc.); dialkyl peroxides (e.g., dicumyl peroxide, 2,5-dimethyl-2,5-di(t-butylperoxy)hexane, 1,3-bis (t-butyloxyisopropyl)benzene, t-butylperoxyvalerate n-butyl ester, etc.); alkyl peresters (e.g., 2,4,4-trimethylpentyl peroxyphenoxyacetate, α-cumyl peroxyneodecanoate, t-butyl peroxybenzoate, di-t-butyl peroxytrimethyl adipate, etc.); percarbonates (e.g., di-3-methoxybutyl peroxydicarbonate, di-2-ethylhexyl peroxydicarbonate, bis-4-t-butylcyclohexyl peroxydicarbonate, diisopropyl peroxydicarbonate, acetylcyclohexylsulfonyl peroxide, t-butyl peroxyaryl carbonate, etc.).

Examples of the azobis-based compound may include 1,1'-azobiscyclohexan-1-carbonitrile, 2,2'-azobis(2,4-dimethylvaleronitrile), 2,2, -azobis(methylisobutyrate), 2,2'-azobis(4-methoxy-2,4-dimethylvaleronitrile), α,α'-azobis (isobutylnitrile), 4,4'-azobis(4-cyanovaleic acid), etc.

The initiator may be used together with a photosensitizer that causes a chemical reaction by absorbing light to enter an excited state and then transferring the energy.

Examples of the photosensitizer may include tetraethylene glycol bis-3-mercaptopropionate, pentaerythritol tetrakis-3-mercaptopropionate, dipentaerythritol tetrakis-3-mercaptopropionate, etc.

The content of the initiator may be in an amount of 0.1 wt % to 10 wt % or 0.1 wt % to 8 wt % based on the total amount of the photosensitive resin composition. When the content of the initiator satisfies the above range, curing occurs sufficiently during exposure or heating in the pattern forming process using the photosensitive resin composition and thus can obtain excellent reliability, and has excellent heat resistance, light resistance, and chemical resistance of the pattern, and also has excellent resolution and adhesion, and additionally, it can prevent a decrease in transmittance due to unreacted initiators.

The photosensitive resin composition may further include a light diffusing agent, for example, the light diffusion agent may include barium sulfate, calcium carbonate, titanium dioxide, zirconia, or a combination thereof.

In this case, the content of the light diffusion agent may be in an amount of 0.1 wt % to 10 wt % or 0.1 wt % to 8 wt % based on the total amount of the photosensitive resin composition. When the content of the light-diffusing agent satisfies the above-described range, it may have a viscosity suitable for coating and inkjetting while having a sufficient light-diffusion effect.

In another aspect, according to embodiments of the present disclosure, it is possible to provide an optical film including a semiconductor nanoparticle-ligand composite.

In describing the optical film according to the embodiments of the present disclosure, the matters relating to the nanoparticle-ligand composite are the same as those described regarding the semiconductor nanoparticle-ligand composite according to the above-described embodiments of the present disclosure, unless otherwise specified, and are thus omitted herein.

The optical film may be, for example, a wavelength conversion film or a color filter that converts light of a specific wavelength into light of another specific wavelength. For example, the optical film according to embodiments of the present disclosure may be used as a color filter for converting a wavelength of light emitted from a backlight including a light emitting diode, but the optical film according to embodiments of the present disclosure is not limited to the color filter or the wavelength conversion film.

The optical film may be used, for example, as a layer that is positioned between the cathode and anode electrodes of an electroluminescent diode and emits light by electrons and holes arriving from the cathode and anode electrodes.

The optical film may be formed on the bare glass through spin coating, exposure, or heating process using a photosensitive resin composition. In this case, the spin coating, exposure, and heating process are merely an examples, and the optical film may be formed by any method capable of forming the film without being limited to the spin coating, exposure, and heating process.

In describing the optical film according to the embodiments of the present disclosure, the matters relating to the photosensitive resin composition are the same as those described regarding the photosensitive resin composition according to the above-described embodiments of the present disclosure, unless otherwise specified, and are thus omitted herein.

The thickness of the optical film may be 0.005 μm to 500 μm or 1 μm to 11 μm.

In another aspect, according to embodiments of the present disclosure, it is possible to provide an electroluminescent diode including an optical film. The electroluminescent diode may include, for example, a cathode electrode, an anode electrode, and an optical film positioned between the cathode electrode and the anode electrode. The electroluminescent diode may further include one or more among the functional layers consisting of a hole injection layer, a hole transport layer, an electron injection layer, an electron transport layer, etc.

In describing the electroluminescent diode according to the embodiments of the present disclosure, the matters relating to the optical film are the same as those described regarding the optical film according to the above-described embodiments of the present disclosure, unless otherwise specified, and are thus omitted herein.

Since the optical film according to the embodiments of the present disclosure is formed using a semiconductor nanoparticle-ligand composite having excellent compatibility, the electroluminescent diode may have excellent quantum efficiency.

In another aspect, embodiments of the present disclosure may provide an electronic device, which includes a display device including an optical film and a control unit for driving the display device.

In describing the electronic device according to the embodiments of the present disclosure, the matters relating to the optical film are the same as those described regarding the optical film according to the above-described embodiments of the present disclosure, unless otherwise specified, and are thus omitted herein.

In the electronic device, the optical film may be used as a wavelength conversion film or a color filter for converting the wavelength. Since the optical film according to the embodiments of the present disclosure is formed using a semiconductor nanoparticle-ligand composite having excellent compatibility, the electronic device according to the embodiments of the present disclosure may have excellent quantum efficiency In another aspect, embodiments of the present disclosure may provide an electronic device, which includes a display device including an electroluminescent diode and a control unit for driving the display device.

In describing the electronic device according to the embodiments of the present disclosure, the matters relating to the electroluminescent diode are the same as those described regarding the electroluminescent diode according to the above-described embodiments of the present disclosure, unless otherwise specified, and are thus omitted herein.

Hereinafter, Synthesis Examples of the compound and Preparation Examples of the electrical device according to the present disclosure will be described in detail with reference to examples, but the present disclosure is not limited to the following examples.

SYNTHESIS EXAMPLES

The semiconductor nanoparticle-ligand composite (final product) represented by Formula 1 above according to embodiments of the present disclosure may be synthesized by reacting Sub1 and Sub2 as shown in Reaction Scheme 1 below, but is not limited thereto.

<Reaction Scheme 1>

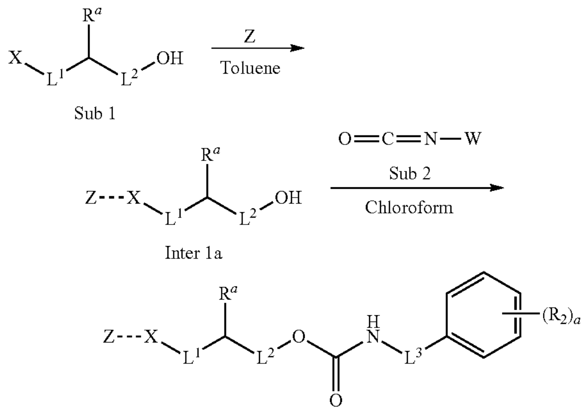

Sub 1
Inter 1a
Final product

Wherein:

the Z, X, $R^1$, and $L^1$ to $L^4$ are the same as defined in Formula 1,

Sub2 means the Formula 9 above, and

Z means the surface of the semiconductor nanoparticles.

I. Synthesis of Semiconductor Nanoparticles (Z)

1. Synthesis of Semiconductor Nanoparticles Z-1 (InZnP/ZnSeS)

0.1 g of indium acetate, 2.3 g of zinc acetate, 7.5 g of oleic acid, and 30 mL of 1-octadecene were added into a 100 mL three-necked round flask equipped with a reflux device, and maintained the pressure at about 0.1 torr using a vacuum pump for 1 hour while heating at 110° C. After removing the vacuum, $N_2$ gas was introduced into the flask and heated at 280° C. Tris(trimethylsilyl)phosphine (0.85 g) was added at once and the mixture was stirred for 10 minutes. After dissolving 0.35 g of selenium and 0.15 g of sulfur in 10 mL of trioctyl phosphine, it was added to the reactor and stirred for 30 minutes. After dissolving 0.15 g of sulfur in 4 mL of Trioctyl phosphine, the resultant was reintroduced into the reactor and stirred for 10 minutes. The temperature was lowered to 240° C., maintained thereat for 3 hours, cooled to room temperature, and 200 mL of ethanol was added thereto and the mixture was stirred for 5 minutes, and the precipitate was separated using a centrifuge to prepare semiconductor nanoparticles Z-1.

2. Synthesis of Semiconductor Nanoparticles Z-2 (CdZnSe/ZnSe/ZnS)

0.2 g of cadmium acetate (Sigma-Aldrich), 4 g of Zn acetate (Sigma-Aldrich), 40 mL of oleic acid (Sigma-Aldrich), and 90 mL of 1-octadecene (Sigma-Aldrich) were added into a 500 mL three-neck round-bottom reactor equipped with a reflux device. Then, the temperature was raised to 110° C., and the pressure was maintained at 0.1 torr for 1 hour using a vacuum pump. Thereafter, the inside of the reactor was changed to a $N_2$ atmosphere, and the temperature was raised to 290° C. After dissolving 1.3 g of selenium (Sigma-Aldrich) and 0.3 g of sulfur (Sigma-Aldrich) in 12 mL of trioctylphosphine (Sigma-Aldrich), the resultant was added into the reactor at once, and maintained therein for 20 minutes. 3.2 g of Zn acetate and 11 g of oleic acid and 50 mL of 1-octadecene were added into a 100 mL three-necked round-bottom reactor equipped with a reflux device, and the temperature was raised to 110° C., and the pressure was maintained at 0.1 torr for 1 hour using a vacuum pump, and this solution was added to the 500 mL reactor at once and maintained thereat for 20 minutes. After cooling the reactor to room temperature, 200 mL of ethanol (Sigma-Aldrich) was added to the reaction solution, and then semiconductor nanoparticles, Z-2, were prepared using a centrifuge.

II. Synthesis of Sub 1

Sub1 of Reaction Scheme 1 above is synthesized by the reaction route of Reaction Scheme 2-1 or Scheme 2-6, but is not limited thereto. $Hal^1$ is I, Br, or Cl.

<Reaction Scheme 2-1>

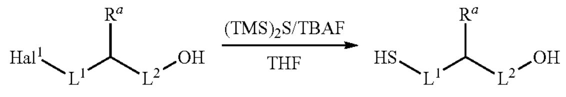

Sub 1a

<Reaction Scheme 2-2>

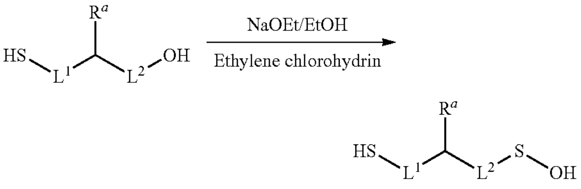

Sub 1b

<Reaction Scheme 2-3>

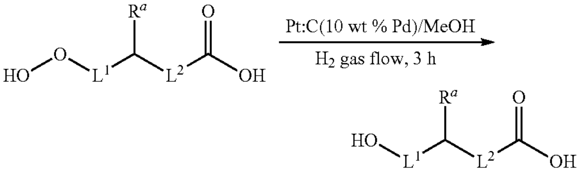

Sub 1c

<Reaction Scheme 2-4>

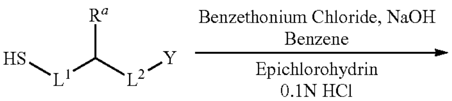

-continued

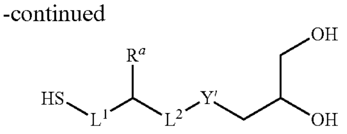

Sub 1d

Y is —OH or —SH; and Y' is O or S.

<Reaction Scheme 2-3>

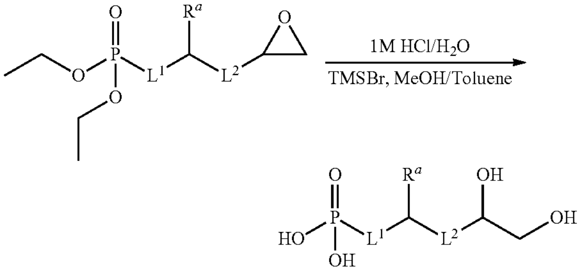

Sub 1e

<Reaction Scheme 2-6>

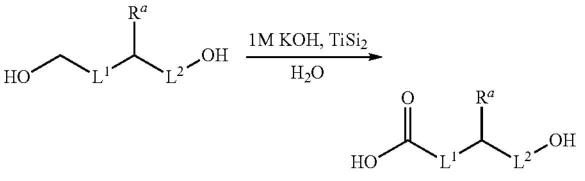

Sub 1f

1. Synthesis Example of Sub 1-1-1

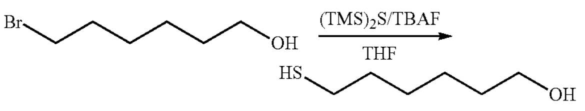

Sub1-1

After dissolving 6-bromo-1-hexanol (20.0 g, 111 mmol) in THF (221 mL), the mixture was stirred at −10° C. Then, $(TMS)_2$ S (23.7 g, 133 mmol) and a 1 M TBAF solution in THF (122 mL) were added thereto, and the mixture was stirred at room temperature for 30 minutes. Upon completion of the reaction, the resultant was subjected to extraction with $CH_2Cl_2$ and an aqueous solution of $NH_4Cl$, and the organic layer was dried over MgSO4 and concentrated. Then, the resulting compound was passed through a silica gel column to obtain 12.8 g of a product (yield: 86%).

2. Synthesis Example of Sub 1-7

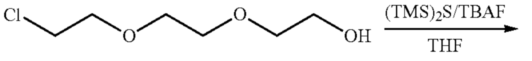

-continued

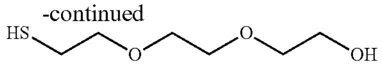

Sub1-7

2-[2-(2-Chloroethoxy)ethoxy]ethanol (20.0 g, 119 mmol), $(TMS)_2S$ (25.4 g, 142 mmol), and a 1 M TBAF solution in THF (131 mL) were synthesized according to the synthesis method of Sub1-1 to obtain 16.0 g of the product (yield: 81%).

3. Synthesis Example of Sub 1-16

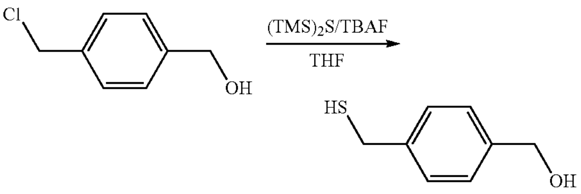

Sub1-16

4-(Chloromethyl)benzyl alcohol (20.0 g, 128 mmol), $(TMS)_2S$ (27.3 g, 153 mmol), and a 1 M TBAF solution in THF (141 mL) were synthesized according to the synthesis method of Sub1-1 above to obtain 14.2 g of the product (yield: 72%).

4. Synthesis Example of Sub 1-29

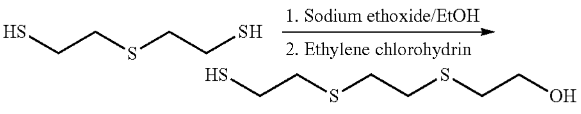

Sub1-29

After dissolving 2,2'-thiodiethanethiol (20.0 g, 130 mmol) and EtOH (90 mL), a solution of sodium ethoxide (8.8 g, 130 mmol) was added while introducing nitrogen thereinto. Then, ethylene chlorohydrin (17.4 g, 217 mmol) was added and stirred at room temperature for 4 hours, extracted with ether/water to remove sodium chloride, and then subjected to distillation under reduced pressure to obtain 18.1 g of the product (yield: 70%).

5. Synthesis Example of Sub 1-33

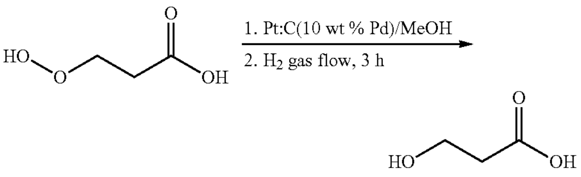

Sub1-33

After transferring 3-(hydroperoxy)propanoic acid (20.0 g, 188 mmol), MeOH (200 mL), and Pd/C (10 wt % Pd, 0.20 g) to a flask, $H_2$ gas was filled thereinto for 3 hours. Then, after mixing for 40 minutes, the resultant was subjected to filtration using a filter funnel and Celite. After the filtration, MeOH (200 mL) was added thereto, followed by filtration under reduced pressure to obtain 17.0 g of the product (yield: 100%).

6. Synthesis Example of Sub 1-44

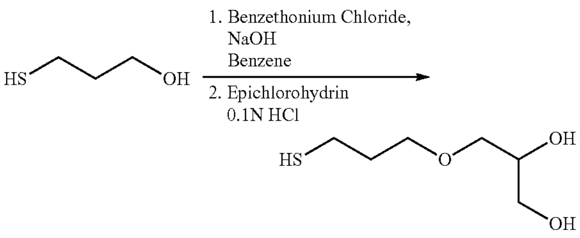

Sub1-44

1) 3-Mercapto-1-propanol (20.0 g, 217 mmol), benzethonium chloride (5.8 g, 12.9 mmol), NaOH (15.5 g, 387 mmol), and benzene (29.4 mL) were added into a round-bottom flask, and stirred at 30° C.

2) Epichlorohydrin (36.1 g, 412 mmol) was added dropwise to the solution for 30 minutes, and after cooling the solution to room temperature, 25.8 mL of 0.1 N hydrochloric acid was added thereto to obtain 27.1 g of the product (yield: 75%).

7. Synthesis Example of Sub1-53

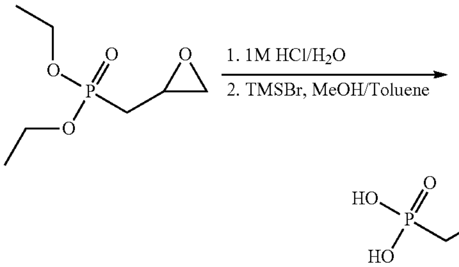

Sub 1-53

1) Diethyl oxiran-2-ylmethylphosphonate (20.0 g, 103 mmol) and $H_2O$ (110 mL) were added into a 500 mL flask, 1 M HCl (10 mL) was added thereto. Then, the mixture was stirred for 4 hours and $H_2O$ was removed at room temperature under vacuum. The product washed with $H_2O$ (80 mL) was added into a round bottom flask.

2) TMSBr (32 mL, 210 mmol), MeOH (1.1 mL), and toluene (109 mL) were added into the round-bottom flask, stirred overnight, and was subjected to a reduced pressure at 55° C. for 1 hour and 30 minutes to obtain the 13.0 g of the product (yield: 81%).

8. Synthesis Example of Sub 1-61

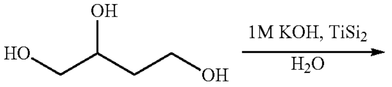

-continued

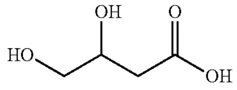

Sub 1-61

Glycerol (20.0 g, 832 mmol), 1 M KOH (200 mL), and $TiSi_2$ (1 wt %, 2 g) were added into a round bottom flask and stirred under air atmosphere for 12 hours. Then, after performing centrifugation by adding 12 N HCl thereto, excess $H_2O$ was removed through distillation under reduced pressure, followed by filtration using a membrane filter to obtain 25.5 g of the product (yield: 98%)

Meanwhile, the compound belonging to Sub1 may be compounds as follows, but is not limited thereto.

Sub1-1

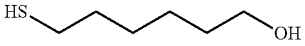

Sub1-2

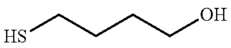

Sub1-3

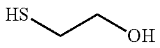

Sub1-4

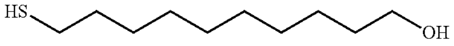

Sub1-5

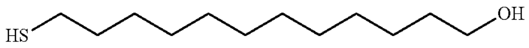

Sub1-6

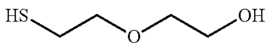

Sub1-7

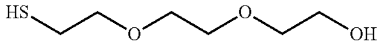

Sub1-8

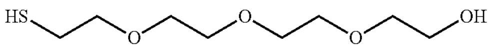

Sub1-9

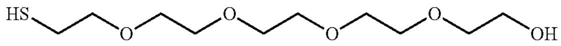

Sub1-10

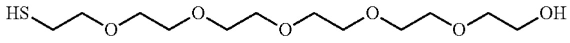

Sub1-11

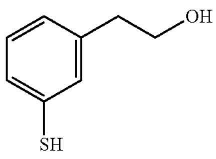

Sub1-12

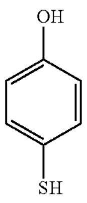

Sub1-13

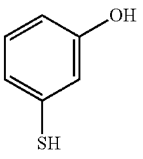

-continued
Sub1-14
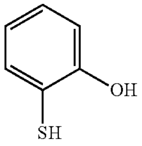
Sub1-15
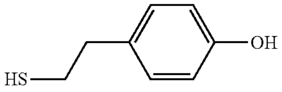
Sub1-16
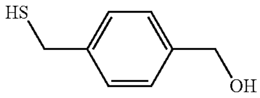
Sub1-17
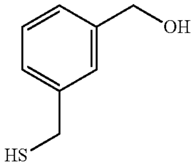
Sub1-18
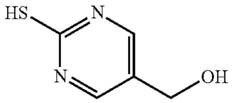
Sub1-19
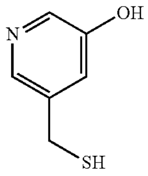
Sub1-20
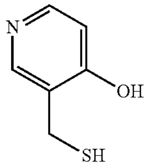
Sub1-21
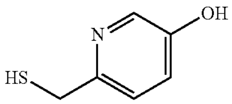
Sub1-22
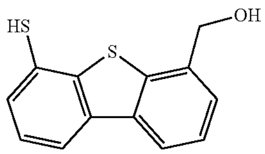
Sub1-23
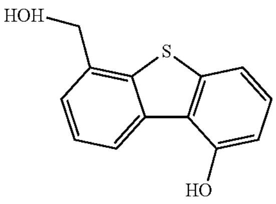
-continued
Sub1-24
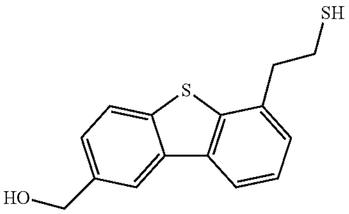
Sub1-25
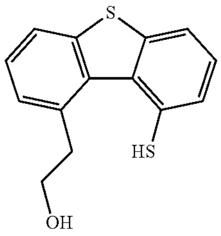
Sub1-26
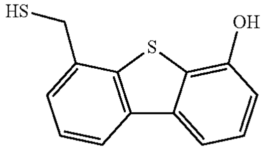
Sub1-27
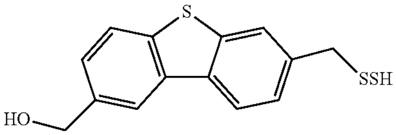
Sub1-28
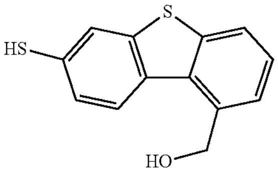
Sub1-29
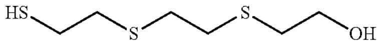
Sub1-30
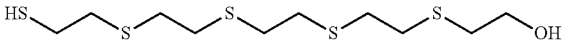
Sub1-31
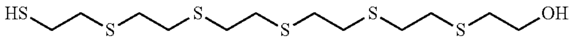
Sub1-32
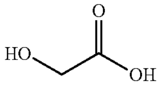
Sub1-33
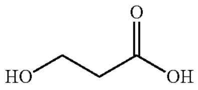
Sub1-34
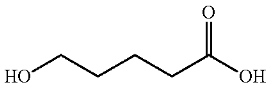
Sub1-35
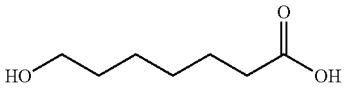

-continued
Sub1-36
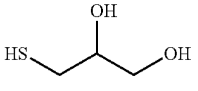
Sub1-37
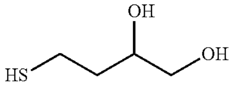
Sub1-38
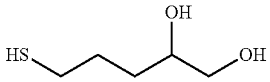
Sub1-39
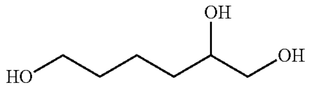
Sub1-40
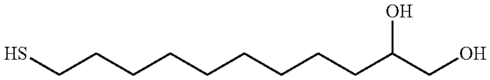
Sub1-41
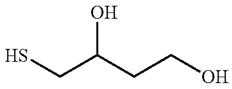
Sub1-42
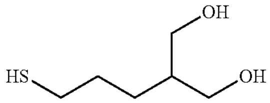
Sub1-43
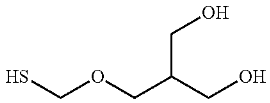
Sub1-44
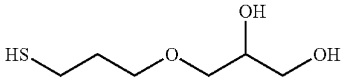
Sub1-45
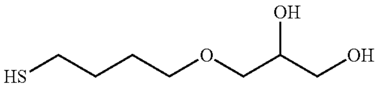
Sub1-46
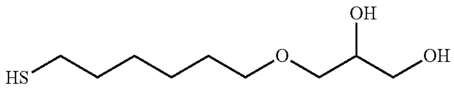
Sub1-47
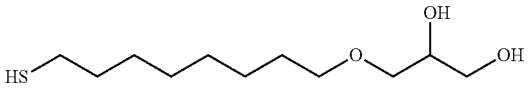
Sub1-48
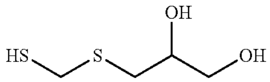
Sub1-49
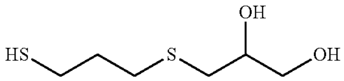
Sub1-50
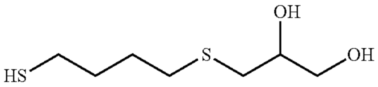
-continued
Sub1-51
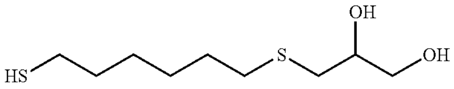
Sub1-52
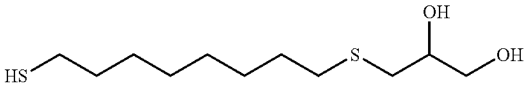
Sub1-53
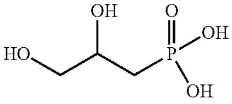
Sub1-54
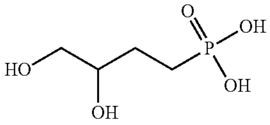
Sub1-55
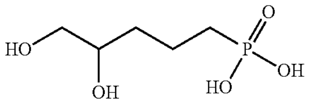
Sub1-56
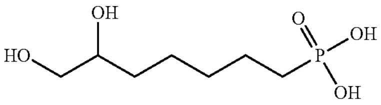
Sub1-57
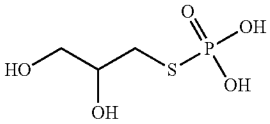
Sub1-58
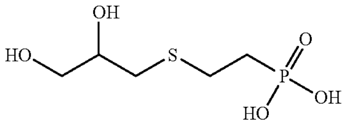
Sub1-59
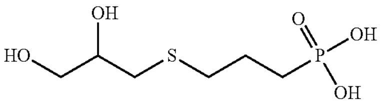
Sub1-60
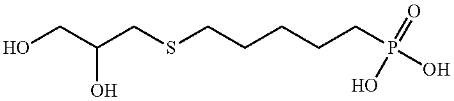
Sub1-61
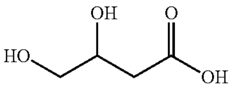
Sub1-62
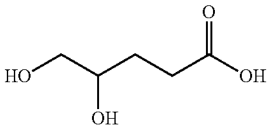
Sub1-63
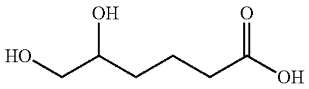

-continued

Sub1-64

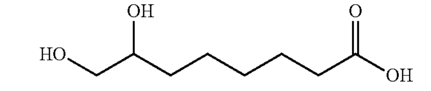

Sub1-65

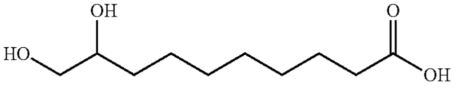

Table 1 below shows Field Desorption-Mass Spectrometry (FD-MS) values of compounds belonging to Sub 1.

TABLE 1

| Compound | FD-MS | Compound | FD-MS |
|---|---|---|---|
| Sub 1-1 | m/z = 134.08($C_6H_{14}OS$ = 134.24) | Sub 1-2 | m/z = 106.05($C_4H_{10}OS$ = 106.18) |
| Sub 1-3 | m/z = 78.01($C_2H_6OS$ = 78.13) | Sub 1-4 | m/z = 190.14($C_{10}H_{22}OS$ = 190.35) |
| Sub 1-5 | m/z = 218.17($C_{12}H_{26}OS$ = 218.4) | Sub 1-6 | m/z = 122.04($C_4H_{10}O_2S$ = 122.18) |
| Sub 1-7 | m/z = 166.07($C_6H_{14}O_3S$ = 166.24) | Sub 1-8 | m/z = 210.09$C_8H_{18}O_4S$ = 210.29) |
| Sub 1-9 | m/z = 254.12($C_{10}H_{22}O_5S$ = 254.34) | Sub 1-10 | m/z = 298.15($C_{12}H_{26}O_6S$ = 298.39) |
| Sub 1-11 | m/z = 154.05($C_8H_{10}OS$ = 154.23) | Sub 1-12 | m/z = 140.03($C_7H_8OS$ = 140.2) |
| Sub 1-13 | m/z = 140.03($C_7H_8OS$ = 140.2) | Sub 1-14 | m/z = 140.03($C_7H_8OS$ = 140.2) |
| Sub 1-15 | m/z = 154.05($C_8H_{10}OS$ = 154.23) | Sub 1-16 | m/z = 154.05($C_8H_{10}OS$ = 154.23) |
| Sub 1-17 | m/z = 154.05($C_8H_{10}OS$ = 154.23) | Sub 1-18 | m/z = 142.02($C_5H_6N_2OS$ = 142.18) |
| Sub 1-19 | m/z = 141.02($C_6H_7NOS$ = 141.19) | Sub 1-20 | m/z = 141.02($C_6H_7NOS$ = 141.19) |
| Sub 1-21 | m/z = 141.02($C_6H_7NOS$ = 141.19) | Sub 1-22 | m/z = 246.02($C_{13}H_{10}OS_2$ = 246.34) |
| Sub 1-23 | m/z = 246.02($C_{13}H_{10}OS_2$ = 246.34) | Sub 1-24 | m/z = 274.05($C_{15}H_{14}OS_2$ = 274.40) |
| Sub 1-25 | m/z = 260.03($C_{14}H_{12}OS_2$ = 260.37) | Sub 1-26 | m/z = 230.04($C_{13}H_{10}O_2S$ = 230.28) |
| Sub 1-27 | m/z = 244.06($C_{14}H_{12}O_2S$ = 244.31) | Sub 1-28 | m/z = 230.04($C_{13}H_{10}O_2S$ = 230.28) |
| Sub 1-29 | m/z = 198.02($C_6H_{14}OS_3$ = 198.36) | Sub 1-30 | m/z = 318.03($C_{10}H_{22}OS_5$ = 318.59) |
| Sub 1-31 | m/z = 378.03($C_{12}H_{22}OS_6$ = 378.70) | Sub 1-32 | m/z = 76.02($C_2H_4O_3$ = 76.02) |
| Sub 1-33 | m/z = 90.03($C_3H_6O_3$ = 90.08) | Sub 1-34 | m/z = 118.13($C_5H_{10}O_3$ = 118.06) |
| Sub 1-35 | m/z = 146.19($C_7H_{14}O_3$ = 146.09) | Sub 1-36 | m/z = 108.02($C_3H_8O_2S$ = 108.16) |
| Sub 1-37 | m/z = 122.04($C_4H_{10}O_2S$ = 122.18) | Sub 1-38 | m/z = 136.06($C_5H_{12}O_2S$ = 136.21) |
| Sub 1-39 | m/z = 150.07($C_6H_{14}O_2S$ = 150.24) | Sub 1-40 | m/z = 220.15($C_{11}H_{24}O_2S$ = 220.37) |
| Sub 1-41 | m/z = 122.04($C_4H_{10}O_2S$ = 122.18) | Sub 1-42 | m/z = 150.07($C_6H_{14}O_2S$ = 150.24) |
| Sub 1-43 | m/z = 138.04($C_4H_{10}O_3S$ = 138.18) | Sub 1-44 | m/z = 166.07($C_sH_{14}O_3S$ = 166.24) |
| Sub 1-45 | m/z = 180.08($C_7H_{16}O_3S$ = 180.26) | Sub 1-46 | m/z = 208.11($C_9H_{20}O_3S$ = 208.32) |
| Sub 1-47 | m/z = 236.06($C_{11}H_{23}O_3S$ = 236.37) | Sub 1-48 | m/z = 154.01($C_4H_{10}O_2S_2$ = 154.24) |
| Sub 1-49 | m/z = 182.04($C_6H_{14}O_2S_2$ = 182.30) | Sub 1-50 | m/z = 196.06($C_7H_{16}O_2S_2$ = 154.24) |
| Sub 1-51 | m/z = 224.09($C_9H_{20}O_2S_2$ = 224.38) | Sub 1-52 | m/z = 252.12($C_{11}H_{24}O_2S_2$ = 252.43) |
| Sub 1-53 | m/z = 170.03($C_4H_{11}O_5P$ = 170.10) | Sub 1-54 | m/z = 156.02($C_3H_9O_5P$ = 156.07) |
| Sub 1-54 | m/z = 184.05($C_5H_{13}O_5P$ = 184.13) | Sub 1-56 | m/z = 212.18($C_7H_{17}O_5P$ = 212.08) |
| Sub 1-56 | m/z = 188.13($C_8H_9O_5PS$ = 187.99) | Sub 1-58 | m/z = 216.19($C_5H_{13}O_5PS$ = 216.02) |
| Sub 1-59 | m/z = 230.21($C_6H_{15}O_5PS$ = 230.04) | Sub 1-60 | m/z = 258.27($C_8H_{19}O_5PS$ = 258.27) |
| Sub 1-61 | m/z = 120.10($C_4H_8O_4$ = 120.04) | Sub 1-62 | m/z = 134.13($C_5H_{10}O_4$ = 134.06) |
| Sub 1-63 | m/z = 148.16($C_6H_{12}O_4$ = 148.07) | Sub 1-64 | m/z = 176.21($C_8H_{16}O_4$ = 176.10) |
| Sub 1-65 | m/z = 204.14($C_{10}H_{20}O_4$ = 204.14) | | |

III. Synthesis of Sub 2

The Sub 2 of Reaction Scheme 1 may be synthesized by the reaction route presented in Trivedi P., et al. *Eur J Pharm Sci.* 2019 and Liu D., et al. Bioorg. Med. Chem. 2013, but is not limited thereto.

1. Synthesis Example of Sub 2-1

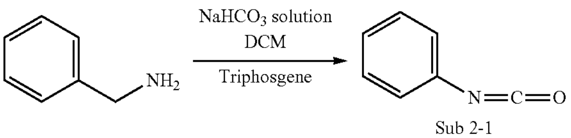 [SMILES: NCc1ccccc1 ; O=C=Nc1ccccc1]

Sub 2-1

After dissolving benzylamine (3 g, 28 mmol) in DCM (20 mL), a $NaHCO_3$ solution (1 mL) was added thereto and the mixture was stirred at 0° C. After adding a 1.7 M triphosgene solution (1 mL, in DCM) thereto, the mixture was stirred for 1 hour, and the resultant was subjected to a filter funnel and Celite to obtain a 3.3 g of the final product (yield: 100%).

2. Synthesis Example of Sub 2-6

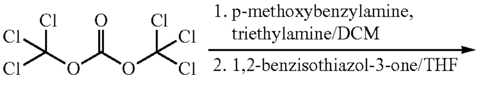

-continued

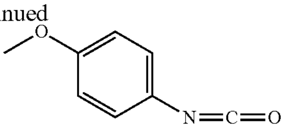

Sub-2-6

After dissolving triphosgene (3 g, 10 mmol) in DCM (20 mL), a primary amine solution (p-methoxybenzylamine/DCM=(10 mmol/20 mL) was added thereto, and then a secondary amine solution (triethylamine/DCM=3 mL/10 mL) was further added thereto. Then, after removing the solvent through a distillation method, DCM (20 mL), 1,2-benzisothiazol-3-one (1.5 g, 10 mmol), and THF (20 mL) were added thereto and refluxed for 30 minutes, and the solvent was removed through a distillation method. The residue was dispersed in acetone (30 mL), an equal amount of $H_2O$ was added thereto, and the mixture was filtered under reduced pressure a total of 2 times to obtain 1.46 g of the final product (yield: 98%).

Meanwhile, the compound belonging to Sub 2 may be compounds as follows, but is not limited thereto.
Sub2-1
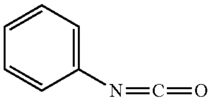
Sub2-2
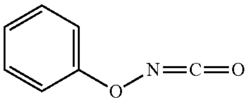
Sub2-3
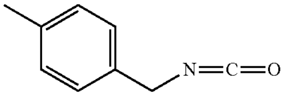
Sub2-4
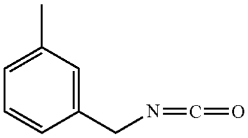
Sub2-5
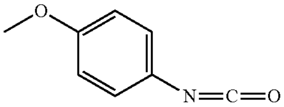
Sub2-6
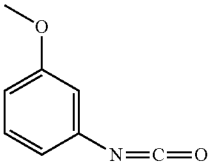
Sub2-7
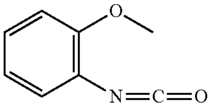
Sub2-8
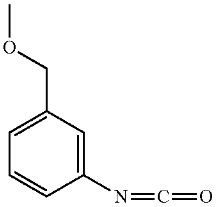
Sub2-9
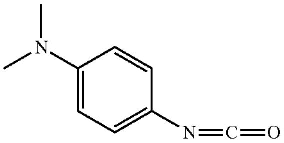
Sub2-10
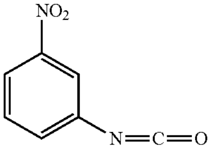
-continued
Sub2-11
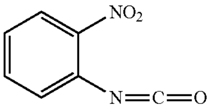
Sub2-12
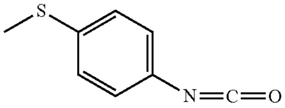
Sub 2-13
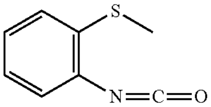
Sub 2-14
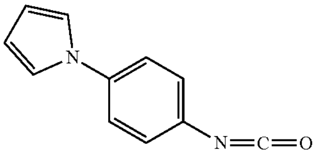
Sub 2-15
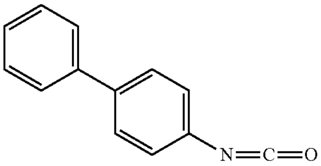
Sub 2-16
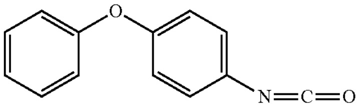
Sub 2-17
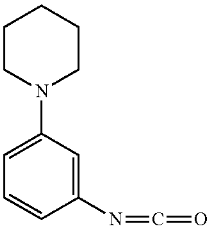
Sub 2-18
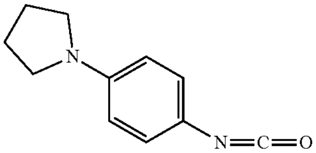
Sub 2-19
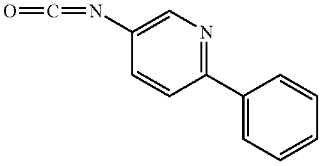

-continued
Sub 2-20
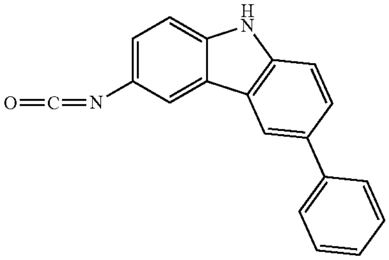
Sub 2-21
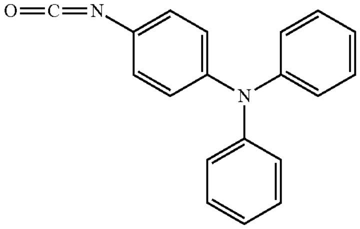
Sub 2-22
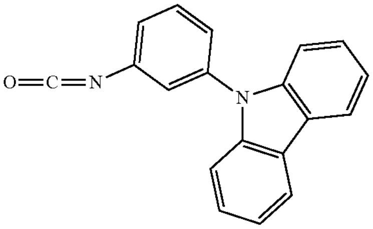
Sub 2-23
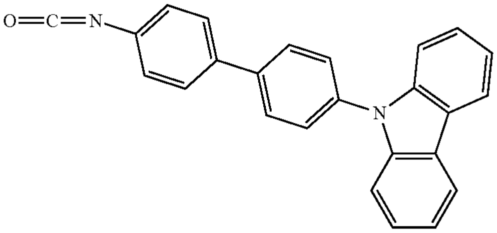
Sub 2-24
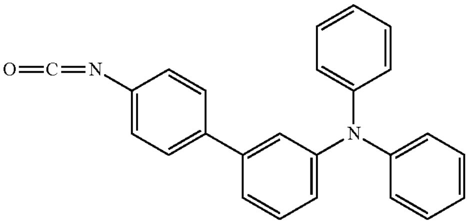
Sub 2-25
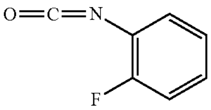
Sub 2-26
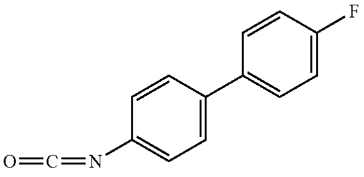
-continued
Sub 2-27
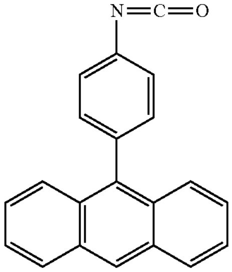
Sub 2-28
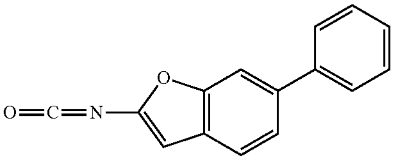
Sub 2-29
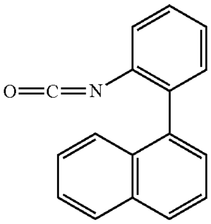
Sub 2-30
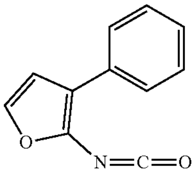
Sub 2-31
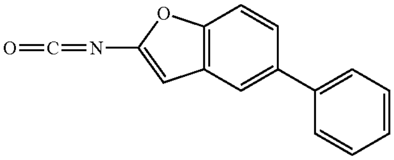
Sub 2-32
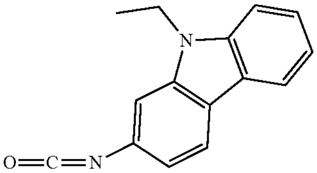
Sub 2-33
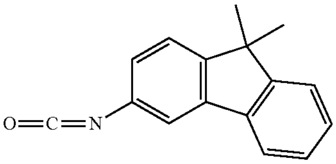
Sub 2-34
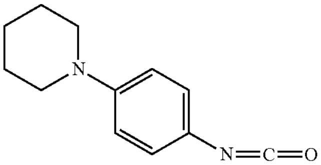
Table 2 below shows Field Desorption-Mass Spectrometry (FD-MS) values of compounds belonging to Sub 2.

TABLE 2

| Compound | FD-MS | Compound | FD-MS |
|---|---|---|---|
| Sub 2-1 | m/z = 119.04($C_7H_5NO$ = 119.12) | Sub 2-2 | m/z = 135.03($C_7H_5NO_2$ = 135.12) |
| Sub 2-3 | m/z = 147.07($C_9H_9NO$ = 147.18) | Sub 2-4 | m/z = 147.07($C_9H_9NO$ = 147.18) |
| Sub 2-5 | m/z = 149.05($C_8H_7NO_2$ = 149.15) | Sub 2-6 | m/z = 149.05($C_8H_7NO_2$ = 149.15) |
| Sub 2-7 | m/z = 149.05($C_8H_7NO_2$ = 149.15) | Sub 2-8 | m/z = 163.06($C_9H_9NO_2$ = 163.18) |
| Sub 2-9 | m/z = 162.08($C_9H_{10}N_2O$ = 162.19) | Sub 2-10 | m/z = 164.02($C_7H_4N_2O_3$ = 164.12) |
| Sub 2-11 | m/z = 164.02($C_7H_4N_2O$ = 164.12) | Sub 2-12 | m/z = 165.02($C_8H_7NOS$ = 165.21) |
| Sub 2-13 | m/z = 165.02($C_8H_7NOS$ = 165.21) | Sub 2-14 | m/z = 184.06($C_{11}H_8N_2O$ = 184.20 |
| Sub 2-15 | m/z = 195.07($C_{13}H_9NO$ = 195.22) | Sub 2-16 | m/z = 211.06($C_{13}H_9NO_2$ = 211.22) |
| Sub 2-17 | m/z = 202.11($C_{12}H_{14}N_2O$ = 202.26) | Sub 2-18 | m/z = 188.09($C_{11}H_{12}N_2O$ = 188.23) |
| Sub 2-19 | m/z = 196.06($C_{12}H_8NO_2$ = 196.21) | Sub 2-20 | m/z = 284.09($C_{19}H_{12}N_2O$ = 284.23) |
| Sub 2-21 | m/z = 286.11($C_{19}H_{14}N_2O$ = 286.33) | Sub 2-22 | m/z = 284.09($C_{19}H_{12}N_2O$ = 284.32) |
| Sub 2-23 | m/z = 360.13($C_{25}H_{16}N_2O$ = 360.42) | Sub 2-24 | m/z = 362.14($C_{25}H_{18}N_2O$ = 360.43) |
| Sub 2-25 | m/z = 137.03($C_7H_4FNO$ = 137.11) | Sub 2-26 | m/z = 213.06($C_{13}B_8FNO$ = 213.21) |
| Sub 2-27 | m/z = 295.10($C_{21}H_{13}NO$ = 295.34) | Sub 2-28 | m/z = 235.06($C1_5H_9NO_2$ = 235.24) |
| Sub 2-29 | m/z = 245.08($C_{17}H_{11}NO$ = 245.28) | Sub 2-30 | m/z = 185.05($C_{11}H_7NO_2$ = 185.18) |
| Sub 2-31 | m/z = 235.06($C_{15}H_9NO_2$ = 235.24) | Sub 2-32 | m/z = 236.09($C_{15}H_{12}N_2O$ = 236.27) |
| Sub 2-33 | m/z = 235.10($C_{16}H_{13}NO$ = 235.29) | Sub 2-34 | m/z = 202.11($C_{12}H_{14}N_2O$ = 202.26) |

IV. Synthesis of Final Product

1. Synthesis Example of P-1

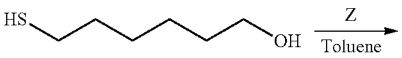

Subl-1

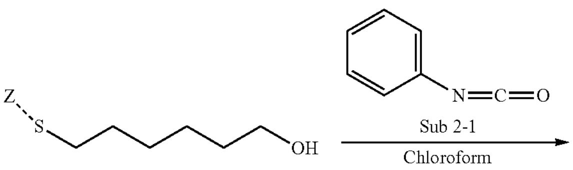

Interl-1

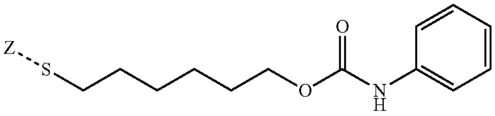

P-1

(1) Exemplary Synthesis of Inter 1-1

After dissolving the inorganic nanoparticulate structure Z-1 (3 g) obtained in the above synthesis in 60 mL of toluene, the temperature was raised to 150° C., and Sub 1-1 (6 g, 45 mmol) was added thereto, and the mixture was stirred for 2 hours. After adding 200 mL of toluene to the reaction solution, the mixture was stirred for 5 minutes, and the precipitate was centrifuged to obtain 2.94 g of Inter 1-1 (yield: 98%).

(2) Exemplary Synthesis of P-1

Inter 1-1 (1 g) obtained in the above synthesis was dissolved in 10 mL of chloroform, and Sub2-1 (1.8 g, Aldrich, isocyanatobenzene) was added thereto and stirred for 2 hours. Then, hexane was added to the solution and centrifuged to obtain 0.96 g of the product (yield: 96%). The progress of the reaction was confirmed by measuring $^1$H-NMR (JEOL Co., Ltd.) and checking the appearance of three peaks in the region of 7 ppm to 7.5 ppm.

2. Synthesis Example of P-4

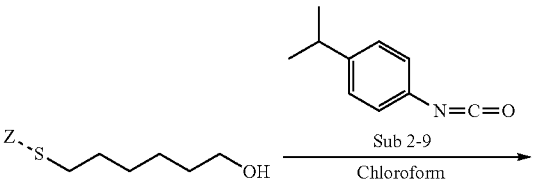

Interl-1

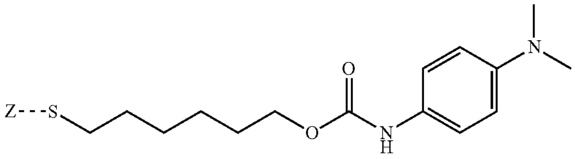

P-4

Inter 1-1 (1 g) and Sub 2-9 (2.4 g, Aldrich, 4-isocyanato-N,N-dimethylaniline) obtained in the above synthesis were synthesized according to the synthesis method of P-1, and 0.98 g of the product (yield: 98%) was obtained. The progress of the reaction was confirmed by measuring $^1$H-NMR (JEOL Co., Ltd.) and checking the appearance of two peaks in the region of 7 ppm to 7.5 ppm.

3. Synthesis Example of P-10

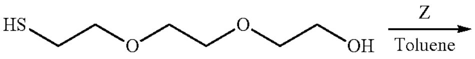

Subl-7

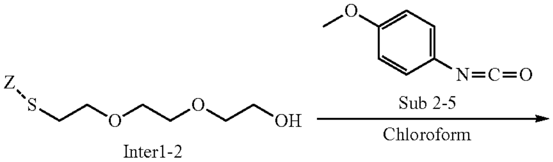

Interl-2

-continued

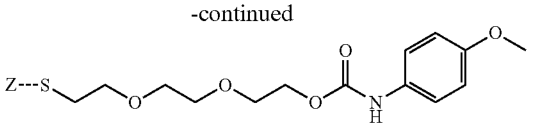

P-10

(1) Exemplary Synthesis of Inter 1-2

The inorganic nanoparticulate structures Z-1 (3 g) and Sub 1-7 (7.5 g) obtained in the above synthesis were synthesized according to the above synthesis method of Inter 1-1 to obtain 2.88 g (yield: 96%) of Inter 1-2.

(2) Exemplary Synthesis of P-10

Inter 1-2 (1 g) and Sub 2-5 (2.2 g, Aldrich, 1-isocyanato-4-methoxybenzene) obtained in the above synthesis were synthesized according to the synthesis method of P-1, and 0.99 g of the product (yield: 99%) was obtained. The progress of the reaction was confirmed by measuring $^{1}$H-NMR (JEOL Co., Ltd.) and checking the appearance of two peaks in the region of 7 ppm to 7.5 ppm.

4. Synthesis Example of P-27

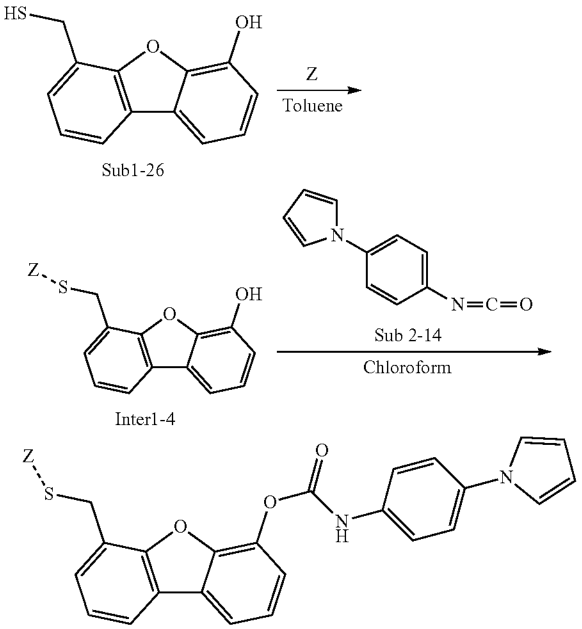

Sub1-26

Inter1-4

P-27

(1) Exemplary Synthesis of Inter 1-4

The inorganic nanoparticulate structures Z-1 (3 g) and Sub 1-26 (9.8 g) obtained in the above synthesis were synthesized according to the above synthesis method of Inter 1-1 to obtain 2.70 g of Inter 1-4 (yield: 90%).

(2) Exemplary Synthesis of P-27

Inter 1-4 (1 g) and Sub 2-14 (2.8 g, Aldrich, 1-(4-isocyanatophenyl)-1H-pyrrole) obtained in the above synthesis were synthesized according to the synthesis method of P-1, and 0.95 g of the product (yield: 95%) was obtained. The progress of the reaction was confirmed by measuring $^{1}$H-NMR and checking the appearance of three peaks in the region of 7 ppm to 8.5 ppm.

5. Synthesis Example of P-45

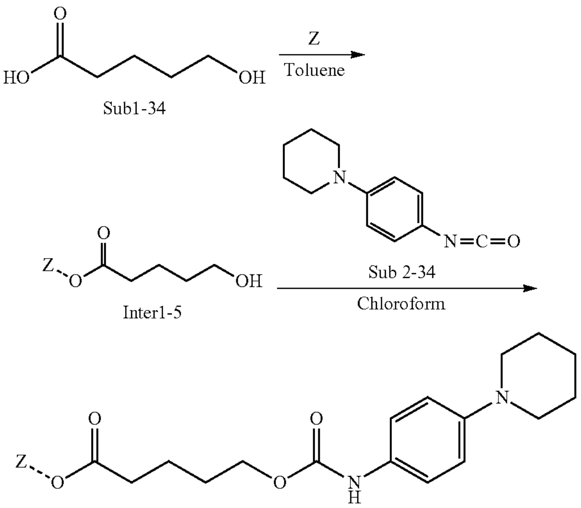

Sub1-34

Interl-5

P-45

(1) Exemplary Synthesis of Inter 1-5

The inorganic nanoparticulate structures Z-1 (3 g) and Sub 1-34 (3.7 g) obtained in the above synthesis were synthesized according to the above synthesis method of Inter 1-1 to obtain 2.94 g of Inter 1-5 (yield: 98%).

(2) Exemplary Synthesis of P-45

Interl-5 (1 g) and Sub2-34 (3.0 g, Aldrich, 1-(4-isocyanatophenyl)pyrrolidine) obtained in the above synthesis were synthesized according to the synthesis method of P-1, and 0.97 g of the product (yield: 97%) was obtained. The progress of the reaction was confirmed by measuring $^{1}$H-NMR and checking the appearance of two peaks in the region of 7 ppm to 8.5 ppm.

6. Synthesis Example of P-47

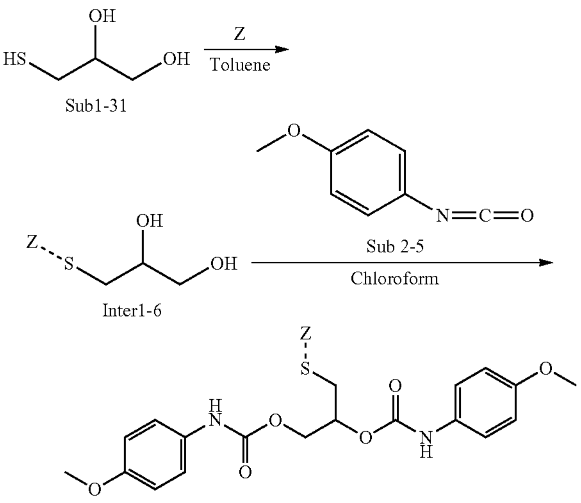

Sub1-31

Interl-6

P-47

(1) Exemplary Synthesis of Inter 1-6

The inorganic nanoparticulate structures Z-1 (3 g) and Sub 1-31 (4.9 g) obtained in the above synthesis were synthesized according to the above synthesis method of Inter 1-1 to obtain 2.91 g of Inter 1-6 (yield: 97%).

(2) Exemplary Synthesis of P-47

Inter1-6 (1 g) and Sub 2-5 (2.2 g, Aldrich, 1-isocyanato-4-methoxybenzene) obtained in the above synthesis were synthesized according to the synthesis method of P-1, and 0.98 g of the product (yield: 98%) was obtained. The progress of the reaction was confirmed by measuring $^{1}$H-NMR (JEOL Co., Ltd.) and checking the appearance of two peaks in the region of 7 ppm to 7.5 ppm.

7. Synthesis Example of P-72

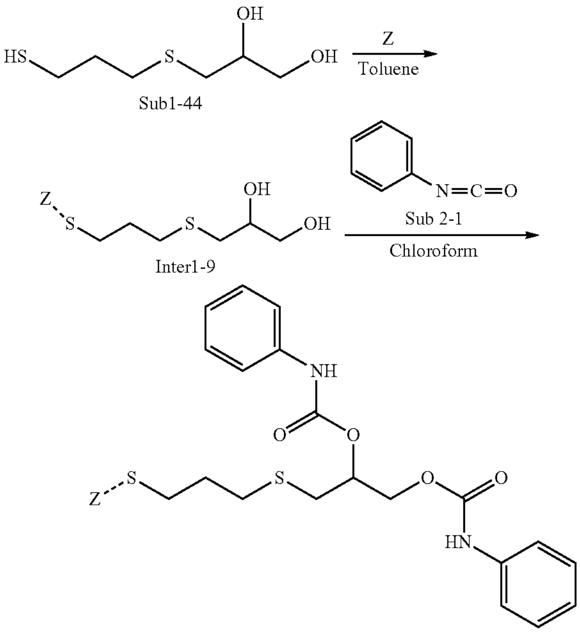

Sub1-44

Inter1-9

P-72

(1) Exemplary Synthesis of Inter 1-9

The inorganic nanoparticulate structures Z-1 (3 g) and Sub 1-44 (7.5 g) obtained in the above synthesis were synthesized according to the synthesis method of Inter 1-1 to obtain 2.88 g of Inter 1-9 (yield: 96%).

(2) Exemplary Synthesis of P-72

Inter1-9 (1 g) and Sub 2-1 (1.8 g, Aldrich, isocyanato-benzene) obtained in the above synthesis were synthesized according to the synthesis method of P-1 to obtain 0.97 g (yield: 97%) of the product. The progress of the reaction was confirmed by measuring $^{1}$H-NMR (JEOL Co., Ltd.) and checking the appearance of three peaks in the region of 7 ppm to 8.0 ppm.

8. Synthesis Example of P-82

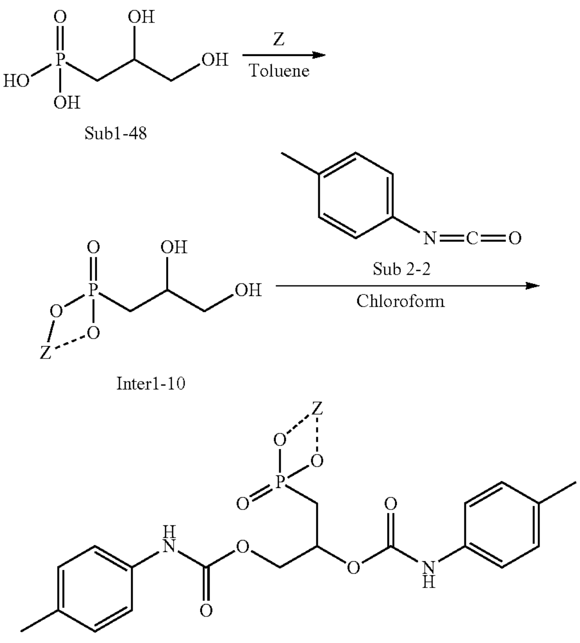

Sub1-48

Inter1-10

P-82

(1) Exemplary Synthesis of Inter 1-10

The inorganic nanoparticulate structures Z-1 (3 g) and Sub 1-48 (7.7 g) obtained in the above synthesis were synthesized according to the above synthesis method of Inter 1-1 to obtain 2.79 g of Inter 1-10 (yield: 93%).

(2) Exemplary Synthesis of P-82

Inter 1-10 (1 g) and Sub 2-2 (2.0 g, Aldrich, 1-isocyanato-4-methylbenzene) obtained in the above synthesis were synthesized according to the synthesis method of P-1, and 0.95 g of the product (yield: 95%) was obtained. The progress of the reaction was confirmed by measuring $^{1}$H-NMR (JEOL Co., Ltd.) and checking the appearance of two peaks in the region of 7 ppm to 7.5 ppm.

9. Synthesis Example of P-96

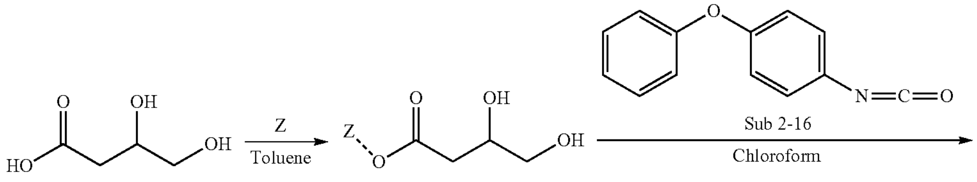

Sub1-56

Inter1-11

-continued

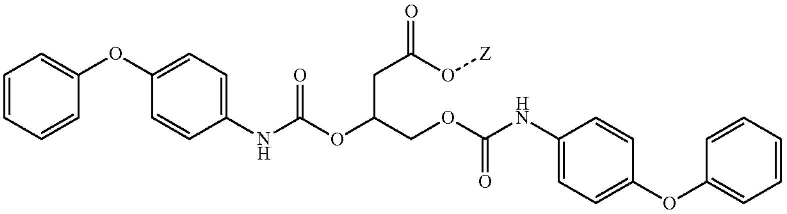

P-96

(1) Exemplary Synthesis of Inter 1-11

The inorganic nanoparticulate structures Z-1 (3 g) and Sub 1-56 (5.4 g) obtained in the above synthesis were synthesized according to the synthesis method of Inter 1-1 to obtain 2.76 g of Inter1-11 (yield: 92%).

(2) Exemplary Synthesis of P-96

Inter 1-11 (1 g) and Sub 2-16 (3.2 g, Aldrich, 1-isocyanato-4-phenoxybenzene) obtained in the above synthesis were synthesized according to the synthesis method of P-1, and 0.95 g of the product (yield: 95%) was obtained. The progress of the reaction was confirmed by measuring $^{1}$H-NMR and checking the appearance of five peaks in the region of 7 ppm to 7.5 ppm.

Referring to the above-described synthesis methods, semiconductor nanoparticles-ligand composites (e.g., the following P-1 to P-108) may be prepared, but the semiconductor nanoparticles-ligand composites according to embodiments of the present disclosure are not limited to the following P-1 to P-108. In the following P-1 to P-108, Z means the surface of the semiconductor nanoparticles. The following P-1 to P-108 indicate that one ligand coordinates with Z for convenience purpose; however, as described above, ligands according to embodiments of the present disclosure or other ligands may coordinate with Z, which is the surface of semiconductor nanoparticles.

P-1

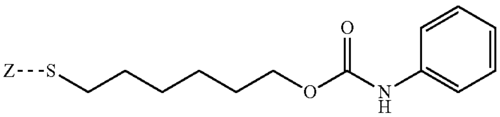

P-2

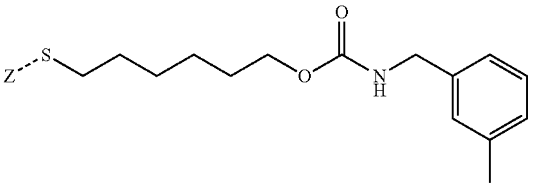

P-3

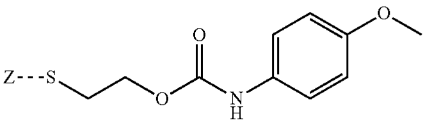

P-4

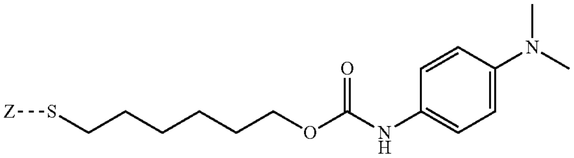

P-5

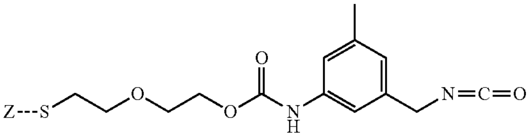

P-6

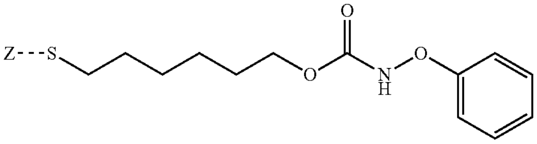

P-7

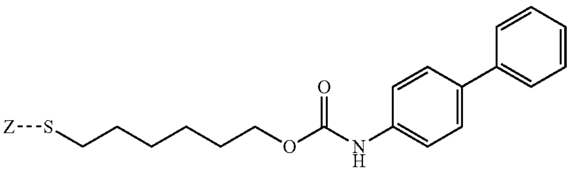

P-8

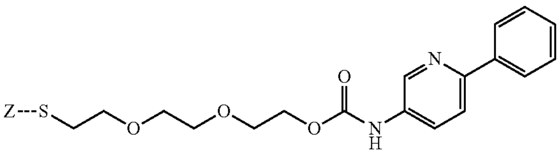

P-9

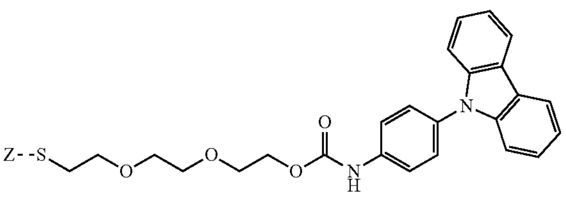

P-10

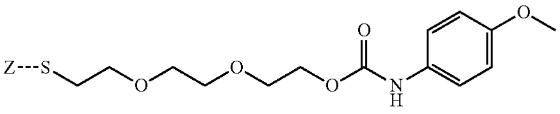

-continued
P-11
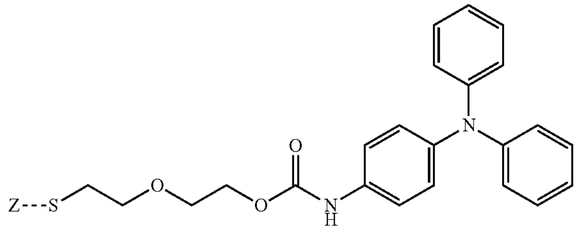
P-12
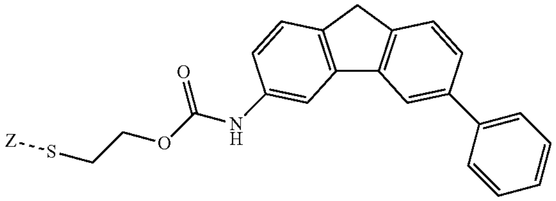
P-13
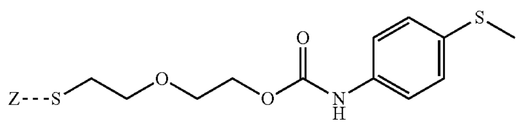
P-14
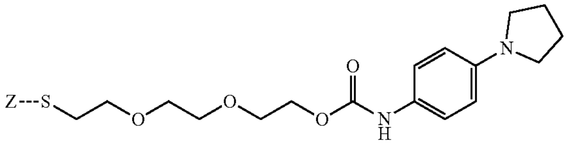
P-15
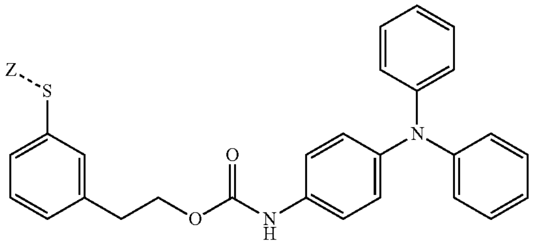
P-16
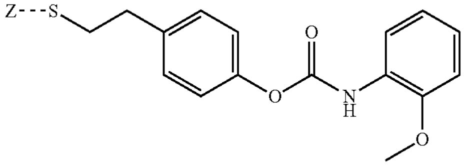
P-17
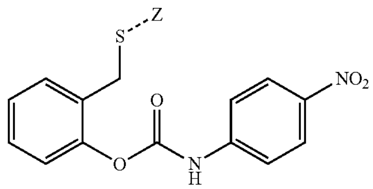
P-18
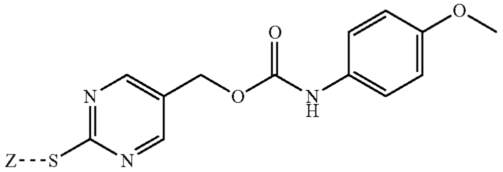
P-19
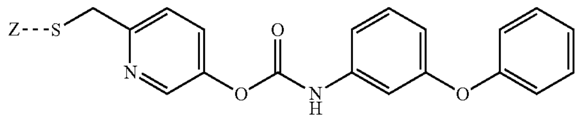
P-20
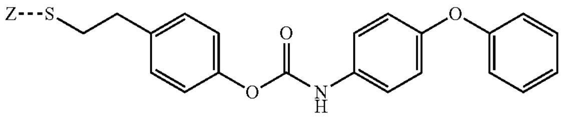
P-21
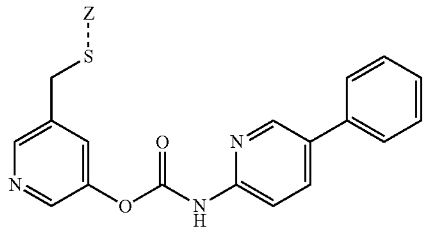
P-22
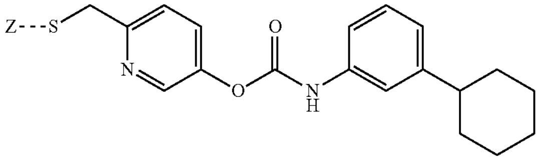
P-23
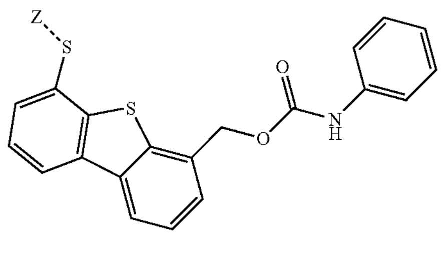
P-24
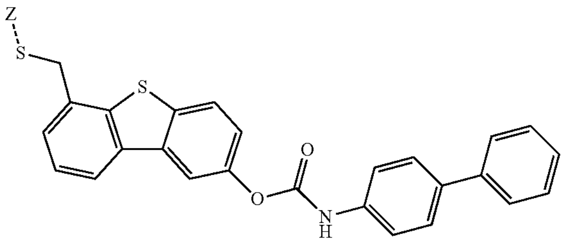

-continued
P-25
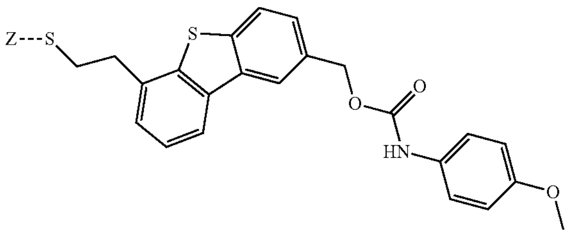
P-26
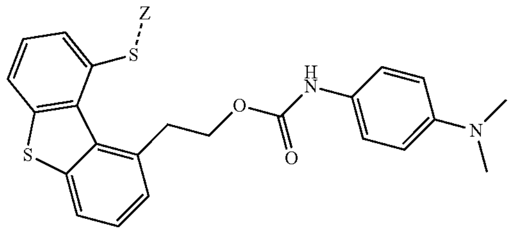
P-27
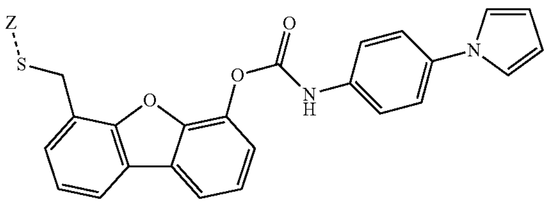
P-28
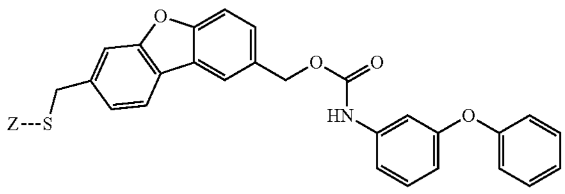
P-29
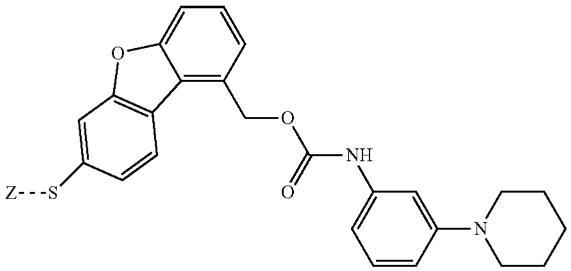
P-30
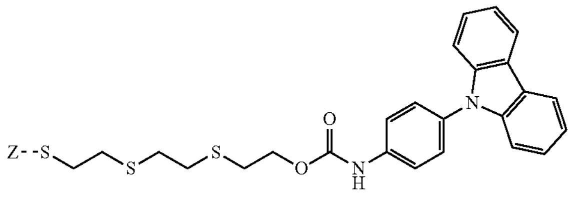
P-31
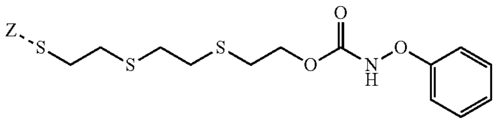
P-32
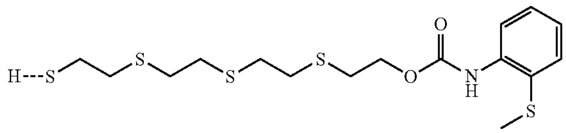
P-33
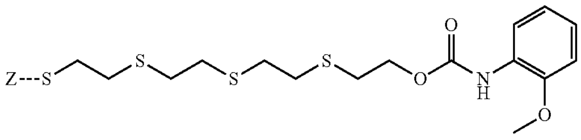
P-34
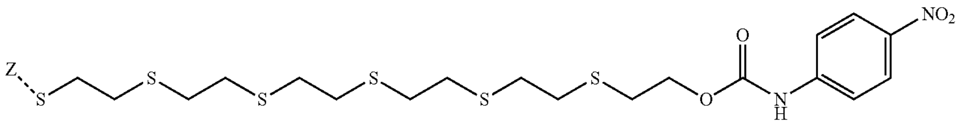
P-35
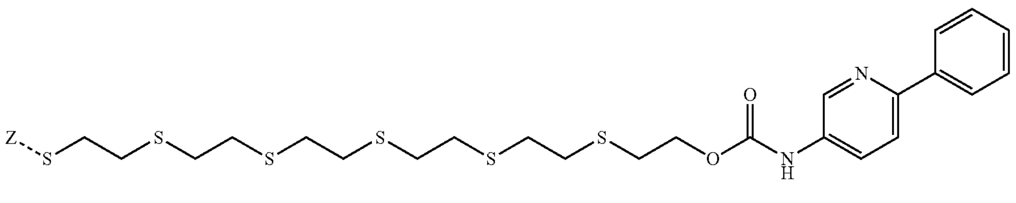

-continued
P-36
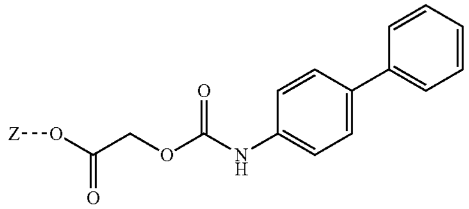
P-37
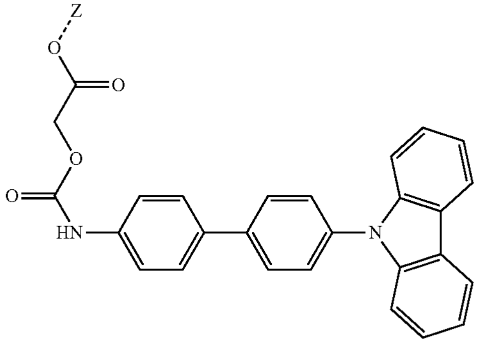
P-38
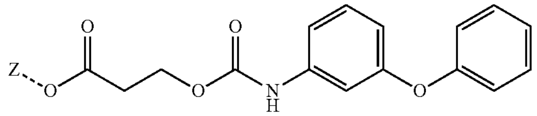
P-39
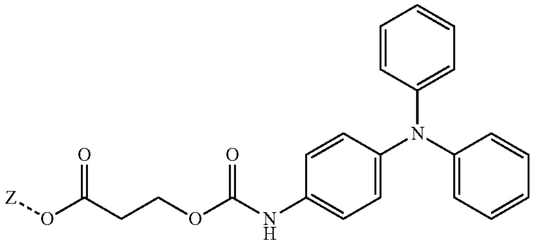
P-40
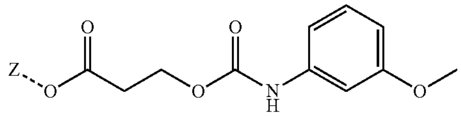
P-41
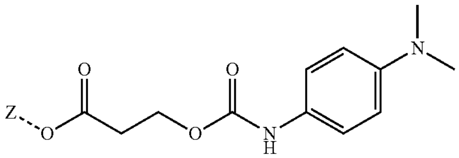
P-42
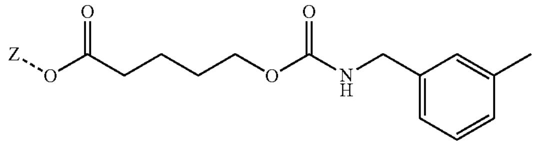
P-43
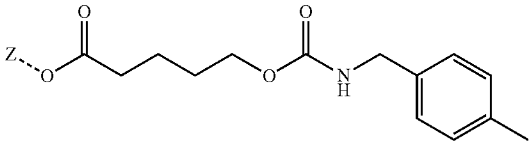
P-44
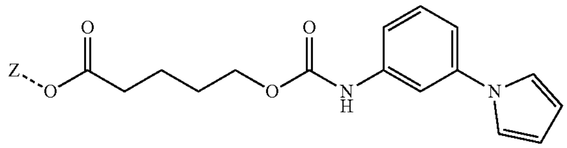
P-45
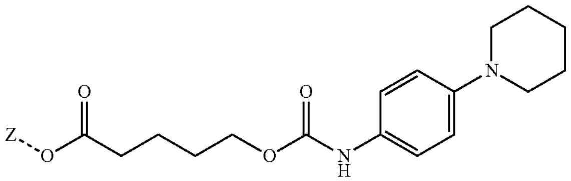
P-46
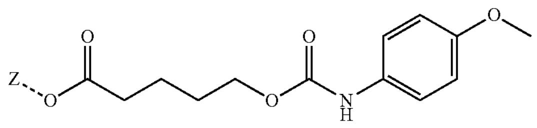
P-47
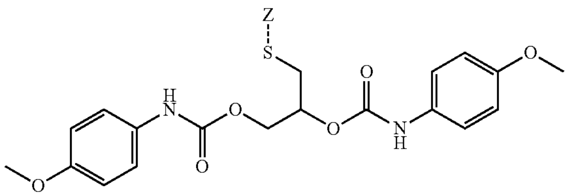
P-48
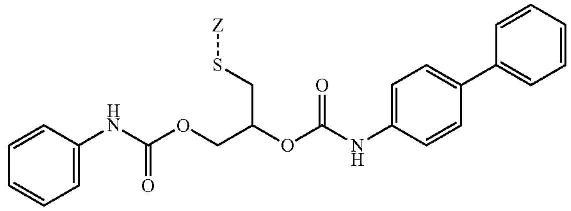
P-49
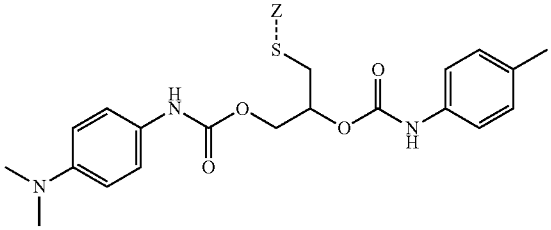

-continued
P-50
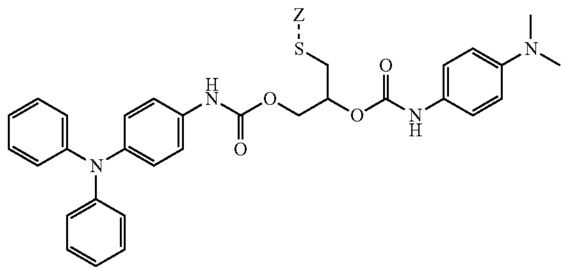
P-51
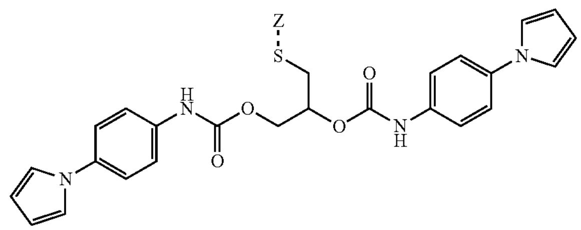
P-52
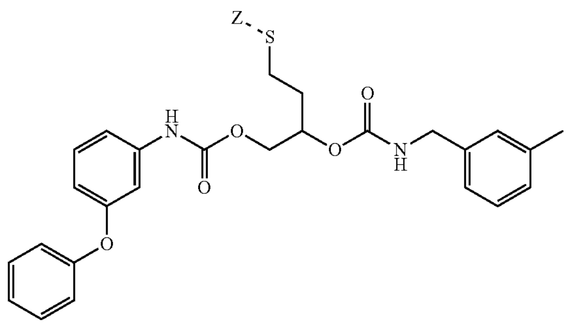
P-53
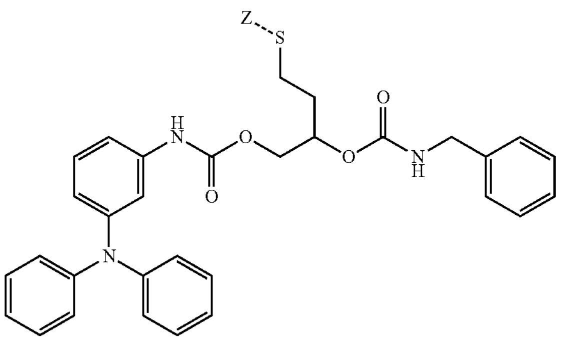
P-54
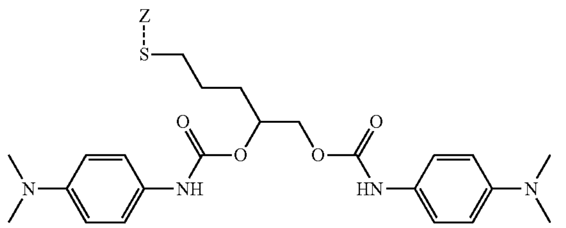
P-55
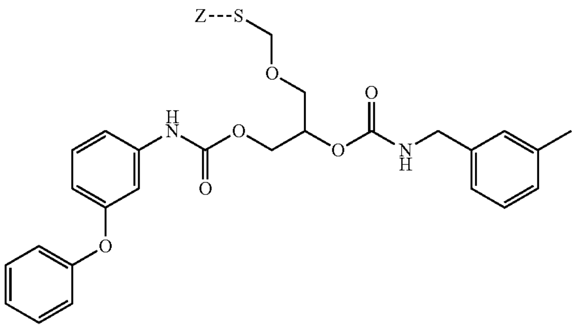
P-56
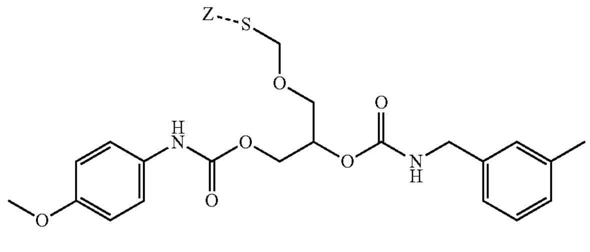
P-57
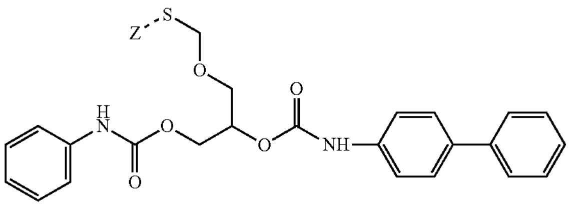
P-58
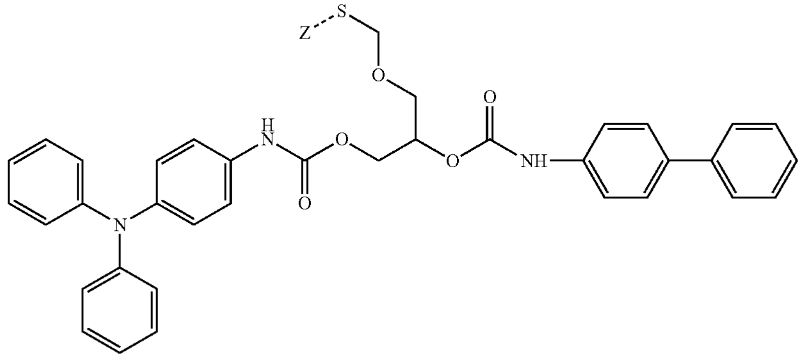

-continued
P-59
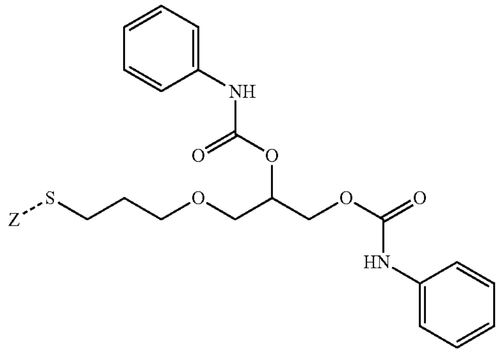
P-60
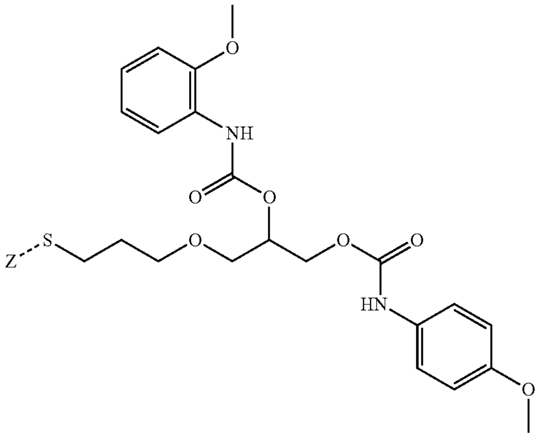
P-61
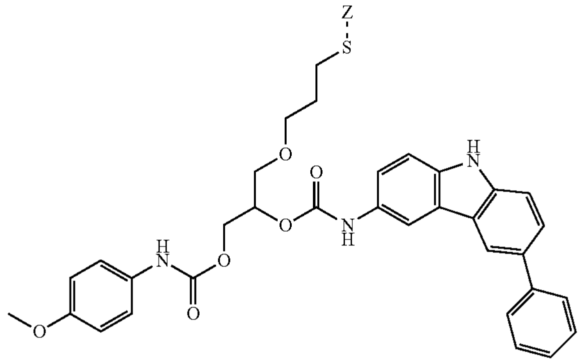
P-62
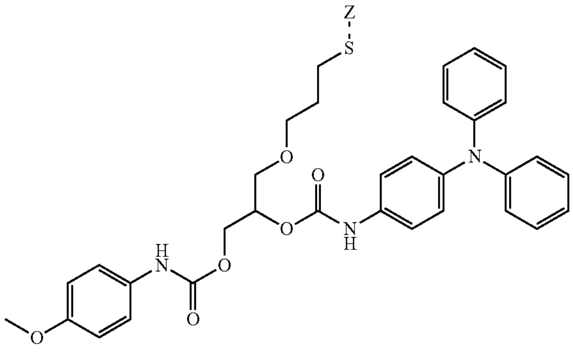
P-63
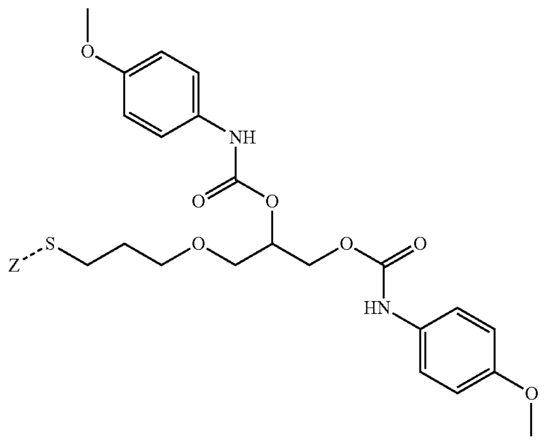
P-64
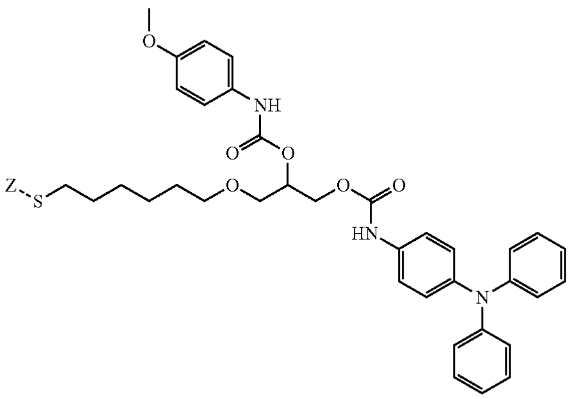

-continued
P-65
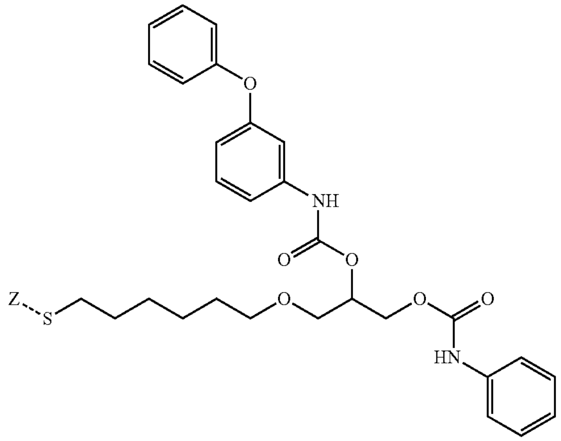
P-66
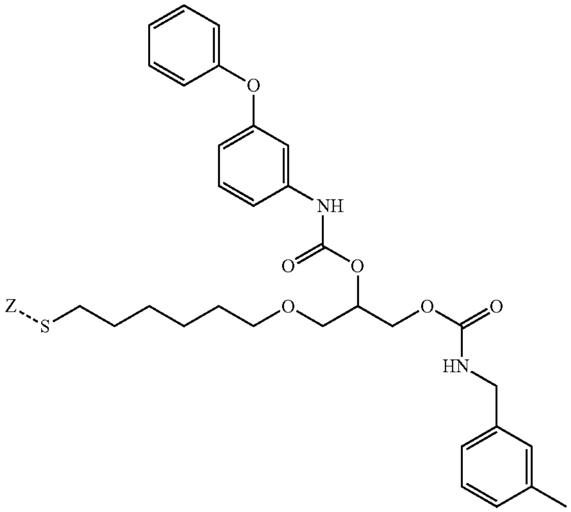
P-67
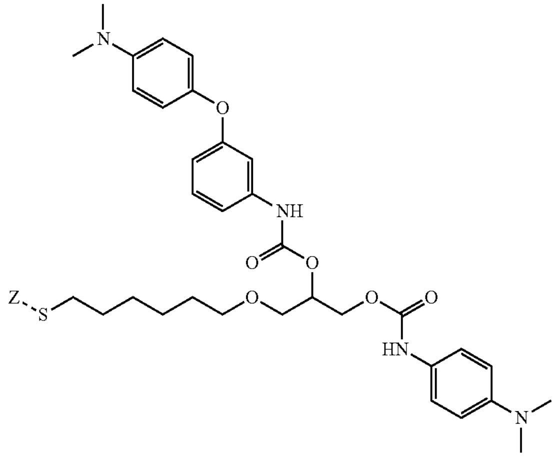
P-68
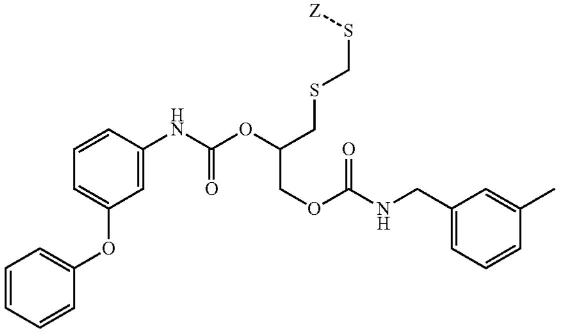
P-69
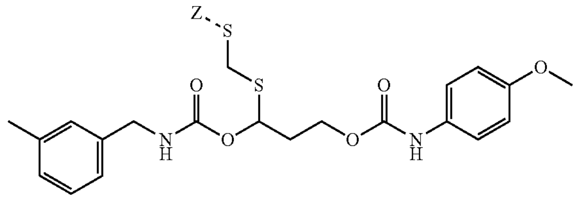
P-70
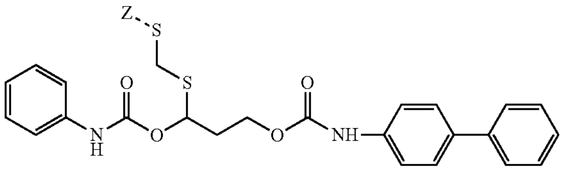
P-71
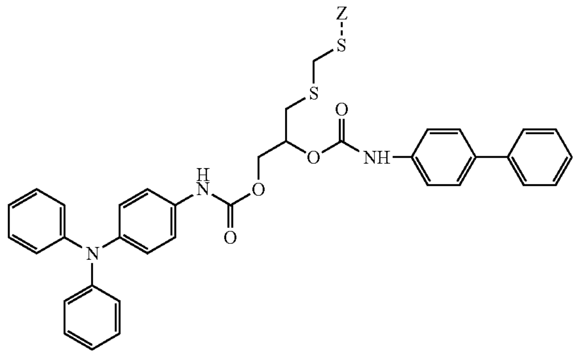
P-72
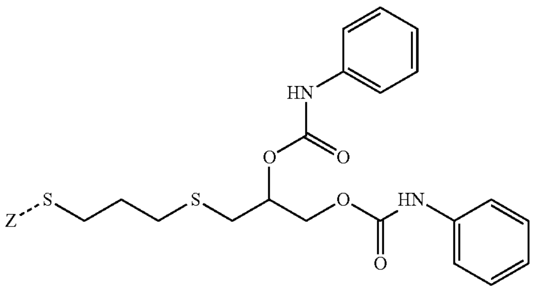

-continued
P-73
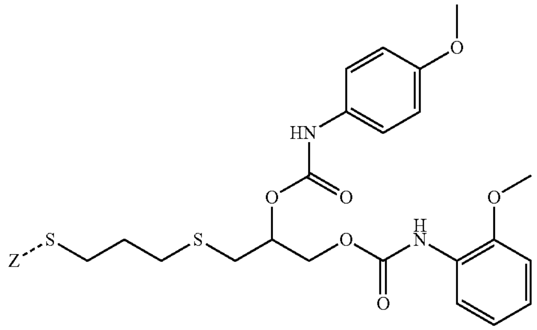
P-74
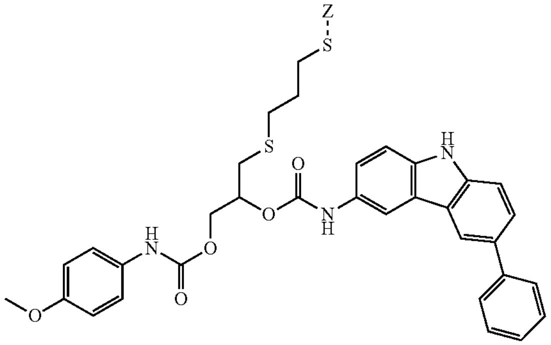
P-75
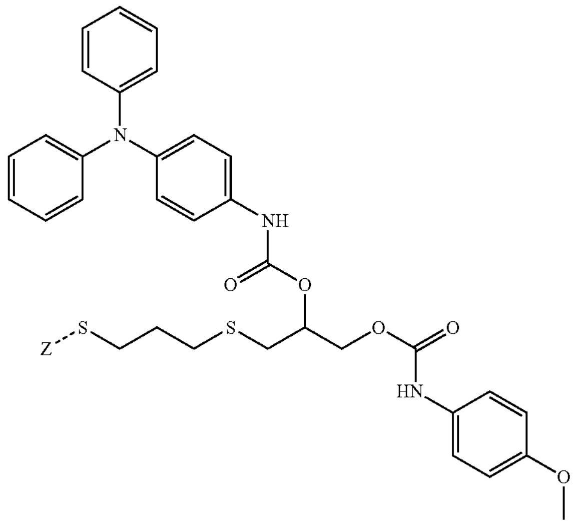
P-76
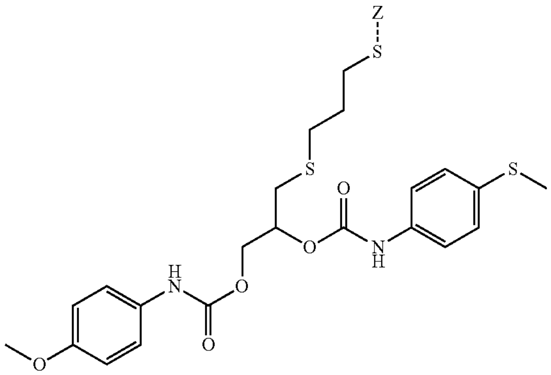
P-77
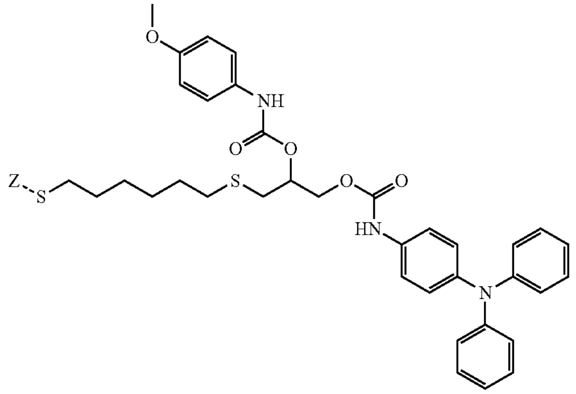
P-78
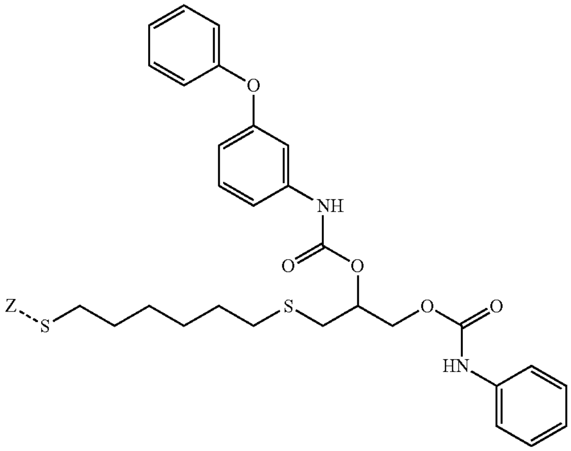

-continued
P-79
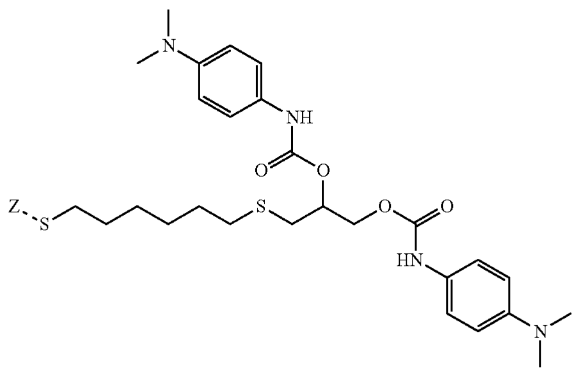
P-80
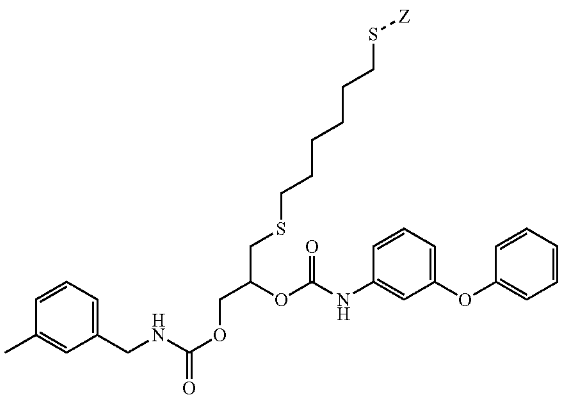
P-81
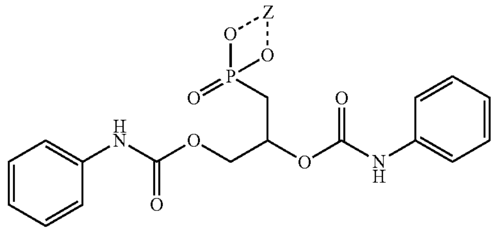
P-82
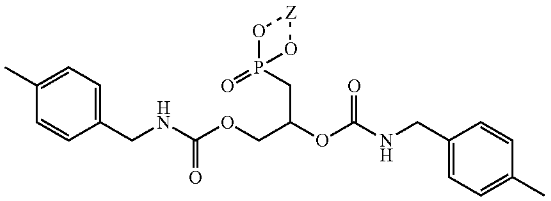
P-83
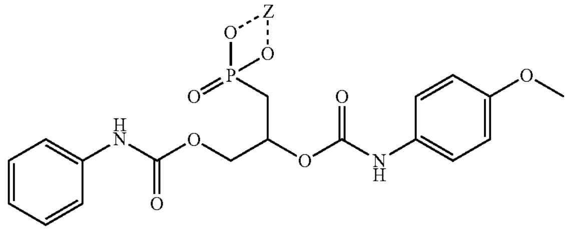
P-84
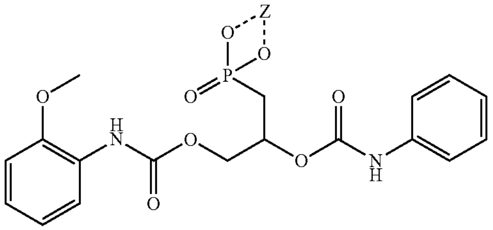
P-85
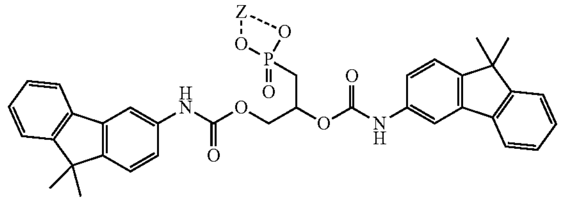
P-86
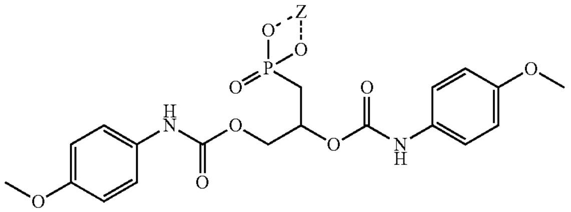
P-87
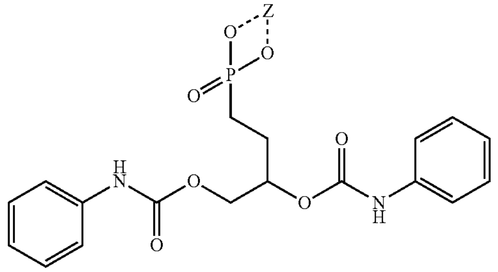
P-88
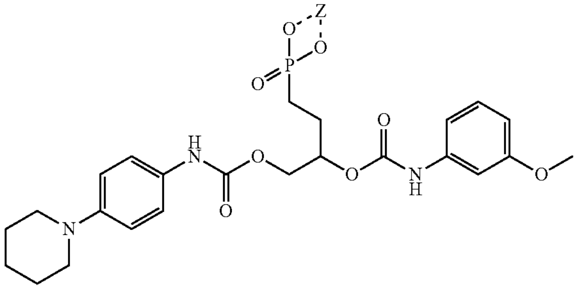

-continued
P-89
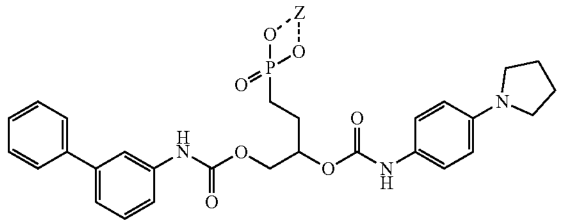
P-90
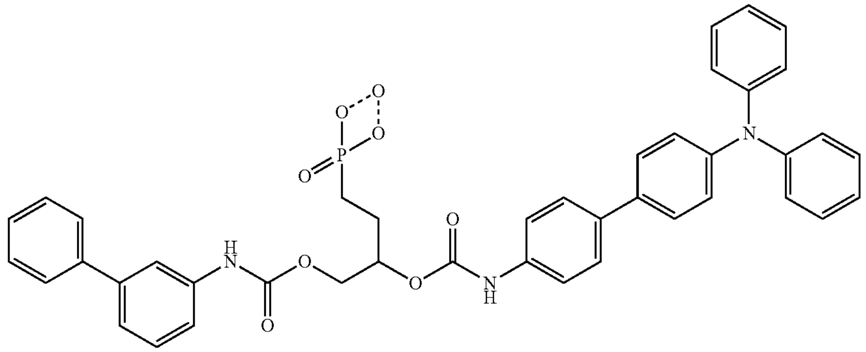
P-91
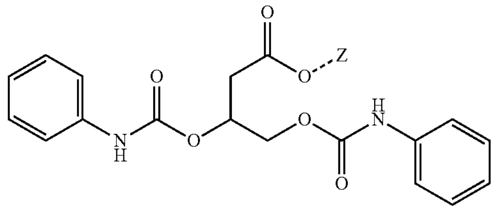
P-92
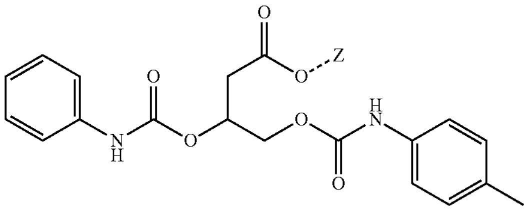
P-93
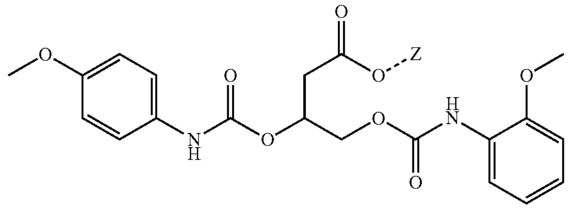
P-94
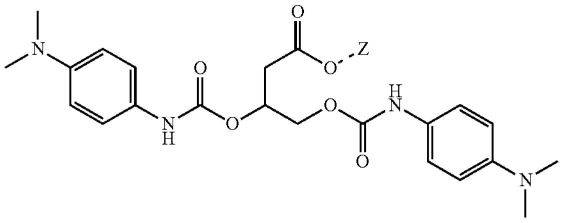
P-95
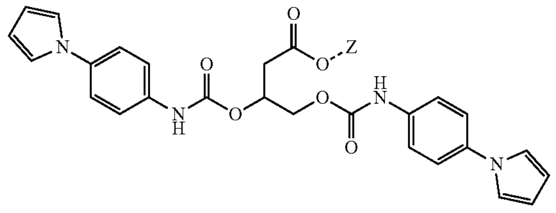
P-96
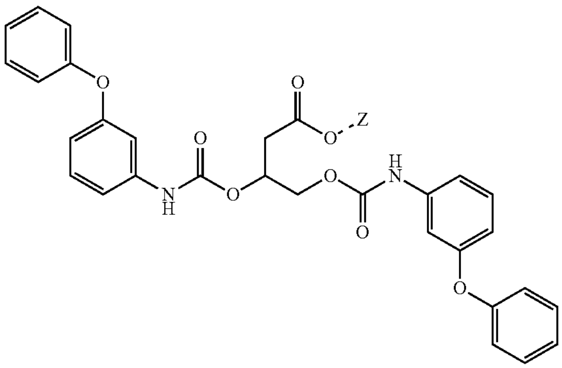

-continued
P-97
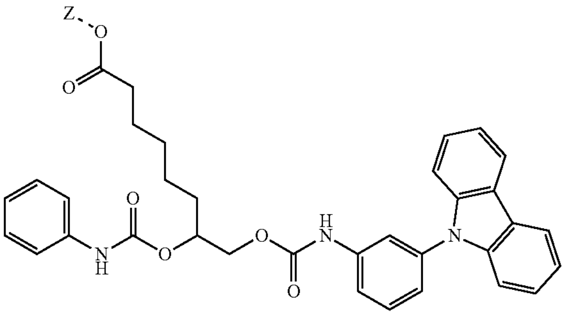
P-98
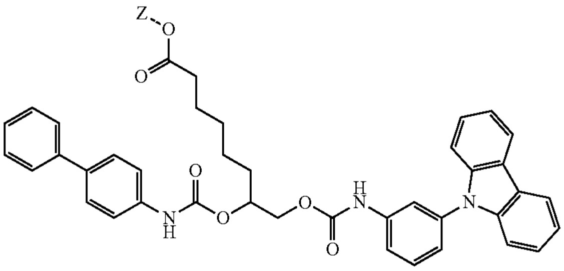
P-99
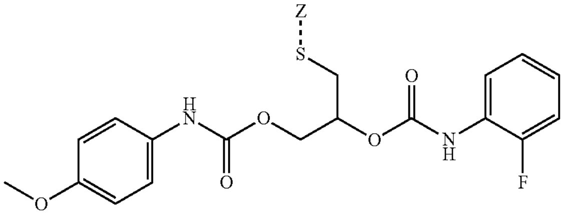
P-100
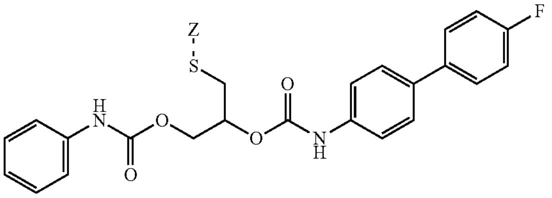
P-101
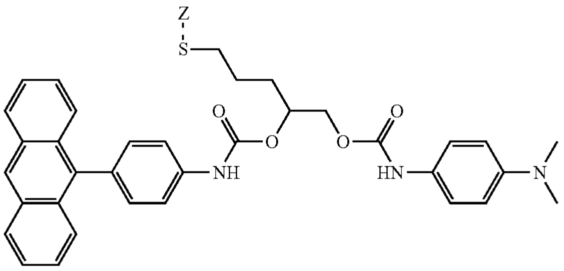
P-102
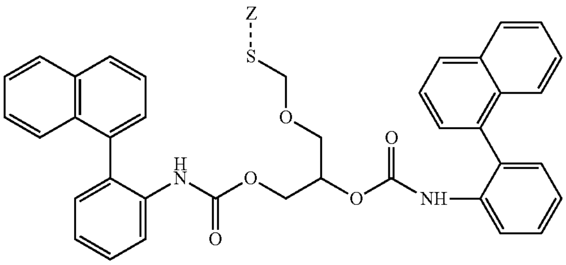
P-103
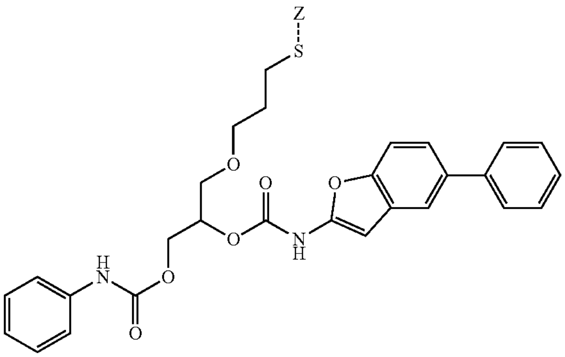

-continued

P-104

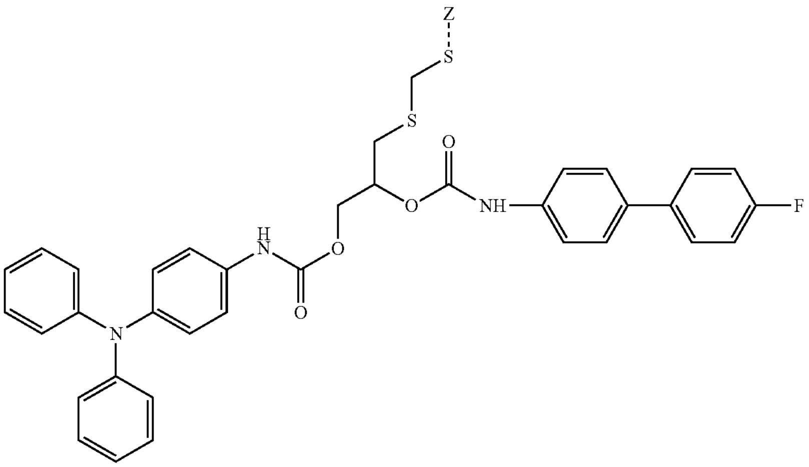

P-106

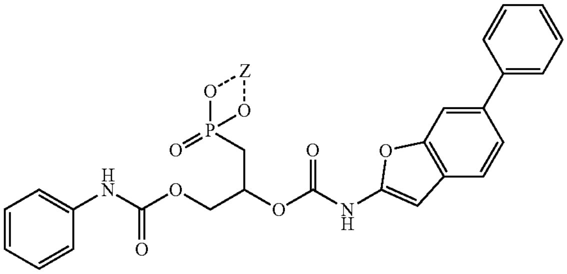

P-105

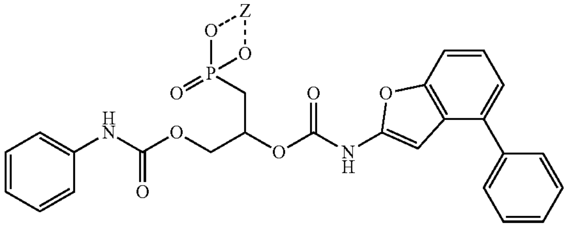

P-107

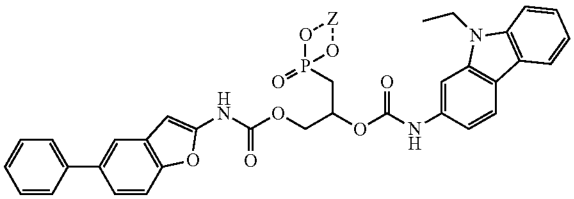

P-108

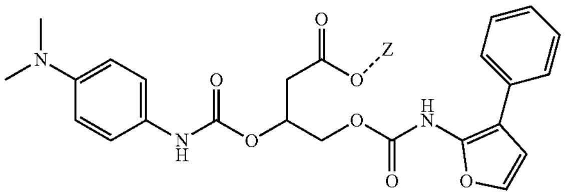

Preparation of Photosensitive Resin Composition

Example 1

35 Parts by weight of P-1 of the present disclosure as a semiconductor nanoparticle-ligand composite, 60 parts by weight of M-1 (Eternal Co., Ltd., EM224) as a photocrosslinking monomer, and 5 parts by weight of Ingacure TPO (BASF) as an initiator were added to a 20 mL vial, and the mixture was stirred at room temperature for 2 hours to prepare a photosensitive resin composition.

Example 2

35 Parts by weight of P-1 of the present disclosure as a semiconductor nanoparticle-ligand composite, 57 parts by weight of M-1 as a photocrosslinking monomer, 5 parts by weight of Ingacure TPO as an initiator, and 3 parts by weight of titanium (IV) oxide (SMS Co., Ltd.) as a light diffusion agent were added to a 20 mL vial, and the mixture was stirred at room temperature for 2 hours to prepare a photosensitive resin composition.

Example 3 to Example 18

Photosensitive resin compositions were prepared in the same manner as in Example 1 or Example 2, except that the semiconductor nanoparticle-ligand composite, the photocrosslinkable monomer, the initiator, and the light diffusion agent were used as the materials and in parts by weight described in Table 3 below.

Comparative Example 1 to Comparative Example 4

Photosensitive resin compositions were prepared in the same manner as in Example 1, except that the comparative semiconductor nanoparticle-ligand composite, the photocrosslinkable monomer, and the initiator were used as the materials and in parts by weight described in Table 3 below in a 20 mL vial.

[Comparative Semiconductor Nanoparticle-Ligand Composite C1]

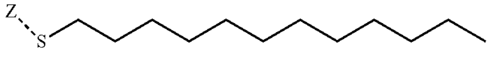

[Comparative Semiconductor Nanoparticle-Ligand Composite C2]

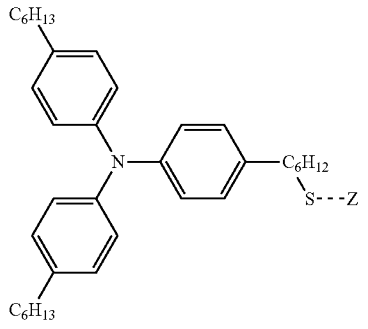

In the structure above, Z is a semiconductor nanoparticle (InZnP/ZnSeS).

The constitution of the photosensitive resin compositions prepared above can be summarized in Table 3 below.

TABLE 3

| | Inorganic Nanoparticle Structure | | photocross-linkable monomer | | Initiator | | Photo Diffusion Agent | |
|---|---|---|---|---|---|---|---|---|
| | Category | Parts by Weight | Category | Parts by Weight | Category | Parts by Weight | Category | Parts by Weight |
| Comparative Example 1 | C-1 | 35 | M-1 | 60 | Ingacure TPO | 5 | $TiO_2$ | |
| Comparative Example 2 | C-1 | 35 | M-15 | 60 | | 5 | | |
| Comparative Example 3 | C-2 | 35 | M-1 | 60 | | 5 | | |
| Comparative Example 4 | C-2 | 35 | M-15 | 60 | | 5 | | |
| Example 1 | P-1 | 35 | M-1 | 60 | | 5 | | |
| Example 2 | P-1 | 35 | M-1 | 57 | | 5 | | 3 |
| Example 3 | P-4 | 35 | M-1 | 60 | | 5 | | |
| Example 4 | P-4 | 35 | M-1 | 57 | | 5 | | 3 |
| Example 5 | P-10 | 35 | M-1 | 60 | | 5 | | |
| Example 6 | P-10 | 35 | M-1 | 57 | | 5 | | 3 |
| Example 7 | P-20 | 35 | M-1 | 60 | | 5 | | |
| Example 8 | P-20 | 35 | M-1 | 57 | | 5 | | 3 |
| Example 9 | P-27 | 35 | M-15 | 60 | | 5 | | |
| Example 10 | P-27 | 35 | M-15 | 57 | | 5 | | 3 |
| Example 11 | P-47 | 35 | M-15 | 60 | | 5 | | |
| Example 12 | P-47 | 35 | M-15 | 57 | | 5 | | 3 |
| Example 13 | P-51 | 35 | M-15 | 60 | | 5 | | |
| Example 14 | P-51 | 35 | M-15 | 57 | | 5 | | 3 |
| Example 15 | P-54 | 35 | M-15 | 60 | | 5 | | |
| Example 16 | P-63 | 35 | M-15 | 60 | | 5 | | |
| Example 17 | P-82 | 35 | M-15 | 60 | | 5 | | |
| Example 18 | P-96 | 35 | M-15 | 60 | | 5 | | |

Viscosity Measurement Method

Under Yellow Room conditions, 0.5 mL each of the photosensitive resin compositions of Examples and Comparative Examples prepared above was added dropwise to the specimen holder of a viscometer (Brookfield), and the measurement was performed at 20 rpm for 1 minute. The measurement results are shown in Table 4 below.

Film Formation Method

Under $N_2$ conditions, the photosensitive resin compositions of Examples and Comparative Examples prepared above were added dropwise to 50 mm×50 mm bare glass, coated at 500 rpm for 30 seconds using a spin coater, and then pre-baked on a 100° C. hot plate for 1 minute to form a film.

Thickness Measurement Method

Film coating properties and thicknesses of the films prepared in Examples and Comparative Examples prepared above were measured using a 3D profiler device (Nano System Co., Ltd.) at five different points in the same glass as shown in FIG. 1. The measurement results are shown in Table 4 and Table 5 below.

Film Quantum Efficiency (Film QY) Measurement Method

The films prepared in Examples and Comparative Examples prepared above were measured for color-conversion efficiency at five different points in the same glass using Otsuka's QE-2100 as shown in FIG. 1. The measurement results are shown in Table 4 and Table 5 below.

The measurement results of the viscosity, thickness, and Film QY of the photosensitive resin compositions and the films prepared using the photosensitive resin compositions in Examples and Comparative Examples prepared as described above are shown in Table 4 below.

TABLE 4

| | | Thickness (μm) | | Film QY (%) | |
|---|---|---|---|---|---|
| | Viscosity (cps) | Mean | Standard Deviation | Mean | Standard Deviation |
| Comparative Example 1 | unmeasurable | 10.5 | 1.423 | 18.6 | 0.064 |
| Comparative Example 2 | unmeasurable | 10.8 | 1.367 | 18.8 | 0.064 |
| Comparative Example 3 | 60.2 | 11.8 | 0.792 | 23.3 | 0.012 |
| Comparative Example 4 | 58.6 | 11.0 | 0.903 | 23.7 | 0.013 |
| Example 1 | 21.2 | 10.1 | 0.055 | 33.2 | 0.004 |

TABLE 4-continued

| | Viscosity (cps) | Thickness (μm) Mean | Thickness (μm) Standard Deviation | Film QY (%) Mean | Film QY (%) Standard Deviation |
|---|---|---|---|---|---|
| Example 2 | 22.0 | 10.1 | 0.071 | 33.6 | 0.004 |
| Example 3 | 20.2 | 10.1 | 0.055 | 33.4 | 0.003 |
| Example 6 | 20.7 | 10.1 | 0.055 | 33.8 | 0.003 |
| Example 7 | 22.1 | 10.1 | 0.071 | 33.1 | 0.007 |
| Example 8 | 22.8 | 10.1 | 0.071 | 33.4 | 0.009 |
| Example 9 | 23.0 | 10.2 | 0.071 | 32.4 | 0.010 |
| Example 10 | 23.2 | 10.2 | 0.071 | 32.7 | 0.011 |
| Example 11 | 21.3 | 10.0 | 0.045 | 33.9 | 0.003 |
| Example 12 | 21.7 | 10.1 | 0.055 | 34.4 | 0.002 |
| Example 13 | 20.3 | 10.0 | 0.035 | 34.1 | 0.003 |
| Example 14 | 20.5 | 10.1 | 0.055 | 34.5 | 0.003 |

TABLE 4-continued

| | Viscosity (cps) | Thickness (μm) Mean | Thickness (μm) Standard Deviation | Film QY (%) Mean | Film QY (%) Standard Deviation |
|---|---|---|---|---|---|
| Example 15 | 22.7 | 10.1 | 0.055 | 33.8 | 0.003 |
| Example 16 | 21.9 | 9.9 | 0.035 | 34.2 | 0.004 |
| Example 17 | 24.0 | 10.1 | 0.071 | 32.2 | 0.010 |
| Example 18 | 23.8 | 10.2 | 0.071 | 32.6 | 0.010 |

As can be seen from the results of Table 4, it was confirmed that the photosensitive resin compositions of Comparative Examples 1 to 4 prepared with comparative inorganic nanoparticle structures have very high viscosity, whereas the photosensitive resin composition of the present disclosure has significantly lower viscosity compared to that of the photosensitive resin compositions of Comparative Examples 1 to 4.

In detail, in the cases of Comparative Examples 1 and 2 where the photosensitive resin compositions were prepared using comparative inorganic nanoparticle structures having a simple alkyl group, the aggregation phenomenon of the semiconductor nanoparticle-ligand composite was maximized, making it impossible to measure the viscosity, whereas in the cases of Comparative Examples 3 and 4 where the photosensitive resin compositions were prepared using inorganic nanoparticle structures in which an aryl group was bound to an alkyl group, it was possible to measure the viscosity, but the aggregation phenomenon of the semiconductor nanoparticle-ligand composite was still severe, and thus the viscosity measured was very high.

In contrast, in the case of the inorganic nanostructure prepared using the compound of the present disclosure introduced with a carbamate-based substituent, where at least one aryl group or heterocyclic group is substituted, the aggregation phenomenon between the semiconductor nanoparticle-ligand composites was significantly improved, and thus the viscosity measured was to be very low to be in the range of 20 cps to 24 cps. Such a low viscosity has excellent properties in the process. In contrast, when it has a high viscosity, a uniform film cannot be prepared due to problems such as clogging of nozzles in the process and poor spreadability of the substrate when applied to inkjetting.

Meanwhile, in the films prepared using the photosensitive resin compositions prepared in Examples 1, 3, 11, and 12, and Comparative Examples 1 to 3, measurements were made with regard to the thickness and Film QY at five different points in the same glass as shown in FIG. 1, and the measurement results are shown in Table 5 below.

TABLE 5

| | | Example 1 | Example 3 | Example 4 | Example 11 | Example 12 | Comparative Example 1 | Comparative Example 2 | Comparative Example 3 |
|---|---|---|---|---|---|---|---|---|---|
| Thickness (μm) | 1 | 10.0 | 10.0 | 10.0 | 10.0 | 10.1 | 11.1 | 11.5 | 12.6 |
| | 2 | 10.1 | 10.1 | 10.1 | 10.0 | 10.0 | 9.3 | 9.7 | 11.5 |
| | 3 | 10.0 | 10.0 | 10.0 | 10.1 | 10.1 | 10 | 10.4 | 10.6 |
| | 4 | 10.1 | 10.1 | 10.1 | 10.0 | 10.0 | 12.7 | 12.9 | 12.3 |
| | 5 | 10.1 | 10.0 | 10.2 | 10.0 | 10.0 | 9.4 | 9.7 | 12.1 |
| Film QY (%) | 1 | 33.6 | 33.7 | 33.7 | 34.1 | 34.7 | 25.1 | 23.4 | 21.4 |
| | 2 | 32.9 | 33.8 | 33.9 | 33.7 | 34.5 | 13.6 | 15.6 | 24.5 |
| | 3 | 33.5 | 33.6 | 33.1 | 34.1 | 34.2 | 23.4 | 22.7 | 23.8 |
| | 4 | 32.7 | 33.2 | 33.2 | 34.2 | 34.1 | 20.7 | 23.4 | 22.9 |
| | 5 | 33.1 | 33.9 | 33.9 | 33.6 | 34.3 | 10.2 | 9.1 | 24.1 |

As can be seen from the results of Table 5, in the cases of Comparative Examples, it can be confirmed that the efficiency is low and that the coating property of the film is not uniform, compared to the films prepared using the photosensitive resin composition prepared in the present disclosure.

It is speculated that these results appear to be because when the aggregation phenomenon of the semiconductor nanoparticle-ligand composite increases, it affects the quantum efficiency due to the interaction between the semiconductor nanoparticle-ligand composites, and as a result, Example 1, Example 3, Example 4, Example 11, and Example 12 have higher compatibility of the photosensitive resin composition compared to those of Comparative Examples 1 to 3.

In particular, compared to Comparative Example 3, in the case of the semiconductor nanoparticle-ligand composite prepared in the present disclosure, the carbamate-based compound, where at least one aryl group or heterocyclic group is substituted, has relatively excellent compatibility with the photocrosslinkable monomer.

As a result, it is speculated that it is possible to prepare a photosensitive resin composition having low viscosity and high compatibility using the semiconductor nanoparticle-ligand composite of the present disclosure, and thus it is possible to have a uniform film with remarkably excellent quantum efficiency.

The above description is merely illustrative of the present disclosure, and those of ordinary skill in the art to which the present disclosure pertains will be able to make various modifications without departing from the essential characteristics of the present disclosure. Accordingly, the embodiments disclosed in the present specification are intended to illustrate, not to limit the present disclosure, and the spirit and scope of the present disclosure are not limited by these embodiments. The protection scope of the present disclosure should be construed by the following claims, and all descriptions within the scope equivalent thereto should be construed as being included in the scope of the present disclosure.

What is claimed is:

1. A photosensitive resin composition comprising:
(A) a semiconductor nanoparticle-ligand composite comprising a ligand represented by Formula 1;
(B) a photocrosslinkable monomer; and
(C) an initiator:

[Formula 1]

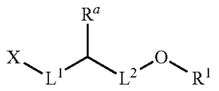

[Formula 1-1]

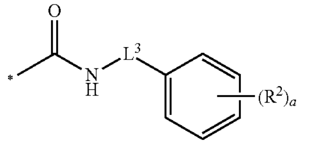

wherein:
1) X is —S(H) or —P═O(OH)$_2$ or —COOH which is a functional group that binds to the surface of semiconductor nanoparticles;
2) $R^a$ is H, -$L^4$-O—$R^1$, a $C_{1-20}$ alkyl group, a $C_{1-20}$ alkoxyl group, or a $C_{1-20}$ alkylthio group;
3) $L^4$ is selected from the group consisting of a single bond; a $C_{6-20}$ arylene group; a $C_{2-20}$ heterocyclic group comprising at least one heteroatom selected from the group consisting of O, N, S, Si, and P; a $C_{3-20}$ cycloaliphatic group; a $C_{1-10}$ alkylene group; a $C_{1-10}$ alkoxyl group; a $C_{1-10}$ alkylthio group; and a combination thereof;
4) $L^1$ and $L^2$ are each independently selected from the group consisting of a single bond; a $C_{6-30}$ arylene group; a $C_{2-30}$ heterocyclic group comprising at least one heteroatom selected from the group consisting of O, N, S, Si, and P; a $C_{1-20}$ alkylene group; a $C_{1-20}$ alkoxyl group; a $C_{1-20}$ alkylthio group; Formula A; and a combination thereof:

[Formula A]

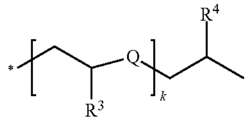

wherein:
4-1) * means a binding site,
4-2) Q is O or S;
4-3) k is an integer of 1 to 12; and
4-4) $R^3$ and $R^4$ are each independently hydrogen or a methyl group;
5) $R^1$ is Formula 1-1 above,
in Formula 1-1 above,
6) $L^3$ is selected from the group consisting of a single bond; a $C_{6-20}$ arylene group; a $C_{2-20}$ heterocyclic group comprising at least one heteroatom selected from the group consisting of O, N, S, Si, and P; a $C_{3-20}$ cycloaliphatic group; a $C_{1-10}$ alkylene group; a $C_{1-10}$ alkoxyl group; a $C_{1-10}$ alkylthio group; and a combination thereof;
7) $R^2$ is selected from the group consisting of hydrogen; deuterium; tritium; a halogen; a cyano group; a nitro group; a $C_{6-60}$ aryl group; a fluorenyl group; a $C_{2-60}$ heterocyclic group comprising at least one heteroatom selected from the group consisting of O, N, S, Si, and P; a fused ring group of a $C_{3-60}$ aliphatic ring and a $C_{6-60}$ aromatic ring; a $C_{1-50}$ alkyl group; a $C_{2-20}$ alkenyl group; a $C_{2-20}$ alkynyl group; a $C_{1-30}$ alkoxyl group; a $C_{6-30}$ aryloxy group; and -L'-N($R_a$)($R_b$);
8) L' is selected from the group consisting of a single bond; a $C_{6-20}$ arylene group; a $C_{2-20}$ heterocyclic group comprising at least one heteroatom selected from the group consisting of O, N, S, Si, and P; a $C_{3-20}$ cycloaliphatic group; a $C_{1-10}$ alkylene group; a $C_{1-10}$ alkoxyl group; a $C_{1-10}$ alkylthio group; and a combination thereof;
9) $R_a$ and $R_b$ are each independently selected from the group consisting of a $C_{6-60}$ aryl group; a fluorenyl group; a $C_{3-60}$ cycloaliphatic group; a $C_{2-60}$ heterocyclic group comprising at least one heteroatom selected from the group consisting of O, N, S, Si, and P; a $C_{1-50}$ alkyl group; and a combination thereof;
10) a is an integer of 0 to 5; in which when a is 2 or more, plural $R^2$ are the same or different from each other, and a plurality of neighboring $R^2$ may bind to each other to form a ring; and
11) In $L^1$ to $L^3$, L', $R_a$ and $R_b$, and $R^2$ above, the arylene group, heterocyclic group, alkylene group, alkoxyl group, and alkylthio group may each be further substituted with one or more substituents selected from the group consisting of deuterium; a $C_{6-10}$ aryl group; a $C_{2-10}$ heterocyclic group; a $C_{3-10}$ cycloaliphatic group; and a $C_{1-10}$ alkyl group.

2. The photosensitive resin composition of claim 1, wherein the ligand represented by Formula 1 is represented by Formula 2-1 or Formula 2-2:

[Formula 2-1]

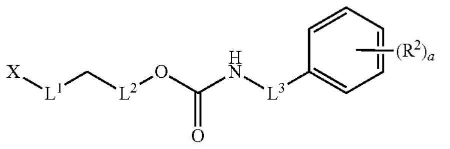

[Formula 2-2]

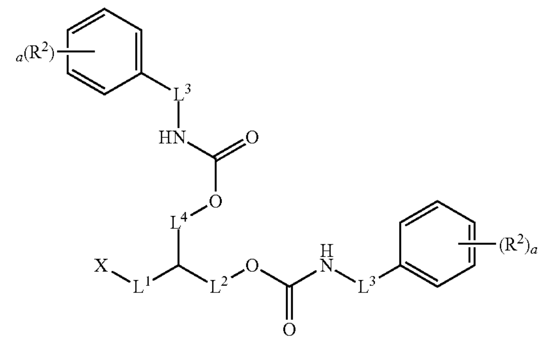

wherein:
1) X, $L^1$ to $L^4$, $R^2$, and a are the same as defined in Formula 1 of claim 1;

2) In Formula 2-2, each of $L^3$, $R^2$, or a is the same or different; and

3) In $L^1$ to $L^4$ and $R^2$, each of the arylene group, heterocyclic group, alkylene group, alkoxy group, and alkylthio group may be substituted with one or more substituents selected from the group consisting of deuterium; a $C_{6-10}$ aryl group; a $C_{2-10}$ heterocyclic group; a $C_{3-10}$ cycloaliphatic group; and a $C_{1-10}$ alkyl group.

3. The photosensitive resin composition of claim 1, wherein the ligand represented by Formula 1 is selected from the group consisting of the following compounds:

L-1

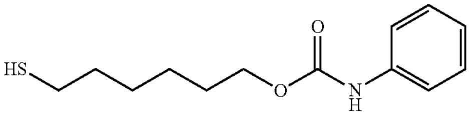

L-2

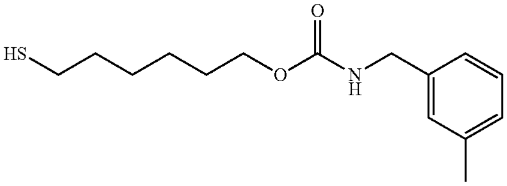

L-3

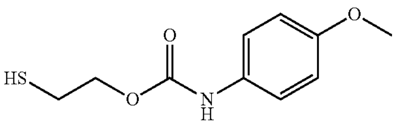

L-4

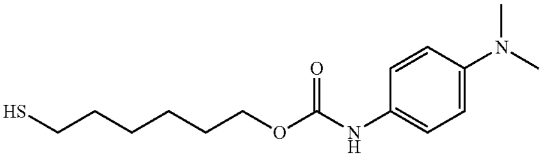

L-5

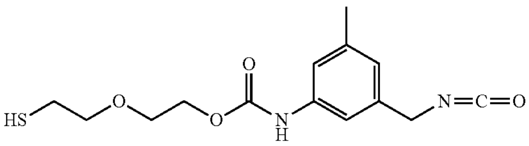

L-6

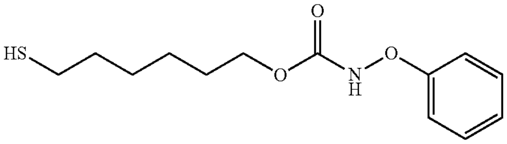

L-7

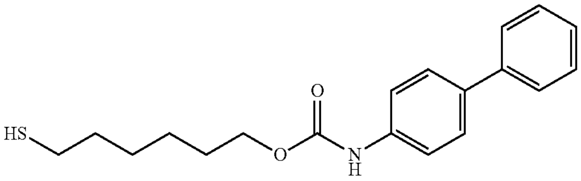

L-8

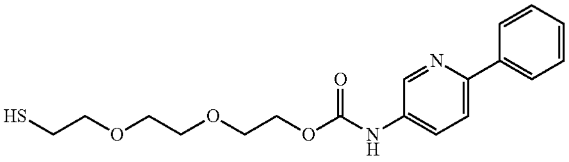

L-9

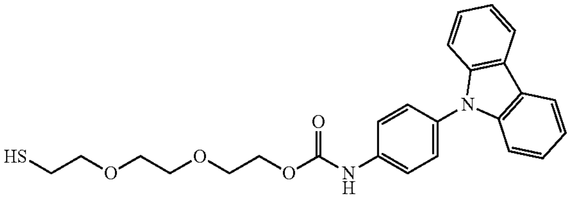

L-10

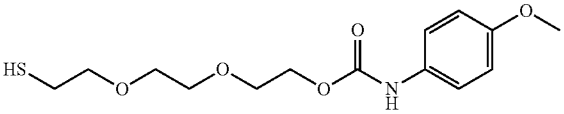

L-11

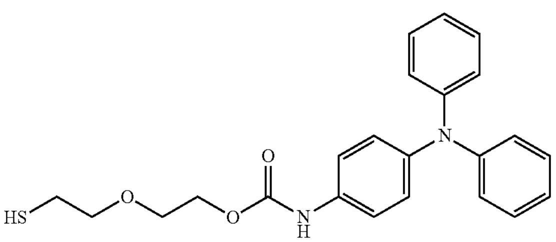

L-12

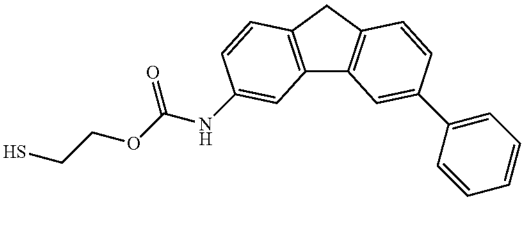

L-13

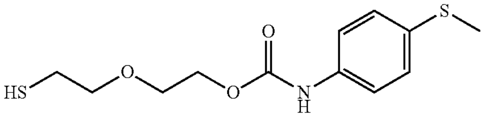

L-14

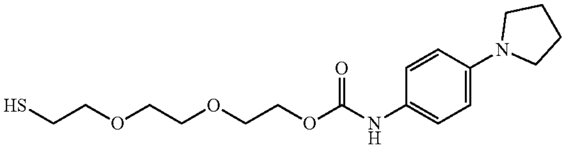

-continued
L-15
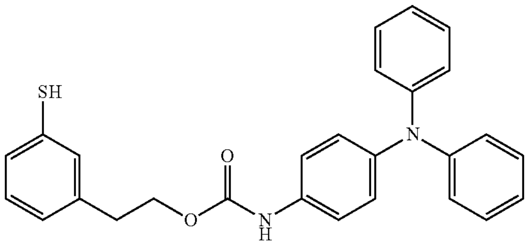
L-16
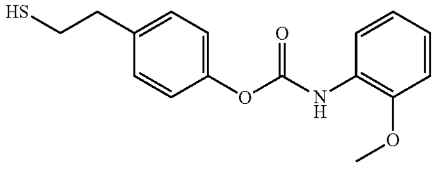
L-17
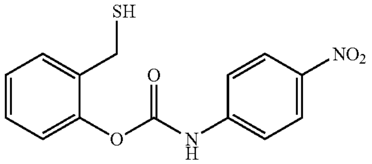
L-18
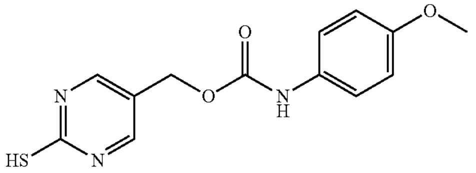
L-19
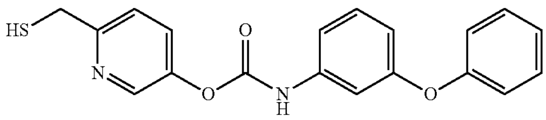
L-20
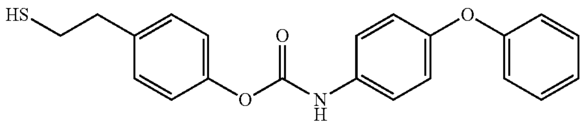
L-21
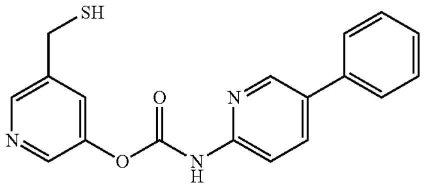
L-22
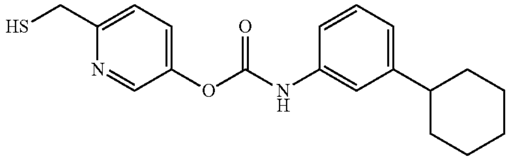
L-23
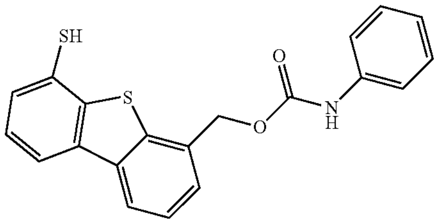
L-24
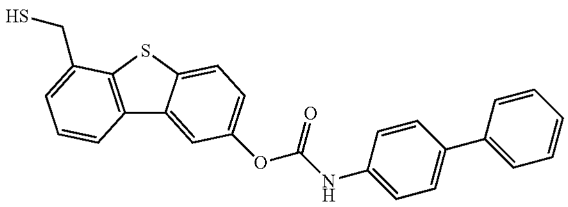
L-25
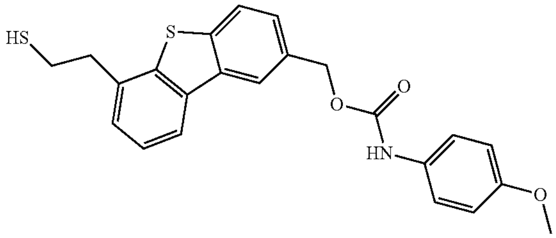
L-26
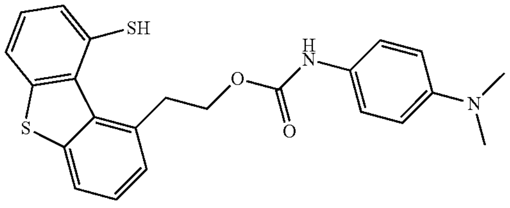
L-27
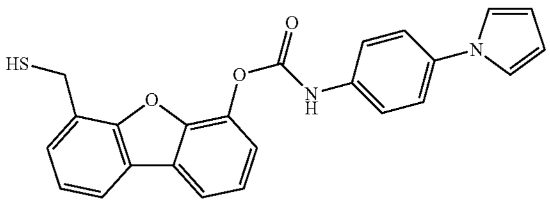
L-28
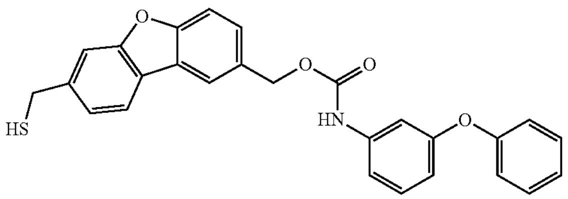

-continued
L-29
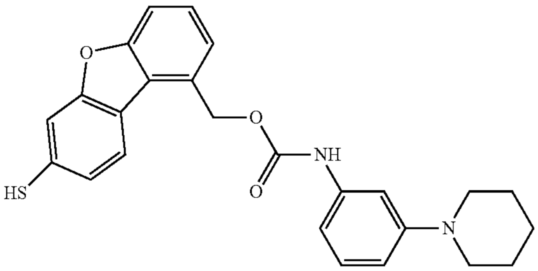
L-30
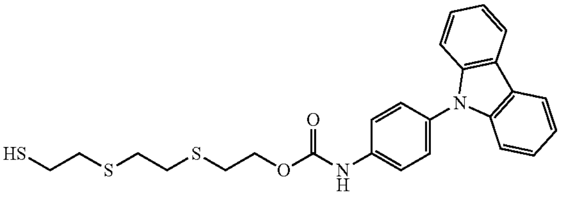
L-31
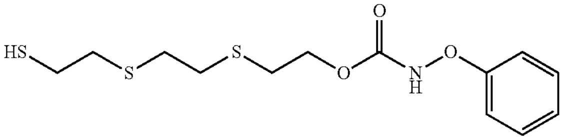
L-32
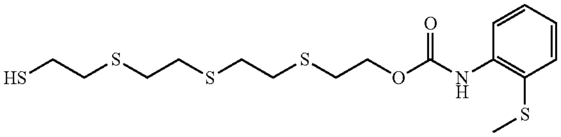
L-33
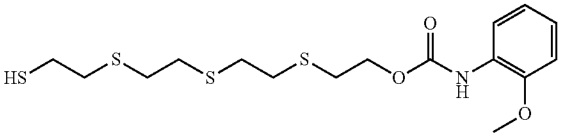
L-34
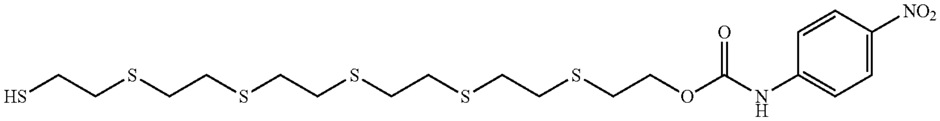
L-35
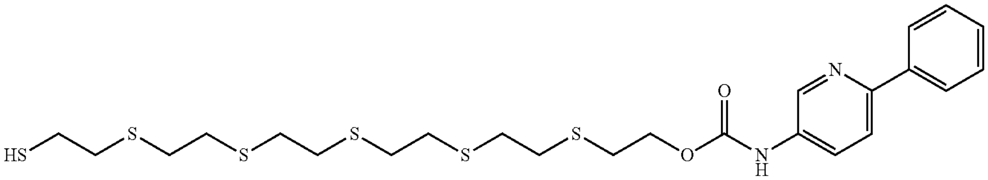
L-36
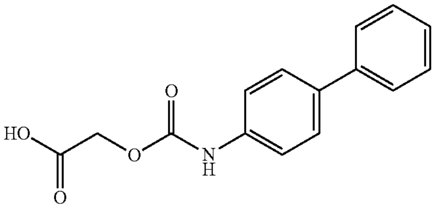
L-37
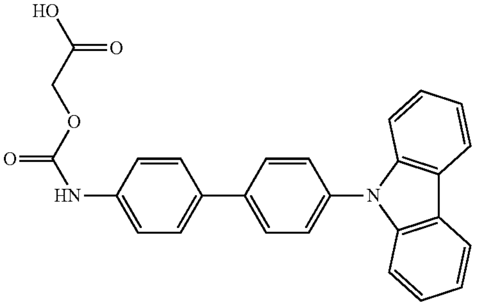
L-38
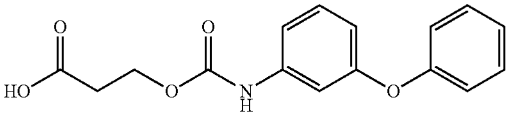
L-39
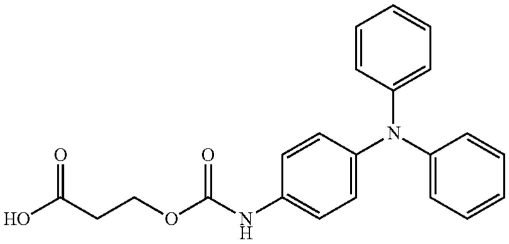

-continued
L-40
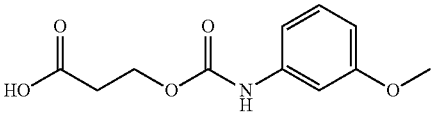
L-41
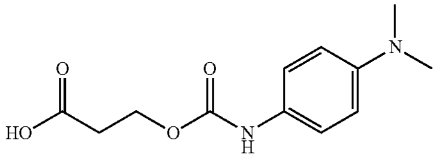
L-42
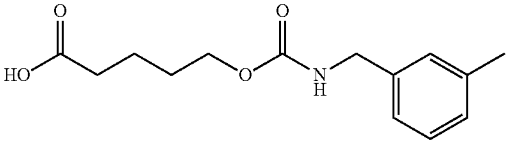
L-43
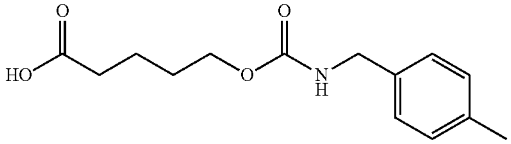
L-44
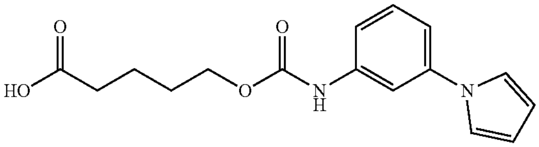
L-45
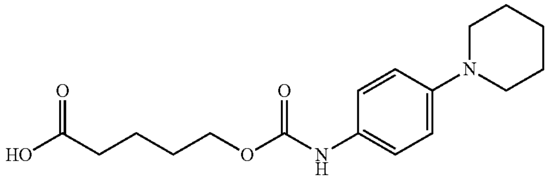
L-46
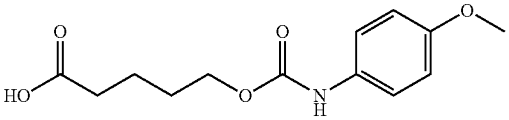
L-47
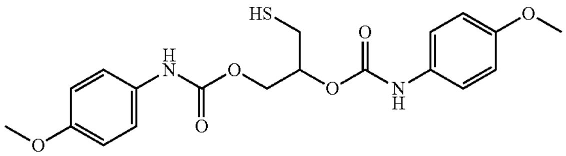
L-48
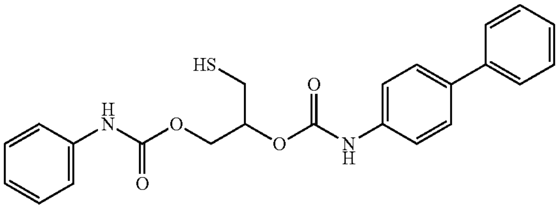
L-49
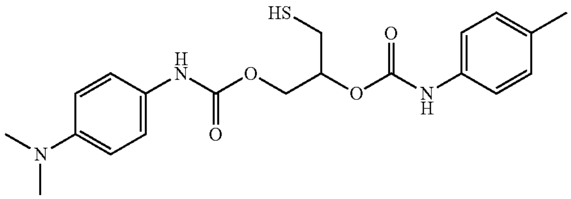
L-50
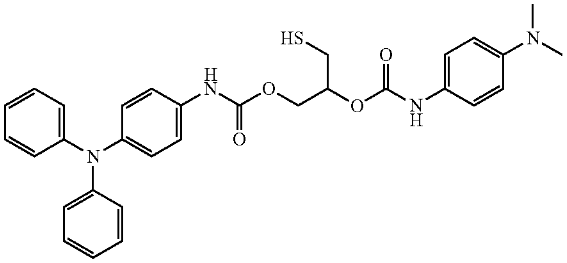
L-51
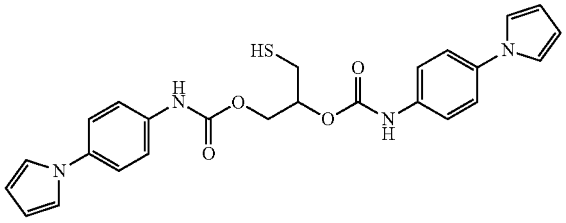
L-52
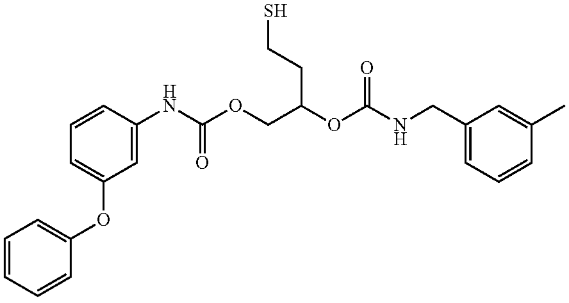
L-53
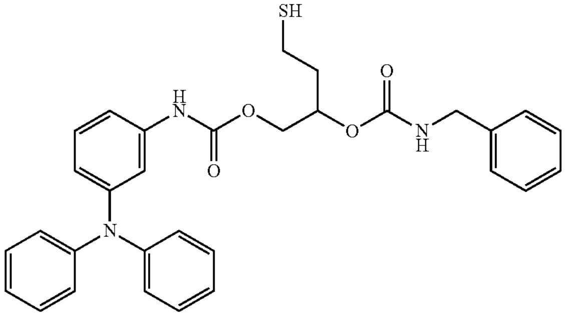

-continued
L-54
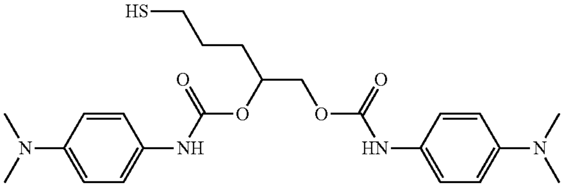
L-55
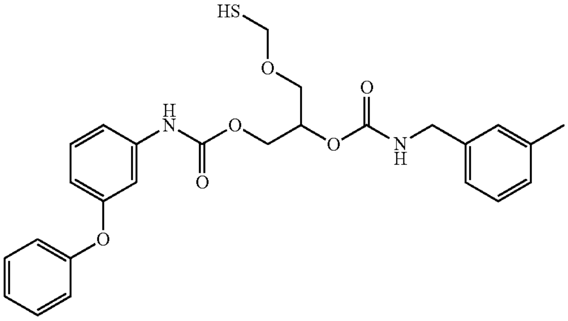
L-56
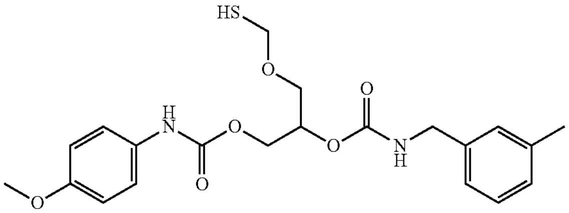
L-57
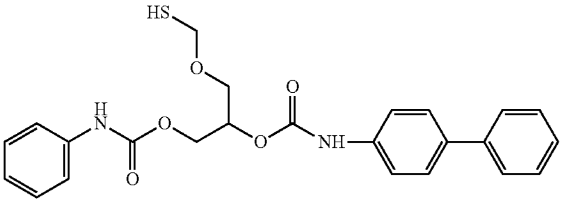
L-58
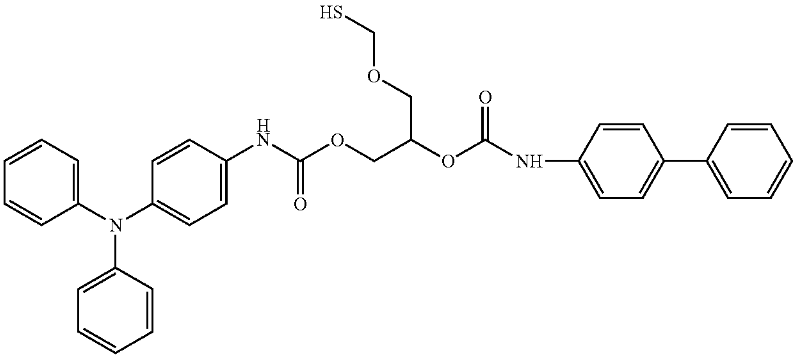
L-59
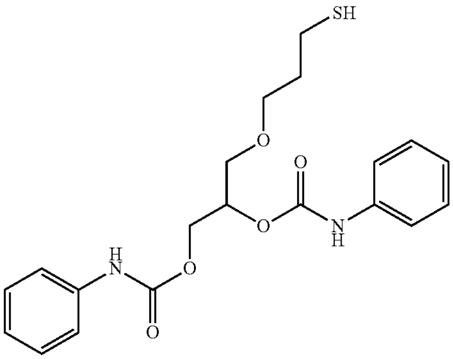
L-60
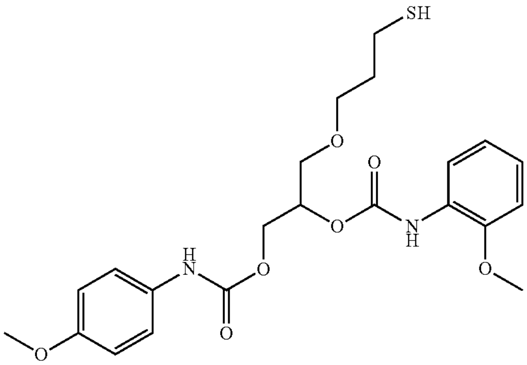

-continued
L-61
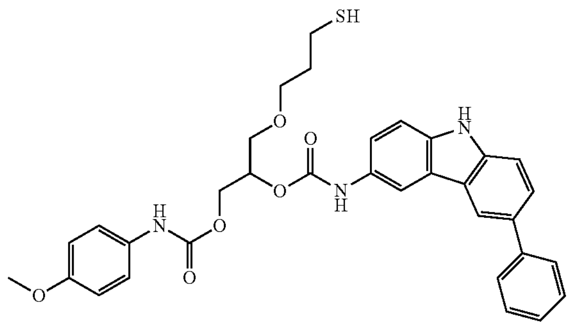
L-62
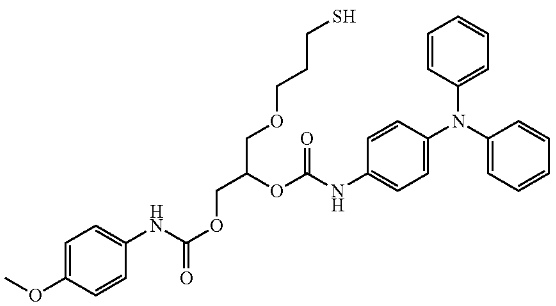
L-63
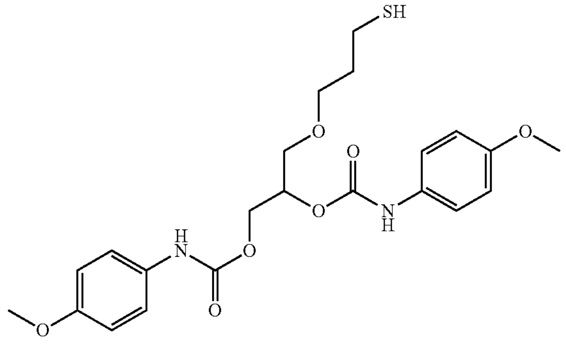
L-64
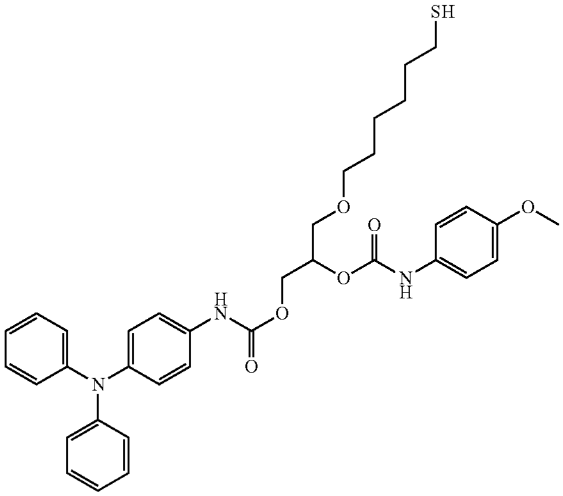
L-65
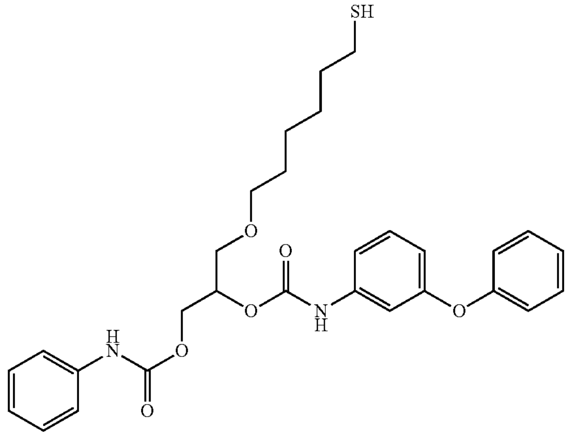
L-66
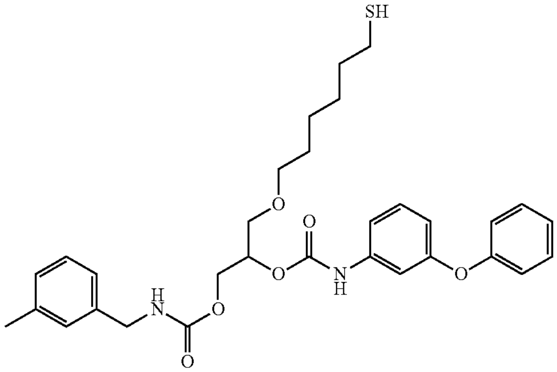

-continued
L-67
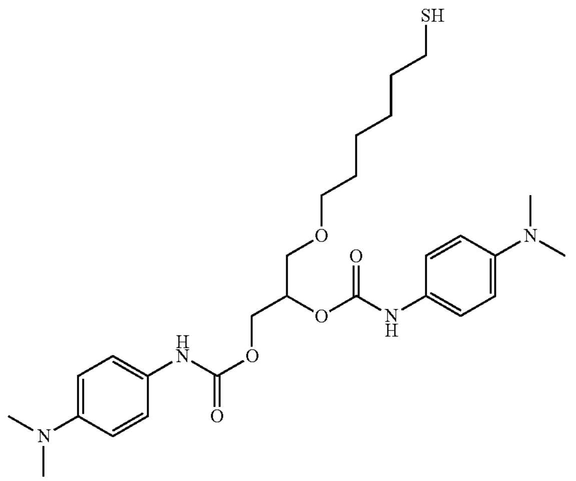
L-68
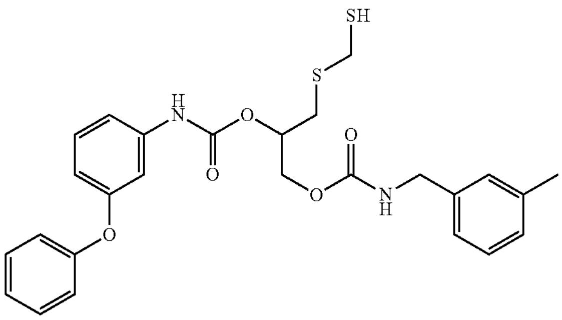
L-69
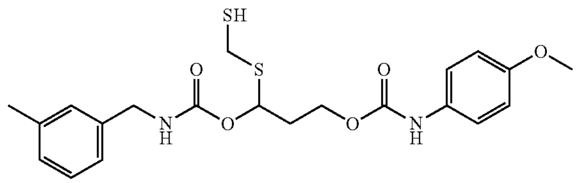
L-70
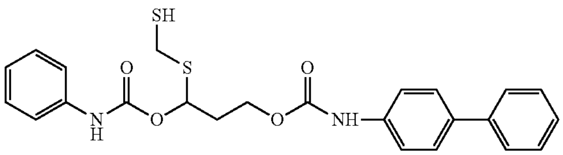
L-71
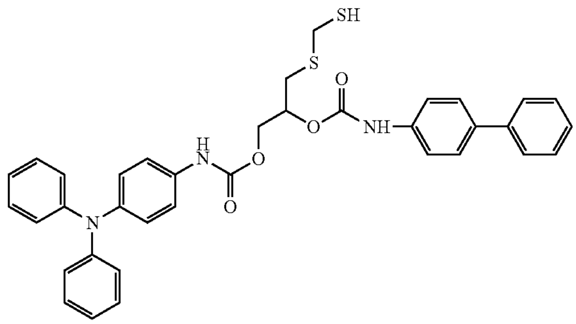
L-72
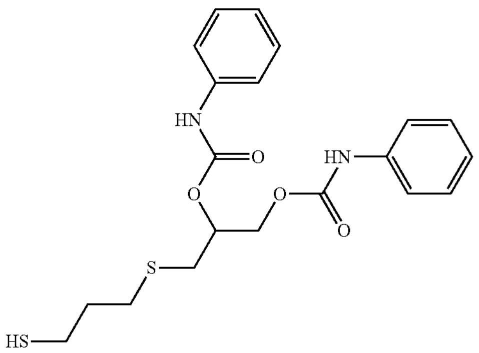
L-73
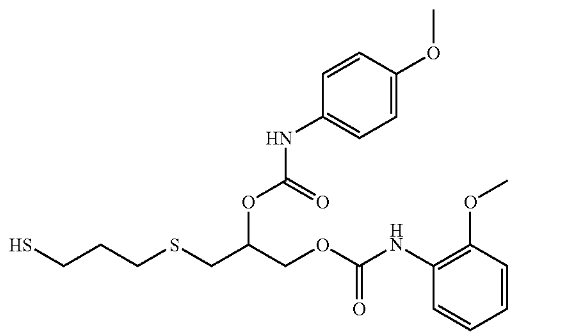
L-74
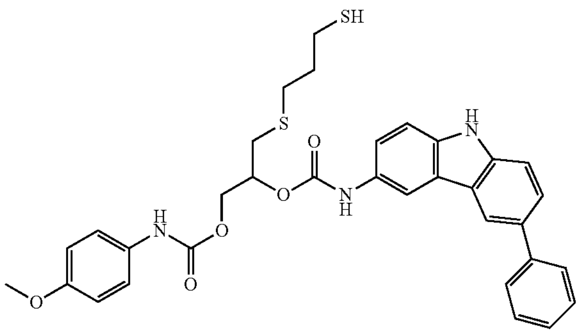

-continued
L-75
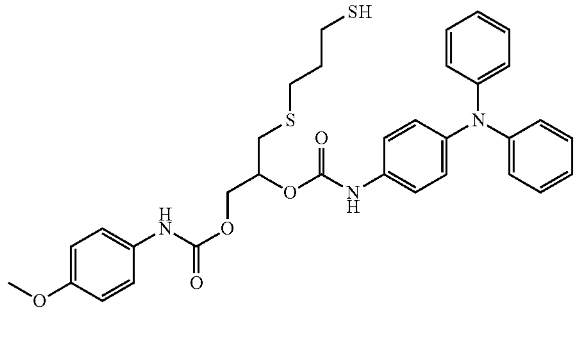
L-76
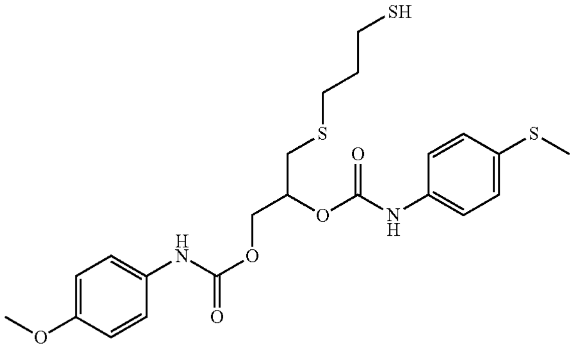
L-77
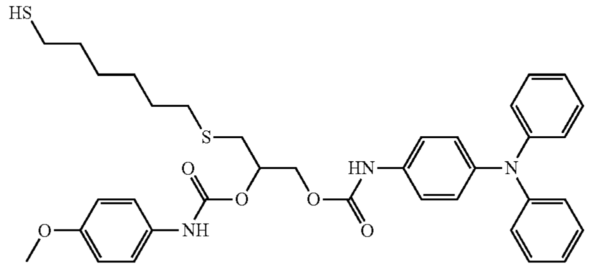
L-78
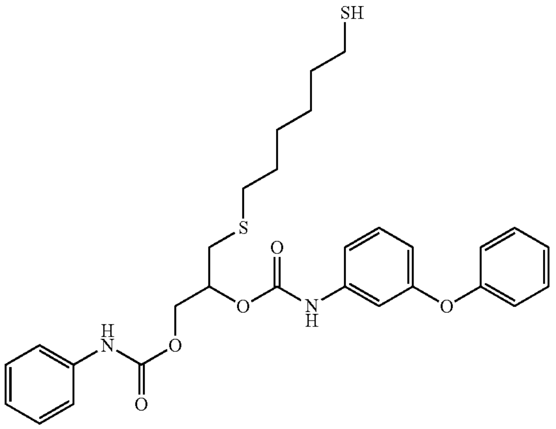
L-79
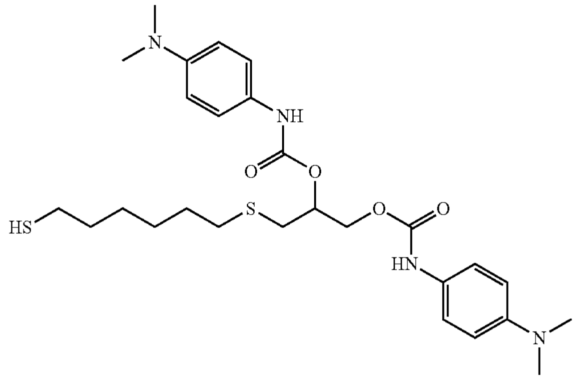
L-80
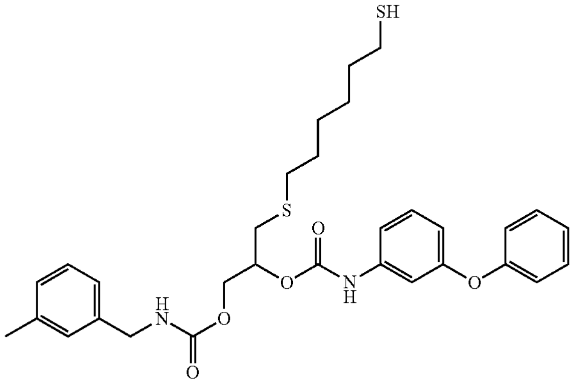
L-81
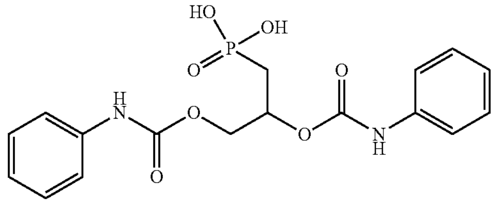
L-82
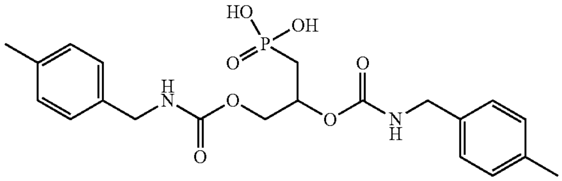

-continued
L-83
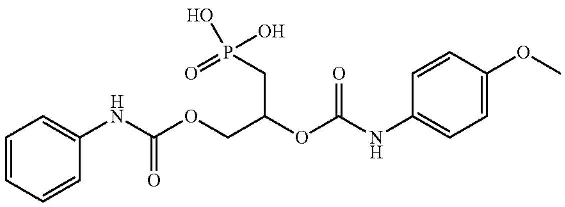
L-84
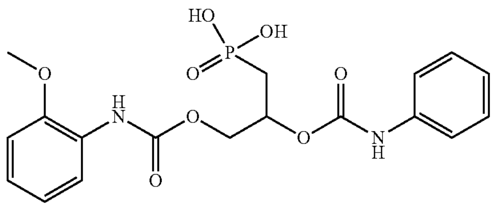
L-85
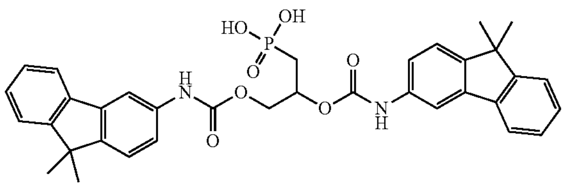
L-86
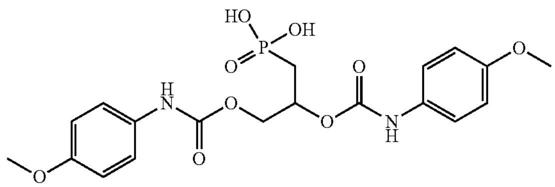
L-87
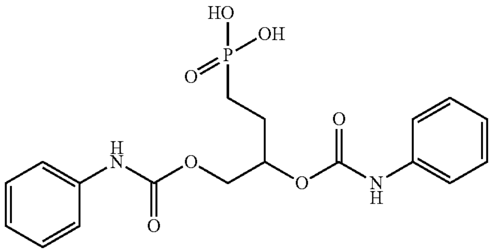
L-88
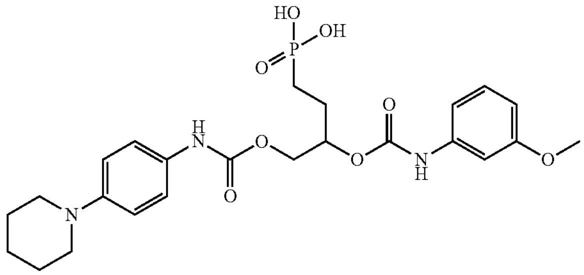
L-89
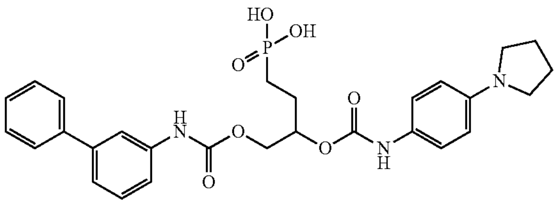
L-90
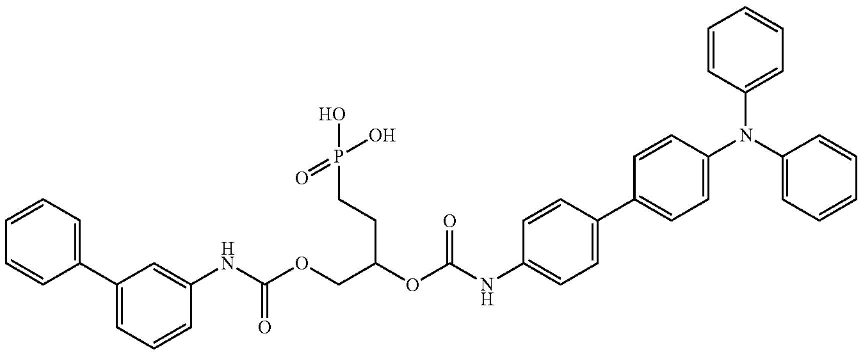
L-91
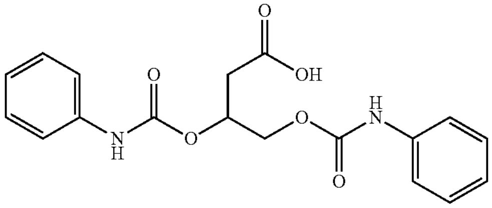
L-92
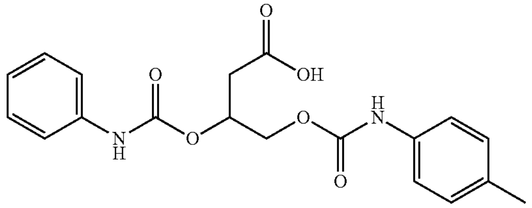

-continued
L-93
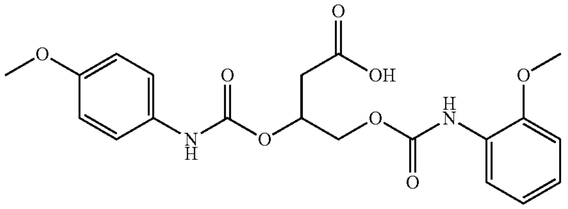
L-94
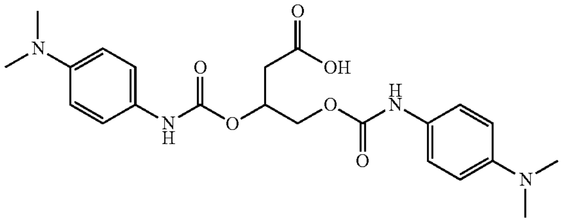
L-95
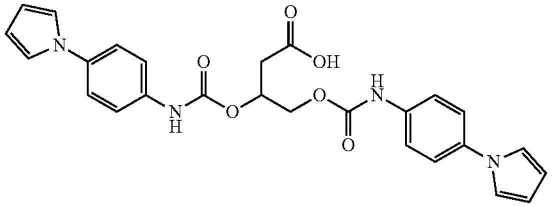
L-96
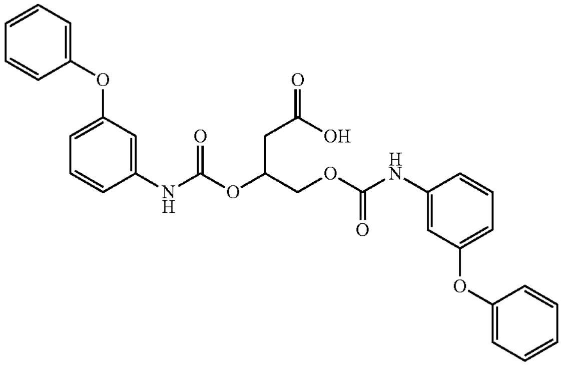
L-97
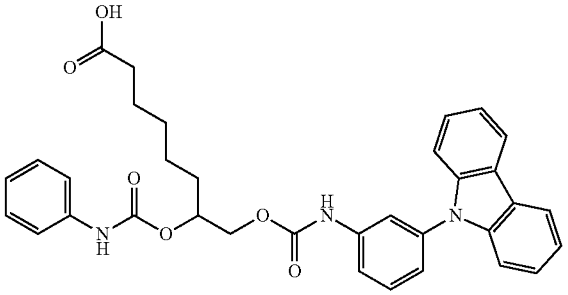
L-98
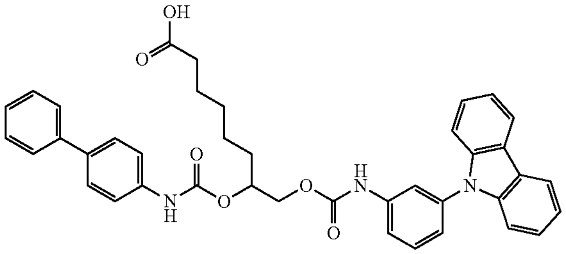
L-99
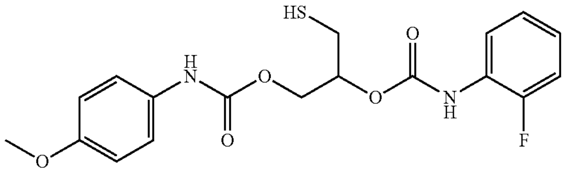
L-100
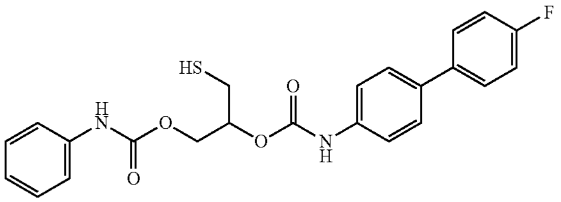
L-101
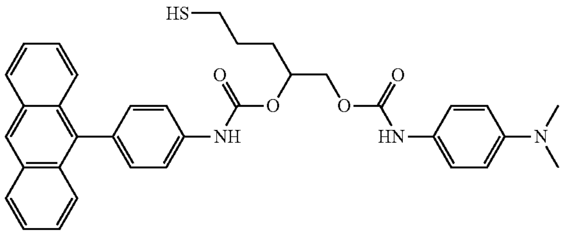
L-102
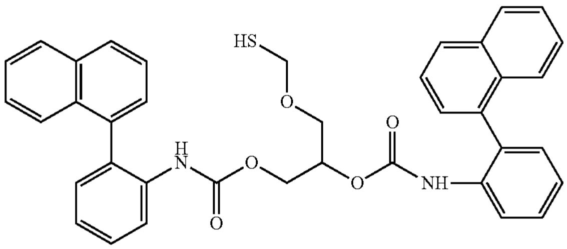

-continued
L-103
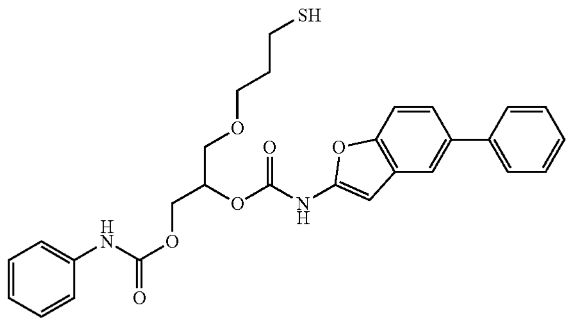
L-104
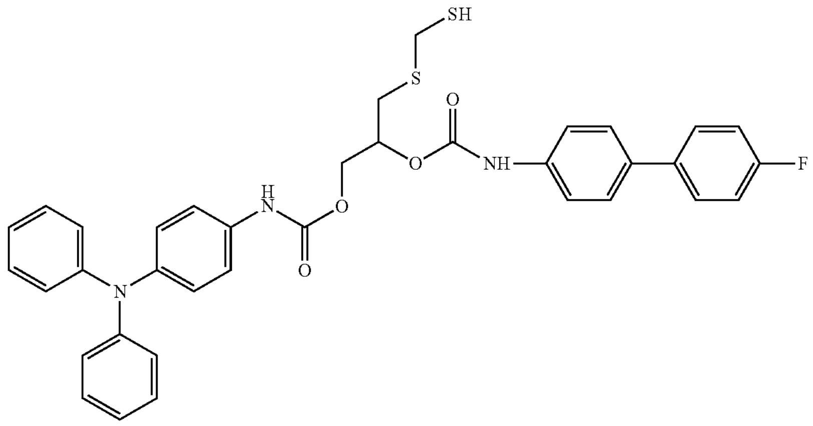
L-105
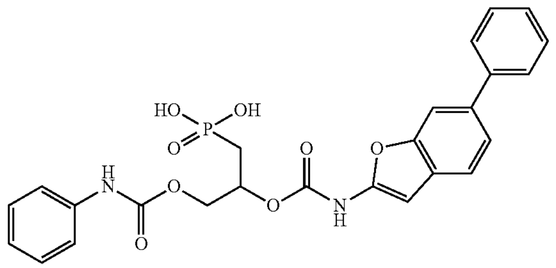
L-106
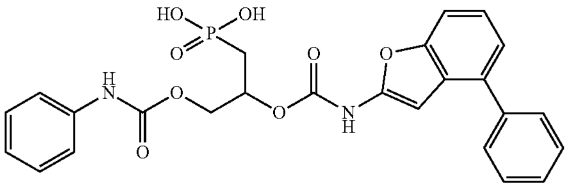
L-107
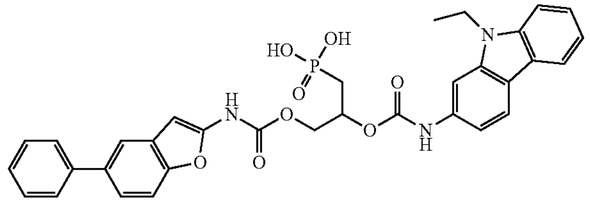
L-108
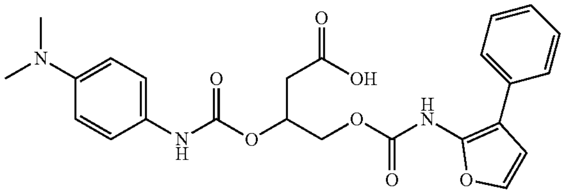
.

4. The photosensitive resin composition of claim 1, wherein the semiconductor nanoparticle has a particle diameter of 1 nm to 30 nm.

5. The photosensitive resin composition of claim 1, wherein the photocrosslinkable monomer is a compound represented by Formula (I):

[Formula I]

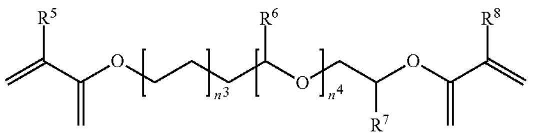

wherein:

1) $R^5$ to $R^8$ are each independently hydrogen or a methyl group; and

2) $n^3$ and $n^4$ are each independently an integer of 1 to 15, wherein $n^3+n^4 \geq 1$.

6. The photosensitive resin composition of claim 1, wherein the photocrosslinkable monomer is selected from the group consisting of the following compounds:

M-1

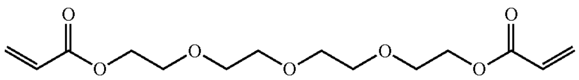

M-2

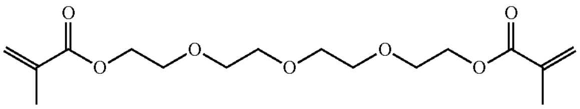

M-3

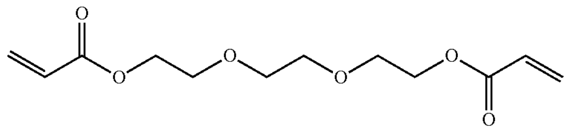

M-4

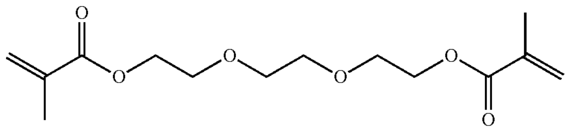

M-5

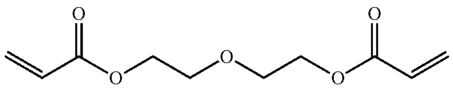

M-6

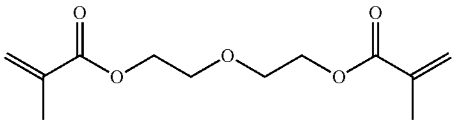

M-7

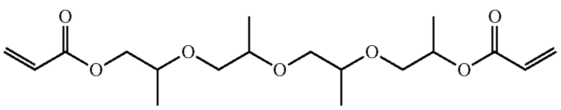

-continued

M-8

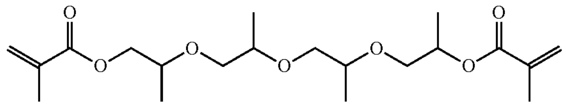

M-9

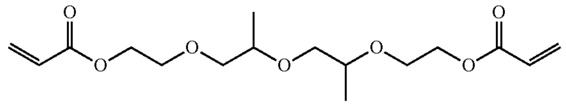

M-10

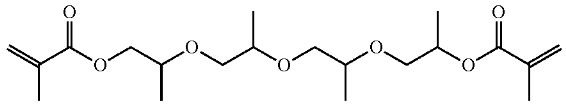

M-11

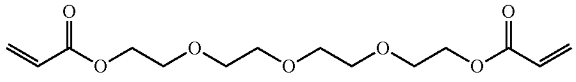

M-12

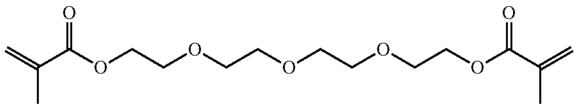

M-13

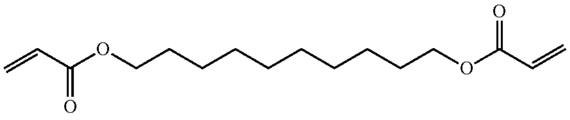

M-14

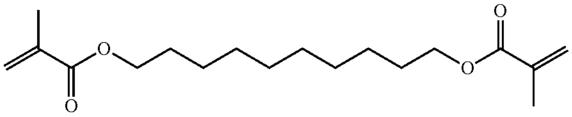

M-15

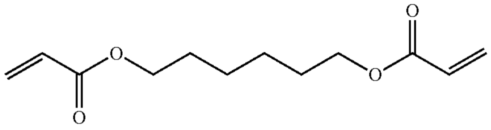

M-16

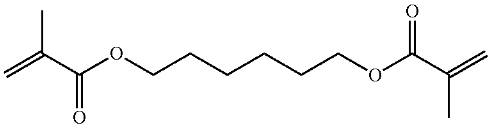

M-17

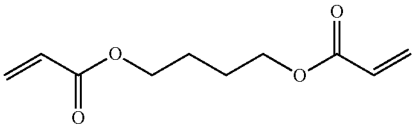

M-18

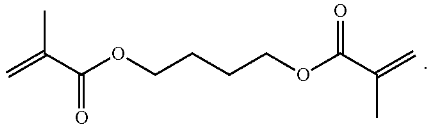

7. The photosensitive resin composition of claim 1, further comprising a light diffusion agent.

8. The photosensitive resin composition of claim 7, wherein the light diffusion agent comprises barium sulfate, calcium carbonate, titanium dioxide, zirconia, or a combination thereof.

9. The photosensitive resin composition of claim 7, wherein the light diffusion agent is contained in an amount of 0.1 wt % to 10 wt % based on the total amount of the photosensitive resin composition.

10. The photosensitive resin composition of claim 1, comprising:

(A) 10 wt % to 60 wt % of the semiconductor nanoparticle-ligand composite;

(B) 30 wt % to 90 wt % of the photocrosslinkable monomer; and (C) 0.1 wt % to 10 wt % of the initiator, based on the total amount of the photosensitive resin composition.

11. An optical film comprising the photosensitive resin composition of claim 1 and having a thickness of 0.005 μm to 500 μm.

12. An electroluminescent diode comprising the optical film of claim 11.

13. An electronic device comprising:

a display device comprising the optical film of claim 11; and a control unit for operating the display device.

14. An electronic device comprising:

a display device comprising the electroluminescent diode of claim 12; and a control unit for operating the display device.

15. A method of manufacturing a semiconductor nanoparticle-ligand composite, comprising:

performing a first surface modification, in which the surface of a semiconductor nanoparticle is surface-modified with a compound represented by Formula 3-1 or Formula 3-2; and performing a second surface modification, in which the surface of a semiconductor nanoparticle is surface-modified by reacting an alcohol group (—OH) of Formula 3-1 or Formula 3-2 of the semiconductor nanoparticle, that is surface-modified with a compound represented by Formula 3-1 or Formula 3-2, with an isocyanate-based compound:

[Formula 3-1]

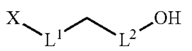

[Formula 3-2]

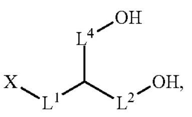

in Formula 3-1 or Formula 3-2,

1) X is —S(H) or $P{=}O(OH)_2$ or —COOH which is a functional group that binds to a surface of a semiconductor nanoparticle;

2) $L^1$ and $L^2$ are each independently selected from the group consisting of a single bond; a $C_{6-30}$ arylene group; a $C_{2-30}$ heterocyclic group comprising at least one heteroatom selected from the group consisting of O, N, S, Si, and P; a $C_{1-20}$ alkylene group; a $C_{1-20}$ alkoxyl group; a $C_{1-20}$ alkylthio group; Formula B; and a combination thereof:

[Formula B]

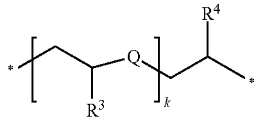

wherein:

2-1) *means a binding site, 2-2) Q is O or S;

2-3) k is an integer of 1 to 12;

2-4) $R^3$ and $R^4$ are each independently hydrogen or a methyl group;

3) $L^4$ is selected from the group consisting of a single bond; a $C_{6-20}$ arylene group; a $C_{2-20}$ heterocyclic group comprising at least one heteroatom selected from the group consisting of O, N, S, Si, and P; a $C_{1-10}$ alkylene group; a $C_{1-10}$ alkoxyl group; a $C_{1-10}$ alkylthio group; and a combination thereof;

wherein each of the arylene group, heterocyclic group, alkylene group, alkoxyl group, and alkylthio group in $L^1$, $L^2$, and $L^4$ above, may be substituted with one or more substituents selected from the group consisting of deuterium; a $C_{6-10}$ aryl group; a $C_{2-10}$ heterocyclic group; a $C_{3-10}$ cycloaliphatic group; and a $C_{1-10}$ alkyl group.

16. The method of claim 15, wherein the isocyanate-based compound is represented by Formula 9:

[Formula 9]

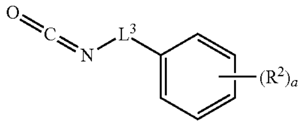

wherein:

1) $L^3$ is selected from the group consisting of a single bond; a $C_{6-20}$ arylene group; a $C_{2-20}$ heterocyclic group comprising at least one heteroatom selected from the group consisting of O, N, S, Si, and P; a $C_{3-20}$ cycloaliphatic group; a $C_{1-10}$ alkylene group; a $C_{1-10}$ alkoxyl group; a $C_{1-10}$ alkylthio group; and a combination thereof;

2) $R^2$ is selected from the group consisting of hydrogen; deuterium; tritium; a halogen; a cyano group; a nitro group; a $C_{6-60}$ aryl group; a fluorenyl group; a $C_{2-60}$ heterocyclic group comprising at least one heteroatom selected from the group consisting of O, N, S, Si, and P; a fused ring group of a $C_{3-60}$ aliphatic ring and a $C_{6-60}$ aromatic ring; a $C_{1-50}$ alkyl group; a $C_{2-20}$ alkenyl group; a $C_{2-20}$ alkynyl group; a $C_{1-30}$ alkoxyl group; a $C_{6-30}$ aryloxy group; and $-L'-N(R^a)(R_b)$;

3) L' is selected from the group consisting of a single bond; a $C_{6-20}$ arylene group; a $C_{2-20}$ heterocyclic group comprising at least one heteroatom selected from the group consisting of O, N, S, Si, and P; a $C_{3-20}$ cycloaliphatic group; a $C_{1-10}$ alkylene group; a $C_{1-10}$ alkoxyl group; a $C_{1-10}$ alkylthio group; and a combination thereof;

4) $R_a$ and $R_b$ are each independently selected from the group consisting of a $C_{6-60}$ aryl group; a fluorenyl group; a $C_{3-60}$ cycloaliphatic group; a $C_{2-60}$ heterocyclic group comprising at least one heteroatom selected from the group consisting of O, N, S, Si, and P; a $C_{1-50}$ alkyl group; and a combination thereof;

5) A is an integer of 0 to 5; and

6) Each of the arylene group, heterocyclic group, alkylene group, alkoxyl group, and alkylthio group in the $L^3$, L', $R^2$, and $R_a$ and $R_b$, may be substituted with one or more substituents selected from the group consisting of deuterium; a $C_{6-10}$ aryl group; a $C_{2-10}$ heterocyclic group; a $C_{3-10}$ cycloaliphatic group; and a $C_{1-10}$ alkyl group.

* * * * *